US012125941B2

(12) United States Patent
Chae et al.

(10) Patent No.: US 12,125,941 B2
(45) Date of Patent: Oct. 22, 2024

(54) LIGHT EMITTING DEVICE FOR DISPLAY AND DISPLAY APPARATUS HAVING THE SAME

(71) Applicant: SEOUL VIOSYS CO., LTD., Ansan-si (KR)

(72) Inventors: Jong Hyeon Chae, Ansan-si (KR); Seom Geun Lee, Ansan-si (KR); Seong Kyu Jang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 168 days.

(21) Appl. No.: 17/106,150

(22) Filed: Nov. 29, 2020

(65) Prior Publication Data

US 2021/0175280 A1 Jun. 10, 2021

Related U.S. Application Data

(60) Provisional application No. 62/945,572, filed on Dec. 9, 2019.

(51) Int. Cl.
*H01L 33/08* (2010.01)
*H01L 33/38* (2010.01)
*H01L 33/42* (2010.01)

(52) U.S. Cl.
CPC ............ *H01L 33/08* (2013.01); *H01L 33/382* (2013.01); *H01L 33/42* (2013.01)

(58) Field of Classification Search
CPC ... H01L 33/08; H01L 33/382; H01L 25/0756; H01L 2225/06541
See application file for complete search history.

(56) References Cited

U.S. PATENT DOCUMENTS 5,799,028 A * 8/1998 Geels ...................... H01L 33/44
372/49.01
10,170,666 B2 1/2019 Cha et al.
(Continued)

FOREIGN PATENT DOCUMENTS

JP 2014175427 9/2014
KR 10-2017-0115142 10/2017
(Continued)

OTHER PUBLICATIONS

International Search Report mailed Mar. 22, 2021, in corresponding Application No. PCT/KR2020/017252 (with English Translation).

*Primary Examiner* — Lauren R Bell
(74) *Attorney, Agent, or Firm* — Oblon, McClelland, Maier & Neustadt, L.L.P.

(57) ABSTRACT

A light emitting device for a display including a first LED stack, a second LED stack disposed under the first LED stack, a third LED stack disposed under the second LED stack, and including a first conductivity type semiconductor layer and a second conductivity type semiconductor layer, a surface protection layer at least partially covering side surfaces of the first LED stack, the second LED stack, or the third LED stack, a first bonding layer interposed between the second LED stack and the third LED stack, a second bonding layer interposed between the first LED stack and the second LED stack, lower buried vias passing through the second LED stack and the first bonding layer, and electrically connected to the first conductivity type semiconductor layer and the second conductivity type semiconductor layer of the third LED stack, respectively, and upper buried vias passing through the first LED stack.

18 Claims, 56 Drawing Sheets

(56) References Cited

U.S. PATENT DOCUMENTS

| | | | |
|---|---|---|---|
| 10,622,513 | B2 | 4/2020 | Lee et al. |
| 10,686,099 | B2 | 6/2020 | Huppmann et al. |
| 2013/0175562 | A1* | 7/2013 | Schubert ............... H01L 33/502 |
| | | | 257/E33.072 |
| 2014/0252382 | A1 | 9/2014 | Hashimoto et al. |
| 2015/0001561 | A1* | 1/2015 | Katsuno ................ H01L 33/382 |
| | | | 257/90 |
| 2017/0288093 | A1* | 10/2017 | Cha ........................ H01L 33/58 |
| 2018/0076152 | A1 | 3/2018 | Zheng et al. |
| 2019/0164944 | A1* | 5/2019 | Chae ................... H01L 25/0756 |
| 2019/0214373 | A1* | 7/2019 | Kim ....................... H01L 27/15 |
| 2021/0118946 | A1* | 4/2021 | Simon ............... H01L 29/66121 |

FOREIGN PATENT DOCUMENTS

| KR | 10-2018-0121614 | 11/2018 |
|---|---|---|
| KR | 10-2019-0074066 | 6/2019 |

* cited by examiner

LIGHT EMITTING DEVICE FOR DISPLAY AND DISPLAY APPARATUS HAVING THE SAME

CROSS-REFERENCE TO RELATED APPLICATION

This application claims the benefit of U.S. Provisional patent application Ser. No. 62/945,572, filed on Dec. 9, 2019, which is hereby incorporated by reference for all purposes as if fully set forth herein.

BACKGROUND

Field

Exemplary embodiments relate to a light emitting device for a display and a display apparatus, and, more particularly, to a light emitting device including a stack structure of LEDs for a display, and a display apparatus including the same.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. Recently, LED displays that directly display images using the light emitting diodes have been developed.

In general, a display apparatus realizes various colors through mixture of blue, green, and red light. In order to display various images, a display apparatus generally includes a plurality of pixels each including sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be provided by arranging individual LED chips emitting blue, green, and red light on a two-dimensional plane. However, when one LED chip is arranged in each sub-pixel, the number of LED chips may be increased, which may require excessive time for a mounting process during manufacture.

Moreover, since the sub-pixels are arranged on the two-dimensional plane in the display apparatus, a relatively large area is occupied by one pixel that includes the sub-pixels for blue, green, and red light. Accordingly, an area of each LED chip may need to be reduced to arrange the sub-pixels in a restricted area. However, reduction in size of LED chips may cause difficulty in mounting LED chips, as well as reducing luminous areas of the LED chips.

Moreover, reduction in size of LED chips increases effect of non-radiative surface recombination, thereby lowering the external quantum efficiency of the light emitting diodes.

The above information disclosed in this Background section is only for understanding of the background of the inventive concepts, and, therefore, it may contain information that does not constitute prior art.

SUMMARY

Light emitting devices for a display constructed according to exemplary embodiments of the invention are capable of increasing an area of each sub-pixel in a restricted pixel area and a display apparatus including the same.

Exemplary embodiments also provide a light emitting device for a display capable of reducing a time for a mounting process and a display apparatus including the same.

Exemplary embodiments further provide a light emitting device for a display that prevents current leakage due to surface recombination and a display apparatus including the same.

Additional features of the inventive concepts will be set forth in the description which follows, and in part will be apparent from the description, or may be learned by practice of the inventive concepts.

A light emitting device for a display according to an exemplary embodiment includes a first LED stack, a second LED stack disposed under the first LED stack, a third LED stack disposed under the second LED stack, and including a first conductivity type semiconductor layer and a second conductivity type semiconductor layer, a surface protection layer at least partially covering side surfaces of the first LED stack, the second LED stack, or the third LED stack, a first bonding layer interposed between the second LED stack and the third LED stack, a second bonding layer interposed between the first LED stack and the second LED stack, lower buried vias passing through the second LED stack and the first bonding layer, and electrically connected to the first conductivity type semiconductor layer and the second conductivity type semiconductor layer of the third LED stack, respectively, and upper buried vias passing through the first LED stack.

Each of the first LED stack, the second LED stack, and the third LED stack may have a sulfur passivated side surface.

The surface protection layer may include a first surface protection layer at least partially covering the side surface of the third LED stack, a second surface protection layer at least partially covering the side surface of the second LED stack, and a third surface protection layer at least partially covering the side surface of the first LED stack.

The light emitting device may further include a first planarization layer interposed between the second bonding layer and the second LED stack, and a second planarization layer disposed on the first LED stack, in which the lower buried vias may pass through the first planarization layer, and the upper buried vias may pass through the second planarization layer.

The second LED stack may include a first conductivity type semiconductor layer, a second conductivity type semiconductor layer, and a first mesa disposed on the first conductivity type semiconductor layer thereof, the third LED stack may include a second mesa disposed on the first conductivity type semiconductor layer thereof, the first mesa and the second mesa may be disposed in a region surrounded by an edge of the corresponding first conductivity type semiconductor layer, respectively, the first surface protection layer may cover a side surface of the second mesa, and the second surface protection layer may cover a side surface of the first mesa.

Each of the second LED stack and the third LED stack may include an active layer between respective first and second conductivity type semiconductor layers, each of first mesa and the second mesa may include at least a portion of the corresponding first conductivity type semiconductor layer, the active layer, and the second conductivity type semiconductor layer, and the first and second surface protection layers may entirely cover side surfaces of the corresponding mesa, respectively.

The first, second, and third surface protection layers may include at least one of $Al_2O_3$, $SiN_x$, $HfO_2$, and $SiO_2$.

The first, second, and third LED stacks may be configured to emit red light, blue light, and green light, respectively.

The light emitting device may further include lower connectors covering the lower buried vias, in which portions of the upper buried vias may be connected to the lower connectors.

One of the lower connectors may be spaced apart from the remaining lower buried vias, and be electrically connected to a second conductivity type semiconductor layer of the second LED stack, and one of the upper buried vias may be electrically connected to the one of the lower connectors.

The light emitting device may further include a first transparent electrode disposed on the first mesa, and a second transparent electrode disposed on the second mesa, in which the first surface protection layer may cover the second transparent electrode, the first planarization layer may cover the first transparent electrode, and the second surface protection layer may cover the first planarization layer.

The light emitting device may further include a lower insulation layer covering the first surface protection layer, and an intermediate insulation layer covering the second surface protection layer.

The first transparent electrode may have openings exposing the second conductivity type semiconductor layer of the second LED stack, and the lower buried vias may be formed within a circumference of the openings of the first transparent electrode in a plan view.

The lower buried vias and the upper buried vias may be surrounded by sidewall insulation layers inside corresponding through holes, respectively.

A width of the sidewall insulation layers may decrease as being disposed closer to a bottom of the respective through holes.

The light emitting device may further include a plurality of upper connectors disposed on the first LED stack, in which the upper connectors may cover the upper buried vias to be electrically connected to the upper buried vias, respectively.

The light emitting device may further include bump pads disposed on the upper connectors, respectively.

Each of the first, second, and third LED stacks may include the second conductivity type semiconductor layer, and the bump pads may include a first bump pad commonly electrically connected to the first, second, and third LED stacks, and second, third, and fourth bump pads electrically connected to the second conductivity type semiconductor layers of the first, second, and third LED stacks, respectively.

A method of manufacturing a light emitting device according to another exemplary embodiment includes forming a third LED stack on a substrate, bonding a second LED stack on the third LED stack, bonding a first LED stack on the second LED stack, and forming a surface protection layer at least partially covering side surfaces of the first LED stack, the second LED stack, or the third LED stack, in which the side surfaces of the first LED stack, the second LED stack, or the third LED stack are at least partially chemically treated using an etching solution before the surface protection layer is formed thereon.

The chemical treatment may include a surface etching process using a first etching solution and a sulfide passivating process using a sulfide solution.

Forming the third LED stack on the substrate may include forming a mesa on the third LED stack by patterning a second conductivity type semiconductor layer and an active layer of the third LED stack before the second LED stack is bonded to the third LED stack, chemically treating a side surface of the mesa using a second etching solution, and forming a first surface protection layer covering the chemically treated side surface of the mesa.

The method may further include forming a mesa on the second LED stack by patterning a second conductivity type semiconductor layer and an active layer of the second LED stack before the first LED stack is bonded to the second LED stack, chemically treating a side surface of the mesa of the second LED stack using a third etching solution, and forming a second surface protection layer covering the chemically treated side surface of the mesa of the second LED stack.

The method may further include forming a first planarization layer on the second LED stack, forming through holes passing through the first planarization layer and the second LED stack, chemically treating a surface of the second LED stack exposed by inner walls of the through holes, forming a first sidewall insulation layer covering the inner walls of the through holes, and forming lower buried vias filling the through holes, in which the second surface protection layer may cover the first planarization layer.

The method may further include forming a lower insulation layer covering the first surface protection layer, and forming an intermediate insulation layer covering the second surface protection layer.

The method may further include patterning the first LED stack to expose the side surface of the first LED stack, chemically treating the exposed side surface of the first LED stack using a fourth etching solution, and forming a third surface protection layer covering the chemically treated side surface of the first LED stack.

The method may further include forming a second planarization layer on the first LED stack, forming through holes passing through the second planarization layer and the first LED stack, chemically treating a surface of the first LED stack exposed to inner walls of the through holes, forming a second sidewall insulation layer covering the inner walls of the through holes, and forming upper buried vias filling the through holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
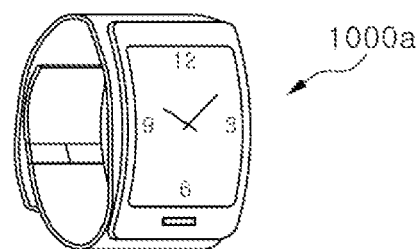
FIG. 1 shows schematic perspective views illustrating display apparatuses according to exemplary embodiments.
Figure 1:
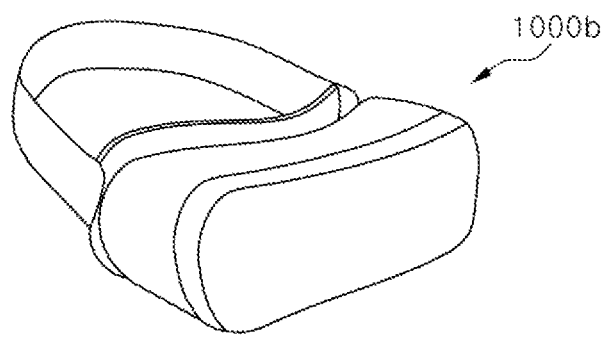
Figure 1:
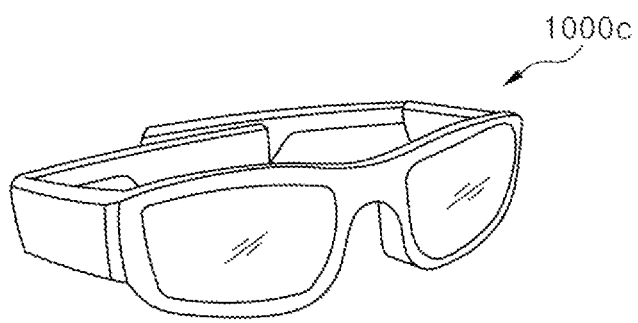

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

FIG. 1 shows schematic perspective views illustrating display apparatuses according to exemplary embodiments.

A light emitting device according to an exemplary embodiment may be used in a VR display apparatus, such as a smart watch 1000a or a VR headset 1000b, or an AR display apparatus such as augmented reality glasses 1000c, without being limited thereto.

Figure 2:
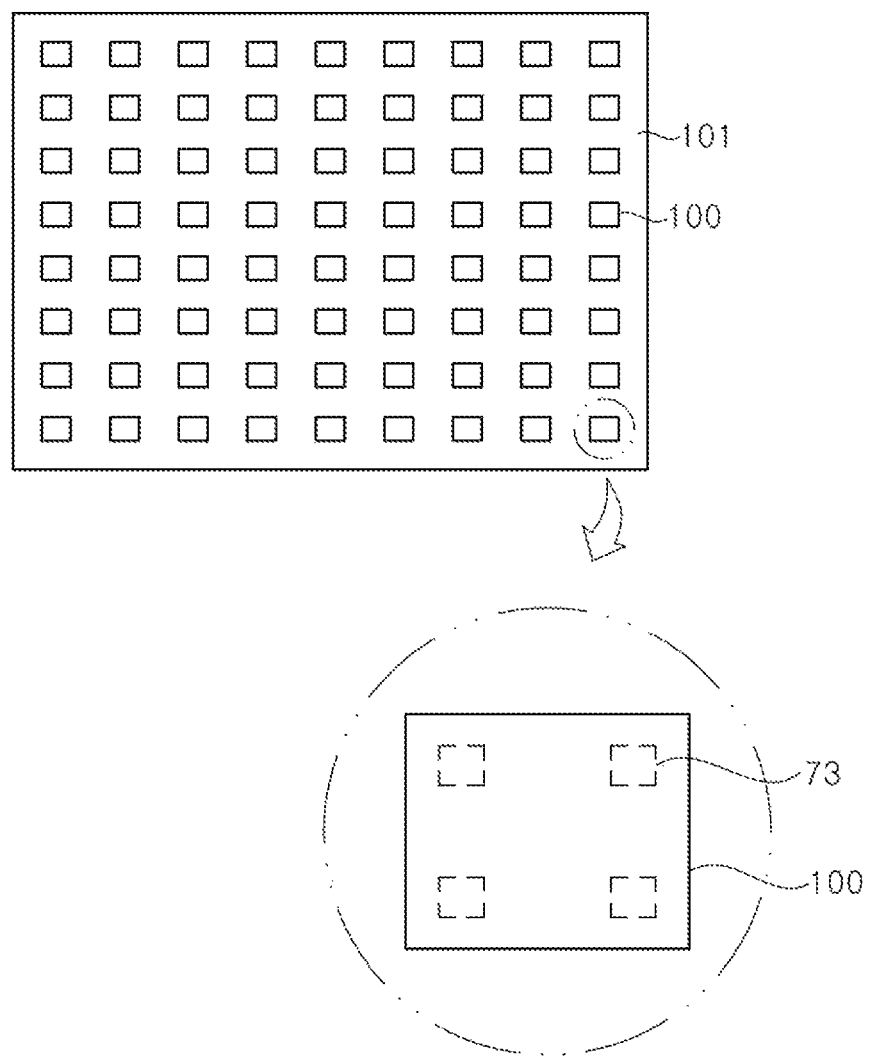
FIG. 2 is a schematic plan view illustrating a display panel according to an exemplary embodiment.

A display panel for implementing an image is mounted in the display apparatus. FIG. 2 is a schematic plan view illustrating the display panel according to an exemplary embodiment.

Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 is arranged on the circuit board 101. An interval between the light emitting devices 100 may be greater than at least a width of the light emitting device 100. Each of the light emitting devices 100 may form one pixel. The light emitting device 100 may include bump pads 73, and the bump pads 73 may be electrically connected to the circuit board 101. For example, the bump pads 73 may be bonded to pads exposed on the circuit board 101. In some exemplary embodiments, the bump pads 73 may be omitted, and the light emitting devices 100 may be electrically connected to the circuit board 101 using bonding pads exposed on the upper surface.

Figure 3:
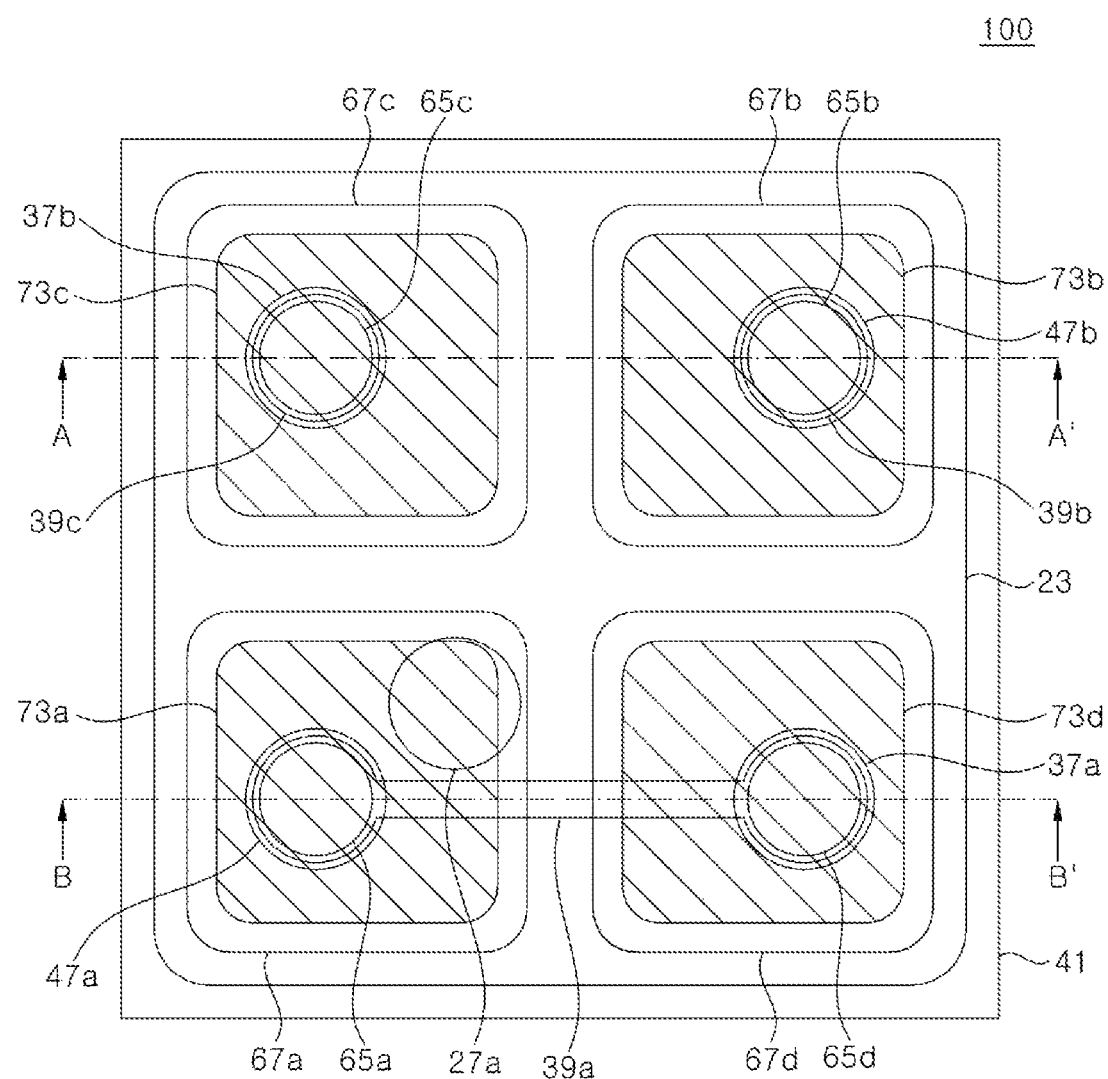
FIG. 3 is a schematic plan view illustrating a light emitting device according to an exemplary embodiment.

A configuration of the light emitting device 100 according to an exemplary embodiment will be described with reference to FIGS. 3, 4A, and 4B. FIG. 3 is a schematic plan view illustrating the light emitting device 100 according to an exemplary embodiment, and FIGS. 4A and 4B are schematic cross-sectional views taken along lines A-A' and B-B' of FIG. 3, respectively.

Hereinafter, although bump pads 73a, 73b, 73c, and 73d are exemplarily illustrated and described as being disposed at an upper side in the drawings, the inventive concepts are not limited thereto. For example, in some exemplary embodiments, the light emitting device 100 may be flip-bonded on the circuit board 101 shown in FIG. 2, and in this case, the bump pads 73a, 73b, 73c, and 73d may be disposed at a lower side. Furthermore, in some exemplary embodiments, the bump pads 73a, 73b, 73c, and 73d may be omitted. In addition, although the light emitting device is exemplarily illustrated as including a substrate 41, the substrate 41 may be omitted in some exemplary embodiments.

Figure 4A:
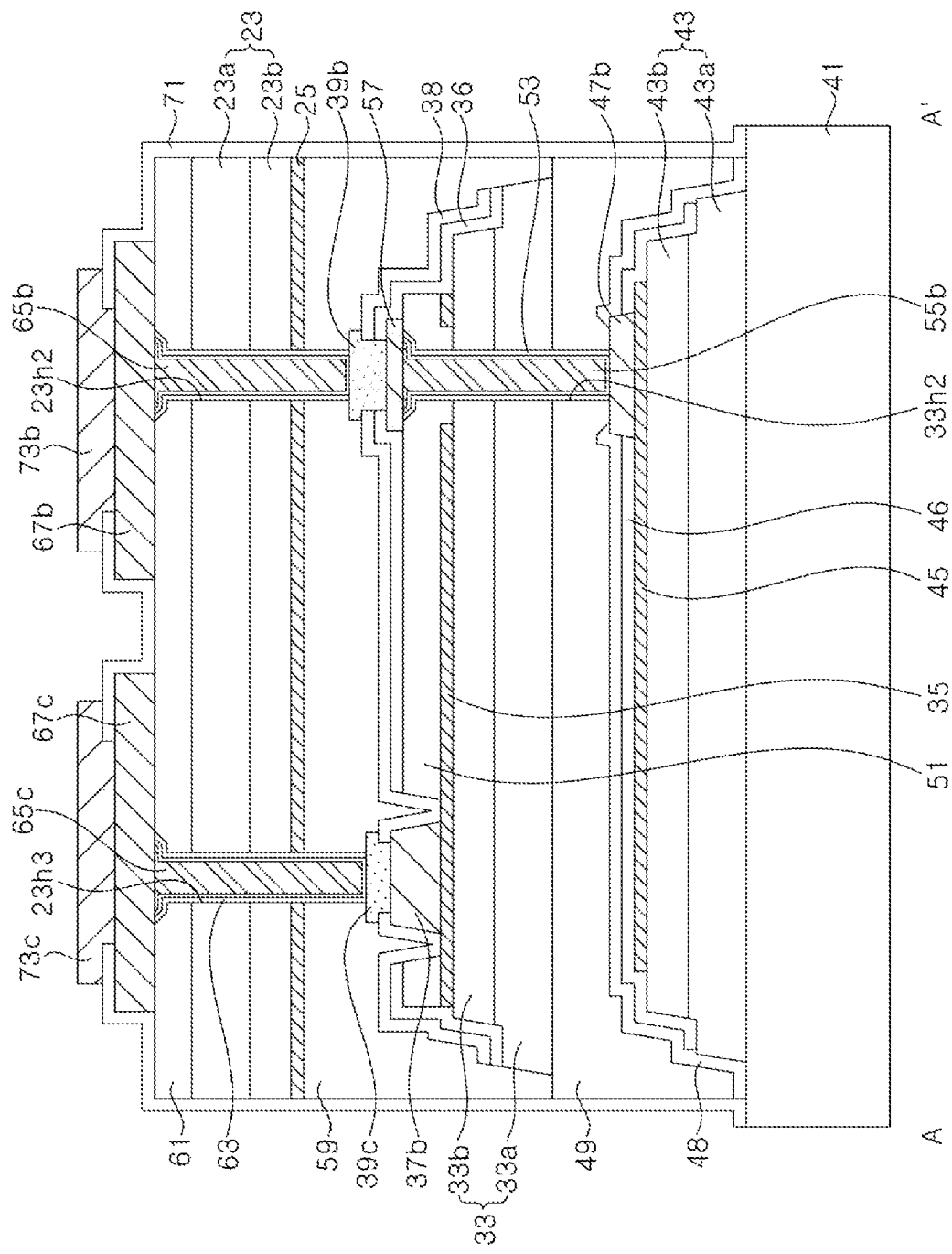
FIGS. 4A and 4B are schematic cross-sectional views taken along lines A-A' and B-B' of FIG. 3, respectively.
Figure 4B:
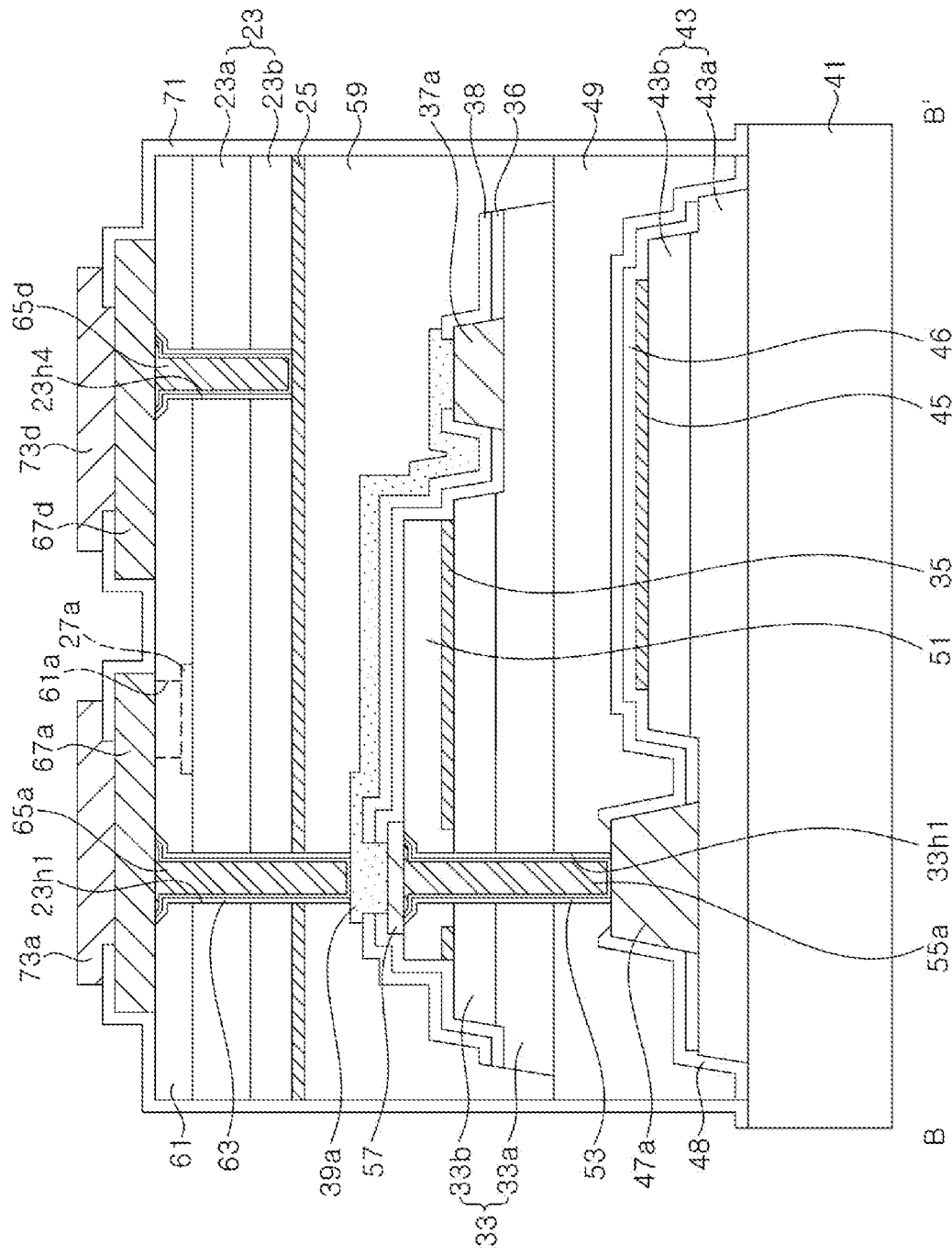

Referring to FIGS. 3, 4A and 4B, the light emitting device 100 may include a first LED stack 23, a second LED stack 33, a third LED stack 43, and a first transparent electrode 25, a second transparent electrode 35, a third transparent electrode 45, a first n-electrode pad 27a, a second n-electrode pad 37a, a third n-electrode pad 47a, an upper p-electrode pad 37b, a lower p-electrode pad 47b, first, second, and third lower connectors 39a, 39b, and 39c, lower buried vias 55a and 55b, upper buried vias 65a, 65b, 65c, and 65d, a first sidewall insulation layer 53, a second sidewall insulation layer 63, first, second, third, and fourth upper connectors 67a, 67b, 67c, and 67d, a first bonding layer 49, a second bonding layer 59, a first surface protection layer 46, a lower insulation layer 48, a second surface protection layer 36, an intermediate insulation layer 38, an upper insulation layer 71, a lower planarization layer 51, an upper planarization layer 61, and bump pads 73a, 73b, 73c, and 73d. Furthermore, the light emitting device 100 may include through holes 23h1, 23h2, 23h3, and 23h4 passing through the first LED stack 23, through holes 33h1 and 33h2 passing through the second LED stack 33, and a capping layer 57.

As shown in FIGS. 4A and 4B, the first, second, and third LED stacks 23, 33, and 43 according to an exemplary embodiment are stacked in the vertical direction. The first, second, and third LED stacks 23, 33, and 43 may be grown on different growth substrates from each other. According to the illustrated exemplary embodiment, each of the growth substrates may be removed from the final light emitting device 100. As such, the light emitting device 100 may not include the growth substrates of the first, second, and third LED stacks 23, 33, and 43. However, the inventive concepts are not limited thereto, and in some exemplary embodiments, at least one of the growth substrates may be included in the light emitting device 100.

Each of the first LED stack 23, the second LED stack 33, and the third LED stack 43 includes a first conductivity type semiconductor layer 23a, 33a, or 43a, a second conductivity type semiconductor layer 23b, 33b, or 43b, and an active layer interposed therebetween. The active layer may have a multiple quantum well structure.

The second LED stack 33 is disposed under the first LED stack 23, and the third LED stack 43 is disposed under the second LED stack 33. Light generated in the first, second, and third LED stacks 23, 33, and 43 may be emitted to the outside through the third LED stack 43.

In an exemplary embodiment, the first LED stack 23 may emit light having a longer wavelength than those emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light.

In another exemplary embodiment, to adjust a color mixing ratio of light emitted from the first, second, and third LED stacks 23, 33, and 43, the second LED stack 33 may emit light having a shorter wavelength than that emitted from the third LED stack 43. As such, luminous intensity of light emitted from the second LED stack 33 may be reduced and luminous intensity of light emitted from the third LED stack 43 may be increased. As such, a luminous intensity ratio of light emitted from the first, second, and third LED stacks 23, 33, and 43 may be dramatically changed. For example, the first LED stack 23 may be configured to emit red light, the second LED stack 33 may be configured to emit blue light, and the third LED stack 43 may be configured to emit green light.

Hereinafter, although the second LED stack 33 is exemplarily described as emitting light of a shorter wavelength than that emitted from the third LED stack 43, such as blue light, the inventive concepts are not limited thereto. In some exemplary embodiments, the second LED stack 33 may emit light of a longer wavelength than that emitted from the third LED stack 43, such as green light.

The first LED stack 23 may include an AlGaInP-based well layer, the second LED stack 33 may include an AlGaInN-based well layer, and the third LED stack 43 may include an AlGaInP or AlGaInN-based well layer.

Since the first LED stack 23 emits light of a longer wavelength than that emitted from the second and third LED stacks 33 and 43, light generated in the first LED stack 23 may be emitted to the outside through the second and third LED stacks 33 and 43. In addition, since the second LED stack 33 emits light of a shorter wavelength than that emitted from the third LED stack 43, a portion of light generated in the second LED stack 33 may be absorbed by the third LED stack 43 and lost, and thus, luminous intensity of light generated in the second LED stack 33 may be reduced. Since light generated in the third LED stack 43 is emitted to the outside without passing through the first and second LED stacks 23 and 33, luminous intensity thereof may not be substantially affected by the first and second LED stacks 22 and 23.

The first conductivity type semiconductor layer 23a, 33a, or 43a of each of the LED stacks 23, 33, and 43 may be an n-type semiconductor layer, and the second conductivity type semiconductor layer 23b, 33b, or 43b thereof may be a p-type semiconductor layer. In particular, an upper surface of the first LED stack 23 according to the illustrated exemplary embodiment is an n-type semiconductor layer 23b, an upper surface of the second LED stack 33 is a p-type semiconductor layer 33b, and an upper surface of the third LED stack 43 is a p-type semiconductor layer 43b. In particular, a stack sequence in the first LED stack 23 is reversed from those in the second LED stack 33 and the third LED stack 43. The semiconductor layers of the second LED stack 33 are stacked in the same order as the semiconductor layers of the third LED stack 43, and thus, process stability may be ensured. This will be described in detail later with reference to a manufacturing method. However, the inventive concepts are not limited thereto, and in some exemplary embodiments, the polarities of the first conductivity type semiconductor layer 23a, 33a, and 43a, and the second conductivity type semiconductor layer 23b, 33b, or 43b may be reversed.

The second LED stack 33 may include a mesa etching region, in which the second conductivity type semiconductor layer 33b and an active layer are removed to expose an upper surface of the first conductivity type semiconductor layer 33a. A mesa including the second conductivity type semiconductor layer 33b and the active layer may be disposed on a partial region of the first conductivity type semiconductor layer 33a by the mesa etching region. The upper surface of the first conductivity type semiconductor layer 33a may be exposed along a periphery of the mesa, and thus, the mesa may be disposed in an inner side of a region surrounded by an edge of the first conductivity type semiconductor layer 33a. Meanwhile, as shown in FIGS. 3 and 4B, the second n-electrode pad 37a may be disposed on the first conductivity type semiconductor layer 33a exposed in the mesa etching region.

The third LED stack 43 may also include a mesa etching region exposing an upper surface of the first conductivity type semiconductor layer 43a by removing the second conductivity type semiconductor layer 43b and an active layer, and a mesa including the second conductivity type semiconductor layer 43b and the active layer may be disposed on a partial region of the first conductivity type semiconductor layer 43a by the mesa etching region. In addition, the upper surface of the first conductivity type semiconductor layer 43a may be exposed along a periphery of the mesa, and thus, the mesa may be disposed in an inner side of a region surrounded by an edge of the first conductivity type semiconductor layer 43a. Further, the third n-electrode pad 47a may be disposed on the first conductivity type semiconductor layer 43a exposed to the mesa etching region.

However, the first LED stack 23 may not include a mesa etching region. As such, the overall volume of the first LED stack 23 may be greater than that of the second LED stack 33 or the third LED stack 43, as shown in FIGS. 4A and 4B.

The third LED stack 43 may have a flat lower surface, but the inventive concepts are not limited thereto. For example, the third LED stack 43 may include irregularities on a surface of the first conductivity type semiconductor layer 43a, and light extraction efficiency may be improved by the irregularities. The surface irregularities of the first conductivity type semiconductor layer 43a may be formed by separating a patterned sapphire substrate, for example. In other exemplary embodiments, the surface irregularities in the first conductivity type semiconductor layer 43a may be formed by texturing it after separating the growth substrate. The first conductivity type semiconductor layer 33a of the second LED stack 33 may also have a textured surface.

In the illustrated exemplary embodiment, the first LED stack 23, the second LED stack 33, and the third LED stack 43 may be overlapped with one another, and may have a light emitting area of substantially similar size. However, the light emitting areas of the first, second, and third LED stacks 23, 33, and 43 may be adjusted by the mesa etching region, the through holes 23h1, 23h2, 23h3, and 23h4, and the through holes 33h1 and 33h2. For example, the light emitting areas of the first and third LED stacks 23 and 43 may be larger than that of the second LED stack 33, and thus, luminous intensity of light generated in the first LED stack 23 and/or the third LED stack 43 may be further increased compared to that of light generated in the second LED stack 33.

The first transparent electrode 25 may be disposed between the first LED stack 23 and the second LED stack 33. The first transparent electrode 25 is in ohmic contact with the second conductivity type semiconductor layer 23b of the first LED stack 23 and transmits light generated in the first LED stack 23. The first transparent electrode 25 may be formed using a metal layer or a transparent oxide layer, such as indium tin oxide (ITO). The first transparent electrode 25 may cover an entire surface of the second conductivity type semiconductor layer 23b of the first LED stack 23, and a side surface thereof may be disposed to be flush with a side surface of the first LED stack 23. More particularly, a side surface of the first transparent electrode 25 may not be covered with the second bonding layer 59. Furthermore, the through holes 23$h$1, 23$h$2, and 23$h$3 may pass through the first transparent electrode 25, and thus, the first transparent electrode 25 may be exposed to sidewalls of the through holes 23$h$1, 23$h$2, and 23$h$3. Meanwhile, the through hole 23$h$4 may expose an upper surface of the first transparent electrode 25. However, the inventive concepts are not limited thereto, and in some exemplary embodiments, the first transparent electrode 25 may be partially removed along an edge of the first LED stack 23, so that the side surface of the first transparent electrode 25 be covered with the second bonding layer 59. In addition, since the first transparent electrode 25 may be removed by patterning in advance a region where the through holes 23$h$1, 23$h$2, and 23$h$3 are to be formed, the first transparent electrode 25 may be prevented from being exposed to sidewalls of the through holes 23$h$1, 23$h$2, and 23$h$3.

The second transparent electrode 35 is in ohmic contact with the second conductivity type semiconductor layer 33$b$ of the second LED stack 33. As shown in the drawing, the second transparent electrode 35 contacts the upper surface of the second LED stack 33 between the first LED stack 23 and the second LED stack 33. The second transparent electrode 35 may be formed of a metal layer or a conductive oxide layer that is transparent to red light. The conductive oxide layer may include $SnO_2$, $InO_2$, ITO, ZnO, IZO, or the like. In particular, the second transparent electrode 35 may be formed of ZnO, which may be formed as a single crystal on the second LED stack 33 and have favorable electrical and optical characteristics as compared with the metal layer or other conductive oxide layers. Moreover, since ZnO has a strong adhesion to the second LED stack 33, reliability of the light emitting device may be improved.

The second transparent electrode 35 may be partially removed along an edge of the second LED stack 33, and accordingly, an outer side surface of the second transparent electrode 35 may be covered with the second surface protection layer 36 and/or the intermediate insulation layer 38. In particular, the side surface of the second transparent electrode 35 may be recessed inwardly than that of the second LED stack 33, and a region where the second transparent electrode 35 is recessed may be filled with the second surface protection layer 36, the intermediate insulation layer 38, and/or the second bonding layer 59. The second transparent electrode 35 may also be recessed near the mesa etching region of the second LED stack 33, and the recessed region may be filled with the second surface protection layer 36, the intermediate insulation layer 38, and/or the second bonding layer 59.

The third transparent electrode 45 is in ohmic contact with the second conductivity type semiconductor layer 43$b$ of the third LED stack 43. The third transparent electrode 45 may be disposed between the second LED stack 33 and the third LED stack 43, and contacts the upper surface of the third LED stack 43. The third transparent electrode 45 may be formed of a metal layer or a conductive oxide layer that is transparent to red light and green light. For example, the conductive oxide layer may include $SnO_2$, $InO_2$, ITO, ZnO, IZO, or the like. In particular, the third transparent electrode 45 may be formed of ZnO, which may be formed as a single crystal on the third LED stack 43. In this manner, ZnO may have favorable electrical and optical characteristics as compared with the metal layer or other conductive oxide layers. In particular, since ZnO has a strong adhesion to the third LED stack 43, reliability of the light emitting device may be improved.

The third transparent electrode 45 may be partially removed along an edge of the third LED stack 43, and accordingly, an outer side surface of the third transparent electrode 45 may not be exposed to the outside, but covered with the first surface protection layer 46, the lower insulation layer 48, or the first bonding layer 49. More particularly, the side surface of the third transparent electrode 45 may be recessed inwardly than that of the third LED stack 43, and a region where the third transparent electrode 45 is recessed may be filled with the first surface protection layer 46, the lower insulation layer 48, and/or the first bonding layer 49. The third transparent electrode 45 may also be recessed near the mesa etching region of the third LED stack 43, and the recessed region may be filled with the first surface protection layer 46, the lower insulation layer 48, and/or the first bonding layer 49.

Since the second transparent electrode 35 and the third transparent electrode 45 are recessed as described above, the side surfaces of the second transparent electrode 35 and the third transparent electrode 45 may be prevented from being exposed to an etching gas, thereby improving the production yield of the light emitting device 100.

According to an exemplary embodiment, the second transparent electrode 35 and the third transparent electrode 45 may include the same conductive oxide layer, such as ZnO, and the first transparent electrode 25 may be formed of a different kind of conductive oxide layer from the second and third transparent electrodes 35 and 45, such as ITO. However, the inventive concepts are not limited thereto, and each of the first, second, and third transparent electrodes 25, 35, and 45 may include the same or different materials in other exemplary embodiments.

The first n-electrode pad 27$a$ is in ohmic contact with the first conductivity type semiconductor layer 23$a$ of the first LED stack 23. The first n-electrode pad 27$a$ may include, for example, AuGe or AuTe.

The second n-electrode pad 37$a$ is in ohmic contact with the first conductivity type semiconductor layer 33$a$ of the second LED stack 33. The second n-electrode pad 37$a$ may be disposed on the first conductivity type semiconductor layer 33$a$ exposed by mesa etching. The second n-electrode pad 37$a$ may be formed of, for example, Cr/Au/Ti.

The third n-electrode pad 47$a$ is in ohmic contact with the first conductivity type semiconductor layer 43$a$ of the third LED stack 43. The third n-electrode pad 47$a$ may be disposed on the first conductivity type semiconductor layer 43$a$ exposed through the second conductivity type semiconductor layer 43$b$, that is, in the mesa etching region. The third n-electrode pad 47$a$ may be formed of, for example, Cr/Au/Ti. An upper surface of the third n-electrode pad 47$a$ may be placed higher than that of the second conductivity type semiconductor layer 43$b$, and further, higher than that of the third transparent electrode 45. For example, a thickness of the third n-electrode pad 47$a$ may be about 2 µm or more. The third n-electrode pad 47$a$ may have a shape of a truncated cone, but is not limited thereto. The third n-electrode pad 47$a$ may have various shapes, such as a square pyramid, a cylindrical shape, or a cylindrical shape.

The upper p-electrode pad 37$b$ may be disposed on the second transparent electrode 35. The upper p-electrode pad 37$b$ may be disposed in openings formed in the first planarization layer 51 and the second surface protection layer 36. The upper p-electrode pad 37$b$ may include substantially the same material as the second n-electrode pad 37$a$, but the inventive concepts are not limited thereto.

The lower p-electrode pad 47$b$ may include substantially the same material as the third n-electrode pad 47$a$. An upper surface of the lower p-electrode pad 47b may be located at substantially the same elevation as the third n-electrode pad 47a, and, accordingly, a thickness of the lower p-electrode pad 47b may be less than that of the third n-electrode pad 47a. More particularly, the thickness of the lower p-electrode pad 47b may be approximately equal to a thickness of a portion of the third n-electrode pad 47a protruding above the third transparent electrode 45. For example, the thickness of the lower p-electrode pad 47b may be about 1.2 μm or less. Since the upper surface of the lower p-electrode pad 47b is located at substantially the same elevation as that of the third n-electrode pad 47a, the lower p-electrode pad 47b and the third n-electrode pad 47a may be simultaneously exposed when the through holes 33h1 and 33h2 are formed. When the elevations of the third n-electrode pad 47a and the lower p-electrode pad 47b are different, any one of the electrode pads may be damaged in the etching process. As such, the elevations of the third n-electrode pad 47a and the lower p-electrode pad 47b are set to be approximately equal, and thus, it is possible to prevent any one of the electrode pads from being damaged during the etching process or the like.

The first surface protection layer 46 covers a side surface of the mesa of the third LED stack 43 to prevent non-radiative recombination occurring at the side surface of the mesa. The side surface of the mesa may include surface defects formed from the mesa etching process, and thus, non-radiative recombination may occur in the surface defects. Moreover, when the light emitting device includes a micro LED having a small light emitting area, light extraction efficiency may be significantly deteriorated when non-radiative recombination occurs at the side surface. As such, according to an exemplary embodiment, chemical treatment for removing surface defects is performed after the mesa etching process by covering the exposed side surface with the first surface protection layer 46 to prevent non-radiative recombination. Surface treatment on the side surface of the mesa of the third LED stack 43 may be performed using, for example, diluted solution of fluoride such as HF or the like, diluted solution of sulfide, a chlorine-based diluted solution such as HCl, $FeCl_3$ or the like, or a basic solution such as KOH, tetramethylammonium hydroxide (TMAH), NaOH, or the like. While water may be used as a solvent, alcohol such as ethanol or isopropyl alcohol (IPA) may be used to prevent formation of an oxide layer.

In particular, since a surface damaged by a dry etching process is highly reactive, a natural oxide layer may be easily formed. As such, the natural oxide layer needs to be removed, and the surface from which the natural oxide layer has been removed needs to be passivated. Accordingly, surface treatment according to an exemplary embodiment may include an etching process for removing the natural oxide layer and a surface passivating process for passivating the surface removed with the natural oxide.

In an exemplary embodiment, the surface etching process and the surface passivating process may be performed in a single process using an etching solution including a sulfide. For example, the surface etching process and the surface passivating process may be performed using a mixed solution of HCl and $(NH_4)_2S$.

In another exemplary embodiment, the surface etching process may be performed first to remove the natural oxide layer, and the surface passivating process may be performed thereafter. For example, the surface etching process may be performed using an acidic solution or a basic solution, and the surface passivating process may be performed using a solution including a sulfide. For example, the surface etching process is performed using a mixed solution of BOE and HCl or a KOH solution, a cleaning process may be performed using IPA after the etching process is completed, and the surface passivating process may be performed using a solution including $(NH_4)_2S$ or $Na_2S$. For example, $(NH_4)_2S$ or $Na_2S$ may be used diluted with ammonia or IPA. In the cleaning process, other alcohols may be used instead of IPA, and deionized water may be used. However, alcohol is more favorable than deionized water with respect to preventing formation of the oxide layer on the surface during the cleaning process.

Sulfides may include, for example, thioacetamide ($CH_3CSNH_2$), sulfur chloride ($S_2Cl$, $S_2Cl_2$), sulfanyl thiohypochlorite ($ClHS_2$), 1-Octadecanethiol (1-$CH_3$[$CH_2$]$_{17}$SH), in addition to $(NH_4)_2S$ and $Na_2S$. According to an exemplary embodiment, the sulfur passivated surface may include bonding of a group III element such as Ga or the like and sulfur, and/or bonding of a group V element such as As or the like and sulfur.

The first surface protection layer 46 may cover the second conductivity type semiconductor layer 43b, the active layer, and the first conductivity type semiconductor layer 43a exposed at the side surface of the mesa. The first surface protection layer 46 may be formed using an atomic layer deposition technique, a low pressure chemical deposition technique, or a plasma enhanced chemical deposition technique, and may include, for example, $Al_2O_3$, $HfO_2$, $SiN_x$, or $SiO_2$. However, to prevent a natural oxide layer from being formed on the surface during $SiO_2$ formation, a sub-surface protection layer may be formed first, and then $SiO_2$ may be formed thereon. For example, $Al_2O_3$, $HfO_2$, $SiN_x$, or the like may be used as the sub-surface protection layer.

The first surface protection layer 46 may cover the third transparent electrode 45 along with the side surface of the mesa, and further, cover the upper surface of the first conductivity type semiconductor layer 43a exposed in the mesa etching region. In the illustrated exemplary embodiment, the first surface protection layer 46 is disposed above the first conductivity type semiconductor layer 43a exposed to the mesa etching region, and thus, the side surface of the first conductivity type semiconductor layer 43a disposed under the mesa of the third LED stack 43 is not covered with the first surface protection layer 46. However, the inventive concepts are not necessarily limited thereto, and in another exemplary embodiment, the first surface protection layer 46 may cover the side surface of the first conductivity type semiconductor layer 43a.

The first surface protection layer 46 may have an opening exposing the first conductivity type semiconductor layer 43a and an opening exposing the third transparent electrode 45. The third n-electrode pad 47a and the lower p-electrode pad 47b may be disposed in the openings, respectively.

The lower insulation layer 48 covers the upper surface of the third LED stack 43. The lower insulation layer 48 may also cover the first surface protection layer 46 and the third transparent electrode 45, and may cover the third n-electrode pad 47a and the lower p-electrode pad 47b. The lower insulation layer 48 may have openings exposing the third n-electrode pad 47a and the lower p-electrode pad 47b. The lower insulation layer 48 may protect the third LED stack 43, the third transparent electrode 45, the third n-electrode pad 47a, and the lower p-electrode pad 47b. Further, the lower insulation layer 48 may include a material capable of improving adhesion to the first bonding layer 49, such as $SiO_2$. In some exemplary embodiments, the lower insulation layer 48 may be omitted.

The first bonding layer 49 couples the second LED stack 33 to the third LED stack 43. The first bonding layer 49 may disposed between the first conductivity type semiconductor layer 33a and the third transparent electrode 45. The first bonding layer 49 may contact the lower insulation layer 48, and may partially contact the third n-electrode pad 47a and the lower p-electrode pad 47b. When the lower insulation layer 48 is omitted in some exemplary embodiments, the first bonding layer 49 may partially contact the first surface protection layer 46 and the first conductivity type semiconductor layer 43a.

The first bonding layer 49 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 49 may be formed of spin-on-glass (SOG).

The first planarization layer 51 may be disposed on the second LED stack 33. In particular, the first planarization layer 51 is disposed on an upper region of the second conductivity type semiconductor layer 33b and spaced apart from the mesa etching region.

The through holes 33h1 and 33h2 may pass through the first planarization layer 51, the second LED stack 33, and the first bonding layer 49, and expose the third n-electrode pad 47a and the lower p-electrode pad 47b.

The first sidewall insulation layer 53 covers sidewalls of the through holes 33h1 and 33h2, and has openings exposing bottoms of the through holes 33h1 and 33h2 The first sidewall insulation layer 53 may be formed using, for example, a chemical vapor deposition technique or an atomic layer deposition technique, and may be formed of, for example, $Al_2O_3$, $HfO_2$, $SiO_2$, $Si_3N_4$, or the like.

The lower buried vias 55a and 55b may fill the through holes 33h1 and 33h2, respectively. The lower buried vias 55a and 55b are insulated from the second LED stack 33 by the first sidewall insulation layer 53. The lower buried via 55a may be electrically connected to the third n-electrode pad 47a, and the lower buried via 55b may be electrically connected to the lower p-electrode pad 47b.

The lower buried vias 55a and 55b may be formed using a chemical mechanical polishing technique. For example, after forming a seed layer and filling the through holes 33h1 and 33h2 with a conductive material, such as Cu using a plating technique, the lower buried vias 55a and 55b may be formed by removing metal layers on the first planarization layer 51 using the chemical mechanical polishing technique. As shown in FIGS. 4A and 4B, the lower buried vias 55a and 55b may have a relatively wider width at inlets of the through holes 33h1 and 33h2 to improve electrical connection.

The lower buried vias 55a and 55b may be formed together through the same process. As such, upper surfaces of the lower buried vias 55a and 55b may be substantially flush with the first planarization layer 51. A detailed process of forming the lower buried vias 55a and 55b will be described in more detail later. However, the inventive concepts are not limited thereto, and the lower buried vias 55a and 55b may be formed through different processes from one another.

The capping layers 57 may cover upper surfaces of the lower buried vias 55a and 55b. The capping layers 57 may be formed of a metal layer that protects the lower buried vias 55a and 55b.

The second surface protection layer 36 covers a side surface of the mesa of the second LED stack 33 to prevent non-radiative recombination occurring at the side surface of the mesa. The side surface of the mesa of the second LED stack 33 may include surface defects formed from the mesa etching process, and thus, non-radiative recombination may occur in the surface defects. As such, according to an exemplary embodiment, chemical treatment for removing the surface defects is performed after the mesa etching process by covering the exposed side surface with the second surface protection layer 36 to prevent non-radiative recombination. Since surface treatment on the side surface of the mesa of the second LED stack 33 is similar to that performed on the side surface of the mesa of the third LED stack 43, repeated detailed descriptions thereof will be omitted. As similarly described above, the surface treatment forms a sulfur passivated surface on the side surface of the mesa of the second LED stack 33. Meanwhile, the second surface protection layer 36 may cover the second conductivity type semiconductor layer 33b, the active layer, and the first conductivity type semiconductor layer 33a exposed in the side surface of the mesa. The second surface protection layer 36 may be formed using an atomic layer deposition technique, a low pressure chemical deposition technique, or a plasma enhanced chemical deposition technique, and may be formed of, for example, a single layer of $Al_2O_3$, $HfO_2$, $SiN_x$, or $SiO_2$, or a multilayer structure including at least one of the above materials.

The second surface protection layer 36 may cover the first planarization layer 51 along with the side surface of the mesa of the second LED stack 33, and further, may cover an upper surface of the first conductivity type semiconductor layer 33a exposed in the mesa etching region. In the exemplary embodiment, the second surface protection layer 36 is disposed above the first conductivity type semiconductor layer 33a exposed in the mesa etching region, and thus, the side surface of the first conductivity type semiconductor layer 33a disposed under the mesa of the second LED stack 33 is not covered with the second surface protection layer 36. However, the inventive concepts are not limited thereto, and in another exemplary embodiment, the second surface protection layer 36 may cover the side surface of the first conductivity type semiconductor layer 33a.

The second surface protection layer 36 may have a plurality of openings to allow electrical connection. The second n-electrode pad 37a and the upper p-electrode pad 37b may be disposed in the openings of the second surface protection layer 36, respectively.

The intermediate insulation layer 38 is formed on the second LED stack 33, and covers the second surface protection layer 36, the upper p-electrode pad 37b, and the second n-electrode pad 37a. The intermediate insulation layer 38 may also cover the mesa etching region of the second LED stack 33. The intermediate insulation layer 38 may have openings exposing the capping layer 57 or the lower buried vias 55a and 55b, the upper p-electrode pad 37b, and the second n-electrode pad 37a. The intermediate insulation layer 38 may be formed of, for example, $SiO_2$. The intermediate insulation layer 38 may protect the second LED stack 33, the upper p-electrode pad 37b, and the second n-electrode pad 37a, and further, improve adhesion of the second bonding layer 59.

The lower connectors 39a, 39b, and 39c may be disposed on the intermediate insulation layer 38. The first lower connector 39a may be electrically connected to the lower buried via 55a, and may also extend in the lateral direction to be electrically connected to the second n-electrode pad 37a. As such, the first conductivity type semiconductor layer 43a of the third LED stack 43 and the first conductivity type semiconductor layer 33a of the second LED stack 33 may be commonly electrically connected. The first lower connector 39a may be electrically connected to the lower buried via 55a through the capping layer 57.

The second lower connector 39b is electrically connected to the lower buried via 55b. As shown in the drawing, the second lower connector 39b may be electrically connected to the lower buried via 55b through the capping layer 57.

The third lower connector 39c is electrically connected to the second transparent electrode 35. The third lower connector 39c may be disposed on the upper p-electrode pad 37b as shown in FIG. 4A, and may be electrically connected to the second transparent electrode 35 through the upper p-electrode pad 37b.

The second bonding layer 59 couples the first LED stack 23 to the second LED stack 33. As shown in the drawing, the second bonding layer 59 may be disposed between the first transparent electrode 25 and the intermediate insulation layer 38. The second bonding layer 59 may also cover the first, second, and third lower connectors 39a, 39b, and 39c. The second bonding layer 59 may include substantially the same material that may form the first bonding layer 49 described above, and thus, repeated descriptions thereof will be omitted to avoid redundancy.

The second planarization layer 61 covers the first LED stack 23. The second planarization layer 61 may be formed of an aluminum oxide layer, a silicon oxide layer, or a silicon nitride film. The second planarization layer 61 may have an opening exposing the first n-electrode pad 27a.

The through holes 23h1, 23h2, 23h3, and 23h4 pass through the second planarization layer 61 and the first LED stack 23. Further, the through holes 23h1, 23h2, and 23h3 may pass through the first transparent electrode 25 and the second bonding layer 59 to expose the lower connectors 39a, 39b, and 39c, and the through hole 23h4 may expose the first transparent electrode 25. For example, the through hole 23h1 is formed to provide a passage for electrical connection to the lower buried via 55a, the through hole 23h2 is formed to provide a passage for electrical connection to the lower buried via 55b, and the through hole 23h3 is formed to provide a passage for electrical connection to the second transparent electrode 35.

The through hole 23h4 is formed to provide a passage for electrical connection to the first transparent electrode 25. The through hole 23h4 does not pass through the first transparent electrode 25. However, the inventive concepts are not limited thereto, and the through hole 23h4 may pass through the first transparent electrode 25 as long as the through hole 23h4 provides the passage for electrical connection to the first transparent electrode 25.

After the through holes 23h1, 23h2, 23h3, and 23h4 are formed, chemical treatment may be performed to remove surface defects formed on inner walls of the through holes 23h1, 23h2, 23h3, and 23h4. The surface of the first LED stack 23 may be treated using, for example, a diluted HF solution, a diluted HCl solution, or a KOH solution. Surface treatment of the first LED stack 23 may include a surface etching process and a sulfide passivating process, as similarly described above in the surface treatment for the side surface of the third LED stack 43. As such, repeated descriptions thereof will be omitted to avoid redundancy.

The second sidewall insulation layer 63 covers the sidewalls of the through holes 23h1, 23h2, 23h3, and 23h4, and has openings exposing the bottoms of the through holes 23h1, 23h2, 23h3, and 23h4. In the illustrated exemplary embodiment, the second sidewall insulation layer 63 is not formed on a sidewall of an opening 61a of the second planarization layer 61, but the inventive concepts are not limited thereto. In some exemplary embodiments, the second sidewall insulation layer 63 may also be formed on a sidewall of the opening 61a of the second planarization layer 61. The second sidewall insulation layer 63 may be formed using, for example, a chemical vapor deposition technique or an atomic layer deposition technique, and may be formed of, for example, $Al_2O_3$, $HfO_2$, $SiO_2$, $Si_3N_4$, or the like.

The upper buried vias 65a, 65b, 65c, and 65d may fill the through holes 23h1, 23h2, 23h3, and 23h4, respectively. The upper buried vias 65a, 65b, 65c, and 65d are electrically insulated from the first LED stack 23 by the second sidewall insulation layer 63.

The upper buried via 65a may be electrically connected to the lower buried via 55a through the first lower connector 39a, the upper buried via 65b may be electrically connected to the lower buried via 55b through the second lower connector 39b, and the upper buried via 65c may be electrically connected to the second transparent electrode 35 through the third lower connector 39c. Also, the upper buried via 65d may be electrically connected to the first transparent electrode 25.

The upper buried vias 65a, 65b, 65c, and 65d may be formed using a chemical mechanical polishing technique. For example, after forming a seed layer and filling the through holes 23h1, 23h2, 23h3, and 23h4 using a plating technique, the upper buried vias 65a, 65b, 65c, and 65d may be formed by removing metal layers on the second planarization layer 61 using the chemical mechanical polishing technique. Furthermore, a metal barrier layer may be formed before forming the seed layer.

The upper buried vias 65a, 65b, 65c, and 65d may be substantially flush with the second planarization layer 61 that may be formed together through the same process. However, the inventive concepts are not limited thereto, and the upper buried vias 65a, 65b, 65c, and 65d and the second planarization layer 61 may be formed through different processes from each other.

The first upper connector 67a, the second upper connector 67b, the third upper connector 67c, and the fourth upper connector 67d are disposed on the second planarization layer 61. The first upper connector 67a may be electrically connected to the upper buried via 65a, the second upper connector 67b may be electrically connected to the upper buried via 65b, the third upper connector 67c may be electrically connected to the upper buried via 65c, and the fourth upper connector 67d may be electrically connected to the upper buried via 65d. The first, second, third, and fourth upper connectors 67a, 67b, 67c, and 67d may cover the upper buried vias 65a, 65b, 65c, and 65d, respectively. Meanwhile, the first upper connector 67a may be electrically connected to the first n-electrode pad 27a through the opening 61a of the second planarization layer 61. As such, the first conductivity type semiconductor layers 23a, 33a, 43a of the first, second, and third LED stacks 23, 33, and 43 are commonly electrically connected to one another.

The first upper connector 67a, the second upper connector 67b, the third upper connector 67c, and the fourth upper connector 67d may be formed of substantially the same material, for example, AuGe/Ni/Au/Ti, in the same process.

The upper insulation layer 71 may cover the side and upper surfaces of the first LED stack 23 and the second planarization layer 61, and further, may cover the first to fourth upper connectors 67a, 67b, 67c, and 67d. In particular, the upper insulation layer 71 may function as a surface protection layer to prevent non-radiative recombination generated on the side surface of the first LED stack 23. In addition, a sulfur passivated surface may be formed on the side surface of the first LED stack 23. The upper insulation layer 71 may also cover the side surface of the first transparent electrode 25. Further, the upper insulation layer 71 may cover side surfaces of the first bonding layer 49 and the second bonding layer 59. The second LED stack 33 and the third LED stack 43 may be spaced apart from the upper insulation layer 71 by the bonding layers 49 and 59. However, the inventive concepts are not limited thereto, and the upper insulation layer 71 may cover the side surfaces of the second and third LED stacks 33 and 43.

The upper insulation layer 71 may have openings exposing the first upper connector 67a, the second upper connector 67b, the third upper connector 67c, and the fourth upper connector 67d. The openings of the upper insulation layer 71 may be generally disposed on flat surfaces of the first upper connector 67a, the second upper connector 67b, the third upper connector 67c, and the fourth upper connector 67d. The upper insulation layer 71 may be formed of a silicon oxide layer or a silicon nitride film, and may be formed to be thinner than the second planarization layer 61, for example, about 400 nm thick.

Each of the bump pads 73a, 73b, 73c, and 73d may be disposed on the first upper connector 67a, the second upper connector 67b, and the third upper connector 67c, and the fourth upper connector 67d and electrically connected thereto, respectively. The bump pads 73a, 73b, 73c, and 73d may be disposed in the openings of the upper insulation layer 71, and may be formed to seal the openings as shown in the drawings.

The first bump pad 73a is electrically connected to the upper buried via 65a and the first n-electrode pad 27a through the first upper connector 67a. In this manner, the first bump pad 73a is commonly electrically connected to the first conductivity type semiconductor layers 23a, 33a, 43a of the LED stacks 23, 33, and 43.

The second bump pad 73b may be electrically connected to the second conductivity type semiconductor layer 43b of the third LED stack 43 through the second upper connector 67b, the upper buried via 65b, the second lower connector 39b, the lower buried via 55b, the lower p-electrode pad 47b, and the transparent electrode 45.

The third bump pad 73c may be electrically connected to the second conductivity type semiconductor layer 33b of the second LED stack 33 through the third upper connector 67c, the upper buried via 65c, the third lower connector 39c, the upper p-electrode pad 37b, and the second transparent electrode 35.

The fourth bump pad 73d may be electrically connected to the second conductivity type semiconductor layer 23b of the first LED stack 23 through the fourth upper connector 67d and the first transparent electrode 25.

As such, each of the second to fourth bump pads 73b, 73c, and 73d may be electrically connected to the second conductivity type semiconductor layers 23b, 33b, and 43b of the first, second, and third LED stacks 23, 33, and 43, and the first bump pad 73a may be commonly electrically connected to the first conductivity type semiconductor layers 23a, 33a, and 43a of the first, second, and third LED stacks 23, 33, and 43.

The bump pads 73a, 73b, 73c, and 73d may cover the openings of the upper insulation layer 71, and portions of the bump pads 73a, 73b, 73c, and 73d may be disposed on the upper insulation layer 71. Alternatively, the bump pads 73a, 73b, 73c, and 73d may be disposed in the openings.

The bump pads 73a, 73b, 73c, and 73d may be formed of Au/In. For example, Au may be formed to have a thickness of about 3 μm, and In may be formed to have a thickness of about 1 μm. According to an exemplary embodiment, the light emitting device 100 may be bonded to the pads on the circuit board 101 using In. However, the inventive concepts are not limited thereto, and in some exemplary embodiments, the light emitting device 100 may be bonded to the pads using Pb or AuSn of the bump pads.

According to the illustrated exemplary embodiment, the first LED stack 23 is electrically connected to the bump pads 73a and 73d, the second LED stack 33 is electrically connected to the bump pads 73a and 73c, and the third LED stack 43 is electrically connected to the bump pads 73a and 73b. Accordingly, cathodes of the first LED stack 23, the second LED stack 33, and the third LED stack 43 are commonly electrically connected to the first bump pad 73a, and anodes thereof are electrically connected to the second to fourth bump pads 73b, 73c, and 73d, respectively. Accordingly, the first, second, and third LED stacks 23, 33, and 43 may be driven independently.

Although the light emitting device 100 is exemplarily illustrated as being formed with the bump pads 73a, 73b, 73c, and 73d, but the inventive concepts are not limited thereto. In some exemplary embodiments, the bump pads may be omitted. In particular, when the light emitting device is bonded to the circuit board using an anisotropic conductive film or anisotropic conductive paste, the bump pads may be omitted, and upper connectors 67a, 67b, 67c, and 67d may be directly bonded to the circuit board. As such, a bonding area may be increased.

Each of the second LED stack 33 and the third LED stack 43 according to the illustrated exemplary embodiment is exemplarily described as including the mesa, but in some exemplary embodiments, the second LED stack 33 and the third LED stack 43 may not include the mesa. In this case, each of the first surface protection layer 46 and the second surface protection layer 36 may at least partially cover the side surface of the third LED stack 43 and the side surface of the second LED stack 33, and thus, non-radiative recombination may be prevented.

Figure 5A:
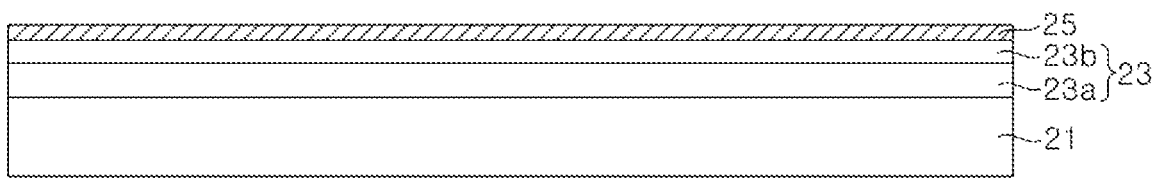
FIGS. 5A, 5B, and 5C are schematic cross-sectional views illustrating first, second, and third LED stacks grown on growth substrates, respectively, according to an exemplary embodiment.
Figure 5B:
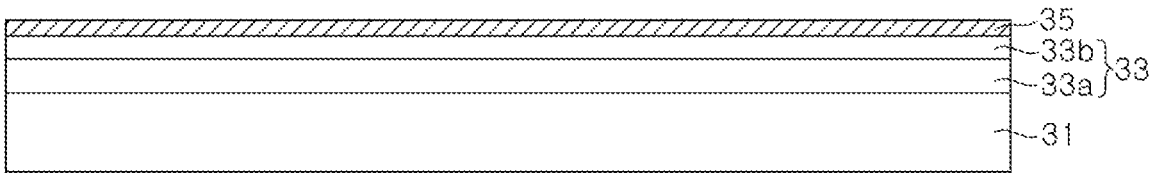
Figure 5C:
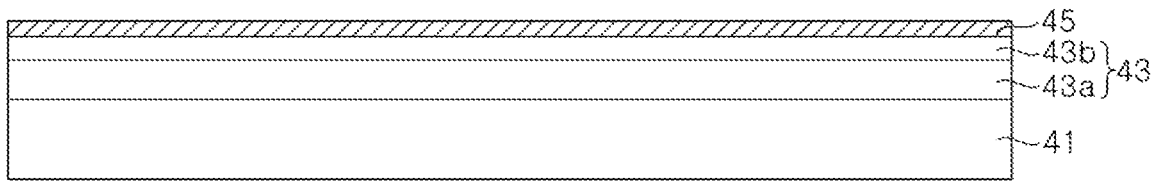

Hereinafter, a method of manufacturing the light emitting device 100 will be described in detail. A structure of the light emitting device 100 will also be understood in more detail through the manufacturing method described below. FIGS. 5A, 5B, and 5C are schematic cross-sectional views illustrating the first, second, and third LED stacks grown on growth substrates, respectively, according to an exemplary embodiment.

First, referring to FIG. 5A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that transmits light generated by the first LED stack 23, for example, red light. The first transparent electrode 25 may be formed of, for example, indium-tin oxide (ITO).

Referring to FIG. 5B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a SiC substrate, or a GaN substrate. In an exemplary embodiment, the second substrate 31 may be a flat sapphire substrate, but may be a patterned sapphire substrate. The first conductivity type semiconductor layer 33a and the second conductivity type semiconductor layer 33b may be formed of an AlGaInN-based semiconductor layer, and the active layer may include, for example, an AlGaInN-based well layer. A composition ratio of AlGaInN may be determined so that the second LED stack 33 emits blue light, for example.

A second transparent electrode 35 may be formed on the second conductivity type semiconductor layer 33b. As described above, the second transparent electrode 35 may be formed of a metal layer or a conductive oxide layer that transmits light generated by the first LED stack 23, for example, red light. In particular, the second transparent electrode 35 may be formed of ZnO.

Referring to FIG. 5C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a GaN substrate, or a GaAs substrate. The first conductivity type semiconductor layer 43a and the second conductivity type semiconductor layer 43b may be formed of an AlGaInAs-based or AlGaInP-based semiconductor layer, or an AlGaInN-based semiconductor layer, and the active layer may include, for example, an AlGaInP-based well layer or AlGaInN-based well layer. A composition ratio of AlGaInP or AlGaInN may be determined so that the third LED stack 43 emits green light, for example.

A third transparent electrode 45 may be formed on the second conductivity type semiconductor layer 43b. As described above, the third transparent electrode 45 may be formed of a metal layer or a conductive oxide layer that transmits light generated in the first and second LED stacks 23 and 33, for example, red light and blue light. In particular, the third transparent electrode 45 may be formed of ZnO.

The first, second, and third LED stacks 23, 33, and 43 are grown on the different growth substrates 21, 31, and 41, respectively, and, accordingly, the order of the manufacturing process is not particularly limited.

Hereinafter, a method of manufacturing the light emitting device 100 using first, second, and third LED stacks 23, 33, and 43 grown on growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, and 20C are schematic plan views and cross-sectional views illustrating a method of manufacturing a light emitting device for a display according to an exemplary embodiment. The cross-sectional views correspond to lines A-A' or B-B' of FIG. 3.

Figure 6A:
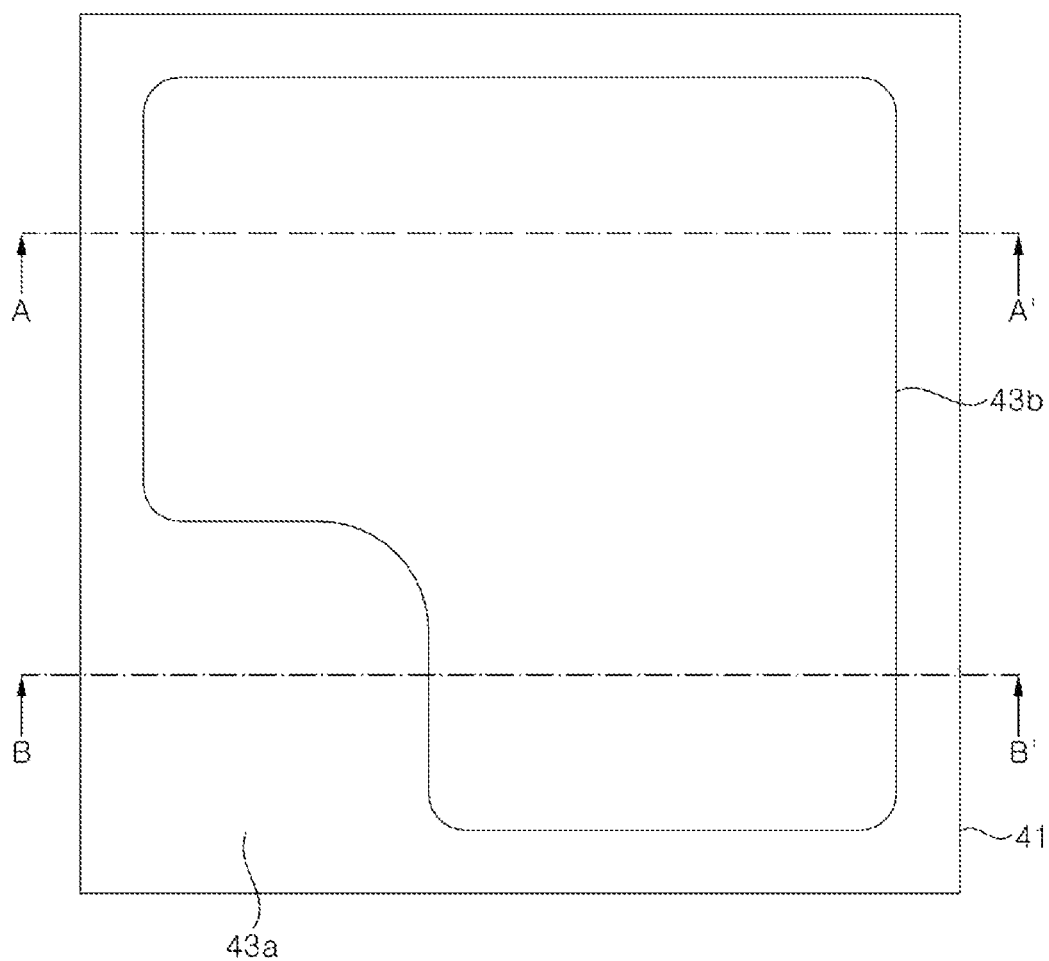
FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, and 20C are schematic plan views and cross-sectional views illustrating a method of manufacturing a light emitting device for a display according to an exemplary embodiment.
Figure 6B:
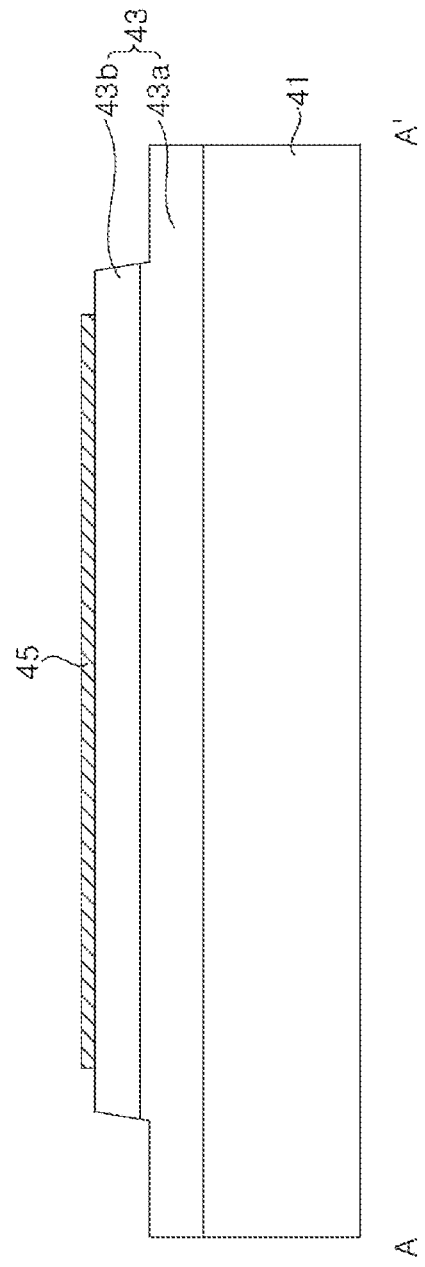
Figure 6C:
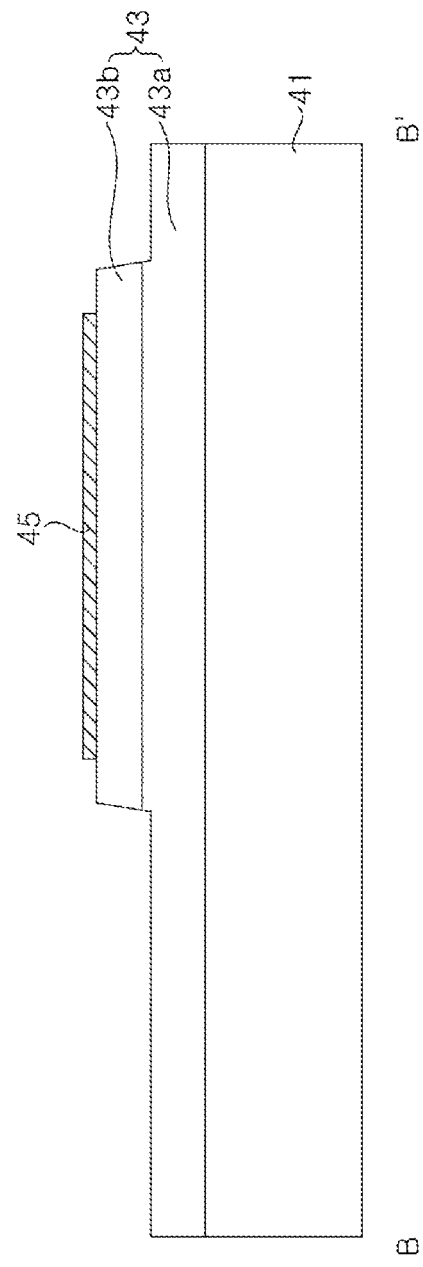

First, referring to FIGS. 6A, 6B, and 6C, the third transparent electrode 45 and the second conductivity type semiconductor layer 43b of the third LED stack 43 are patterned to expose the first conductivity type semiconductor layer 43a using photolithography and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. In this manner, the third transparent electrode 45 may be recessed from a mesa etching region. FIG. 6A exemplarily shows an edge of the mesa and does not show an edge of the third transparent electrode 45 to simplify illustration. However, since the third transparent electrode 45 is wet etched using the same etching mask, the edge of the third transparent electrode 45 may also be recessed from the edge of the mesa toward an inner side of the mesa. Since the same etching mask is used, the number of photolithography processes may not be increased, thereby reducing the process costs. However, the inventive concepts are not limited thereto, and the etching mask for etching the mesa etching process may be different from the etching mask for etching the third transparent electrode 45.

In the illustrated exemplary embodiment, the mesa may include a partial thickness of the first conductivity type semiconductor layer 43a, an active layer, and the second conductivity type semiconductor layer 43b. The mesa may be located in an inner side of a region surrounded by an edge of the first conductivity type semiconductor layer 43, and thus, an upper surface of the first conductivity type semiconductor layer 43a is exposed along a periphery of the mesa.

Thereafter, chemical treatment is performed to remove surface defects formed from the mesa etching process. For example, surface treatment may be performed using a diluted solution of fluorides such as HF or the like, a chlorine-based diluted solution such as HCl, $FeCl_3$ or the like, or a basic solution such as KOH, $NH_4OH$, tetramethylammonium hydroxide (TMAH), or NaOH. As described above, surface treatment may reduce non-radiative recombination by removing surface defects on a side surface of the mesa.

Water may be used as a solvent, but alcohol, for example, ethanol or isopropyl alcohol (IPA), may be used to prevent formation of an oxide layer.

In particular, since a surface formed by a dry etching process is highly reactive, a natural oxide layer may easily be formed. As such, the natural oxide layer needs to be removed, and the surface from which the natural oxide layer is removed needs to be passivated. Accordingly, surface treatment may include an etching process for removing the natural oxide layer and a surface passivating process for passivating the surface.

In an exemplary embodiment, the surface etching process and the surface passivating process may be performed in a single process using an etching solution including a sulfide. For example, the surface etching process and the surface passivating process may be performed using a mixed solution of HCl and $(NH_4)_2S$.

In another exemplary embodiment, the surface etching process may be performed first to remove the natural oxide layer, and the surface passivating process may be performed thereafter. For example, the surface etching process may be performed using an acidic solution or a basic solution, and the surface passivating process may be performed using a solution including a sulfide. For example, the surface etching process is performed using a mixed solution of BOE and HCl or a KOH solution, a cleaning process may be performed using IPA after the etching process is completed, and the surface passivating process may be performed using a solution including $(NH_4)_2S$ or $Na_2S$. For example, $(NH_4)_2S$ or $Na_2S$ may be used diluted with ammonia or IPA. In the cleaning process, other alcohols may be used instead of IPA, such as deionized water. However, alcohol is more favorable than deionized water in terms of preventing formation of the oxide layer on the surface during the cleaning process.

Figure 7A:
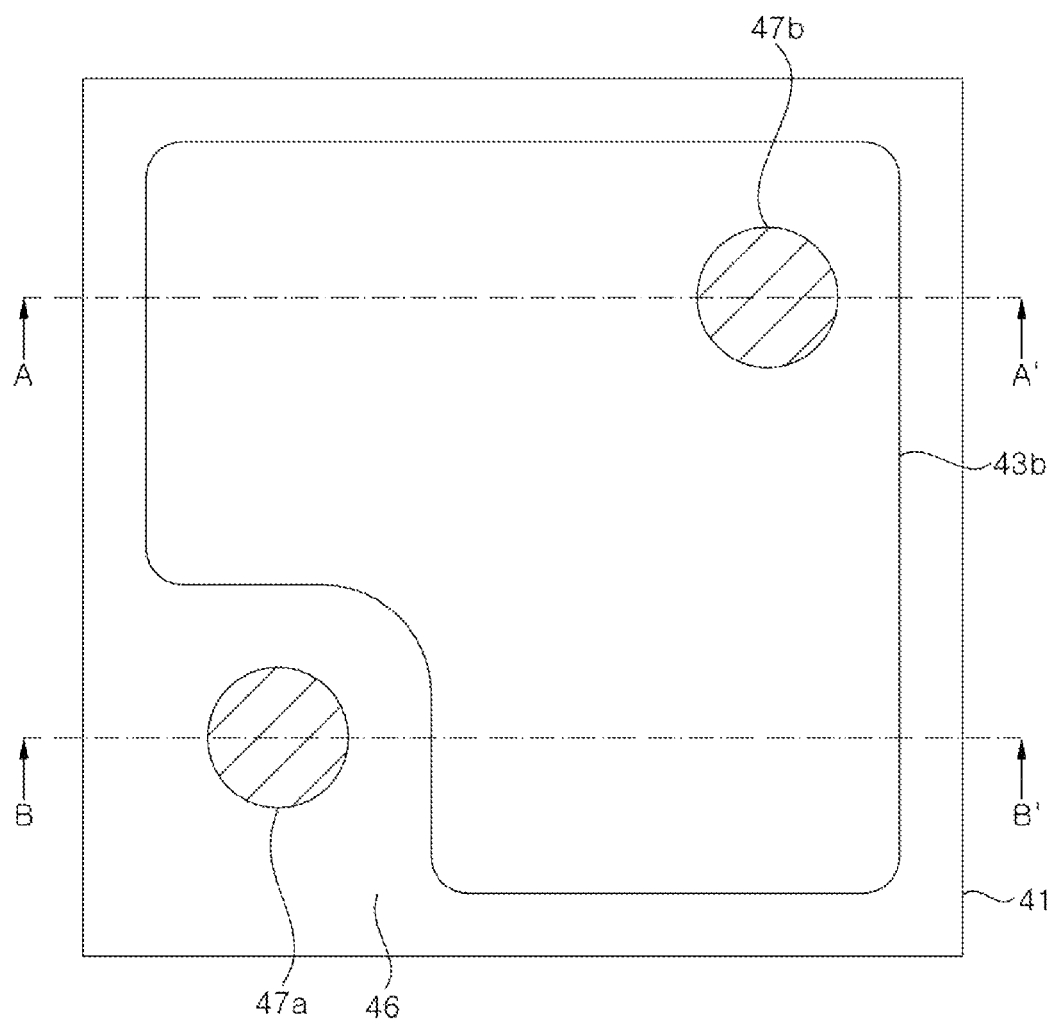
Figure 7B:
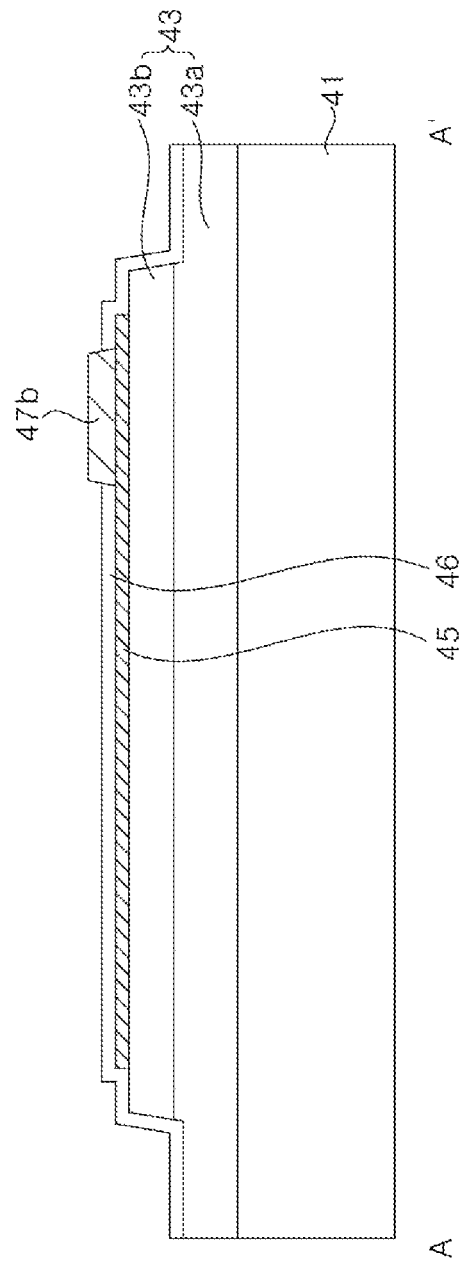
Figure 7C:
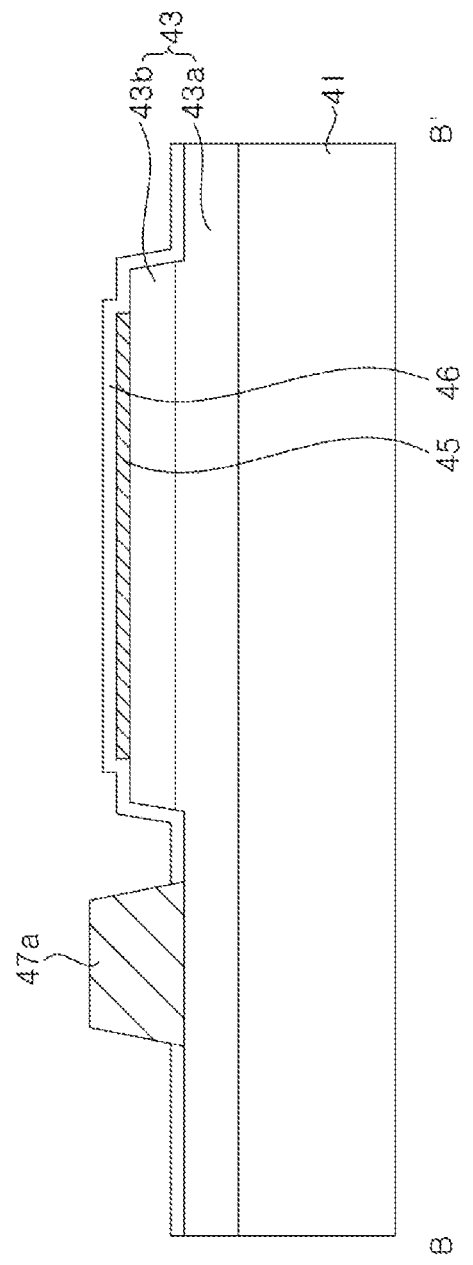

Referring to FIGS. 7A, 7B, and 7C, a first surface protection layer 46 covering the third LED stack 43 and the third transparent electrode 45 is formed. The first surface protection layer 46 may be formed using an atomic layer deposition technique, a low pressure chemical vapor deposition technique, or a plasma enhanced chemical vapor deposition technique, and may be formed of, for example, $Al_2O_3$, $SiN_x$, $SiO_2$, $HfO_2$, or the like. In an exemplary embodiment, a sub-surface protection layer such as an $Al_2O_3$ layer or an $HfO_2$ layer may be formed first using an atomic layer deposition technique, and then a $SiO_2$ layer may be formed on the sub-surface protection layer using a chemical vapor deposition technique. In general, the atomic layer deposition technique takes a long time to process, and thus, a natural oxide layer may be formed on the side surface of the mesa during the formation of the $SiO_2$ layer. Accordingly, the thin $Al_2O_3$ layer or an $HfO_2$ layer is formed using the atomic layer deposition technique and then the $SiO_2$ layer is formed thereon, so as to shorten the process time and to prevent formation of the natural oxide layer.

The first surface protection layer 46 covers the side surface of the mesa to prevent non-radiative recombination that may occur at the side surface of the mesa.

The first surface protection layer 46 may be patterned to have openings exposing the first conductivity type semiconductor layer 43a and the third transparent electrode 45. The third n-electrode pad 47 and the lower p-electrode pad 47b are formed in the openings. The third n-electrode pad 47a and the lower p-electrode pad 47b may have different thicknesses from each other. In particular, upper surfaces of the third n-electrode pad 47a and the lower p-electrode pad 47b may be located at substantially the same elevation.

Figure 8A:
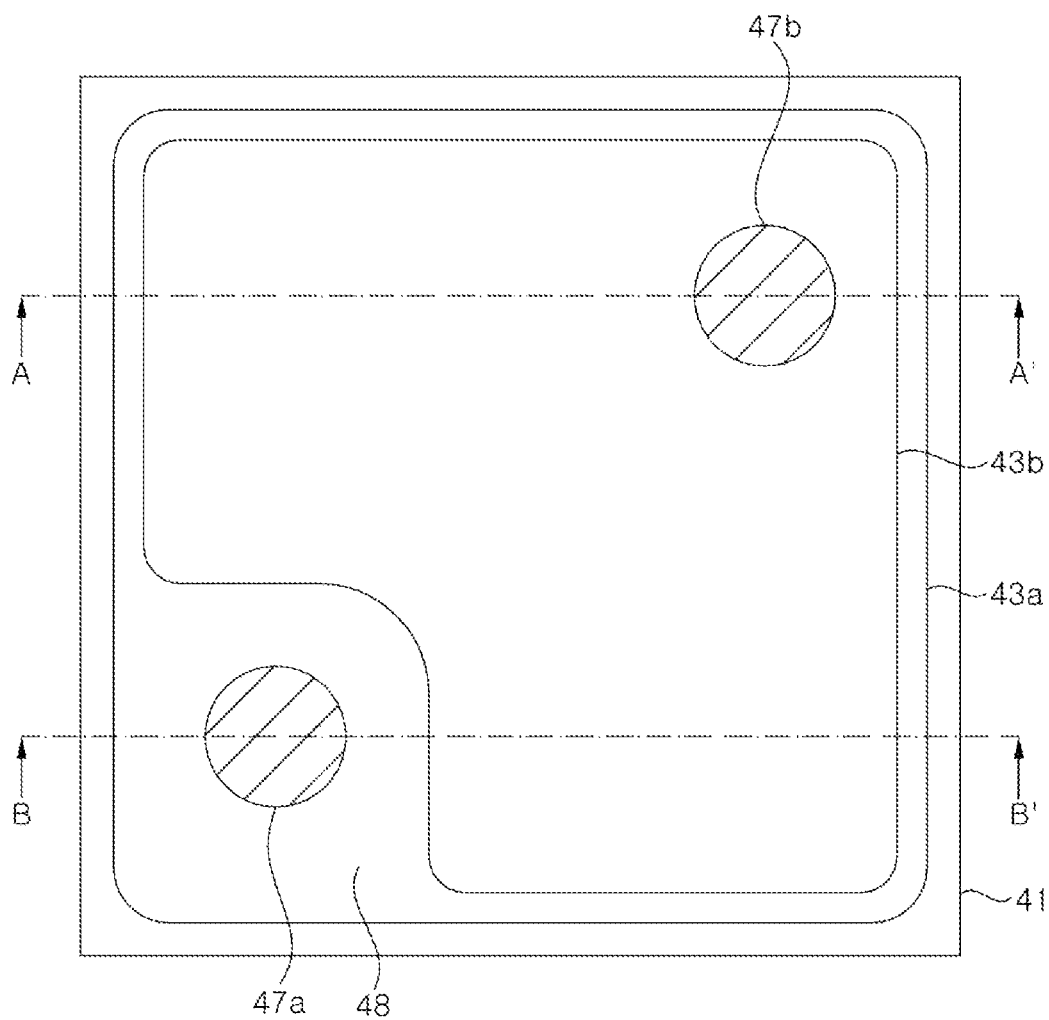
Figure 8B:
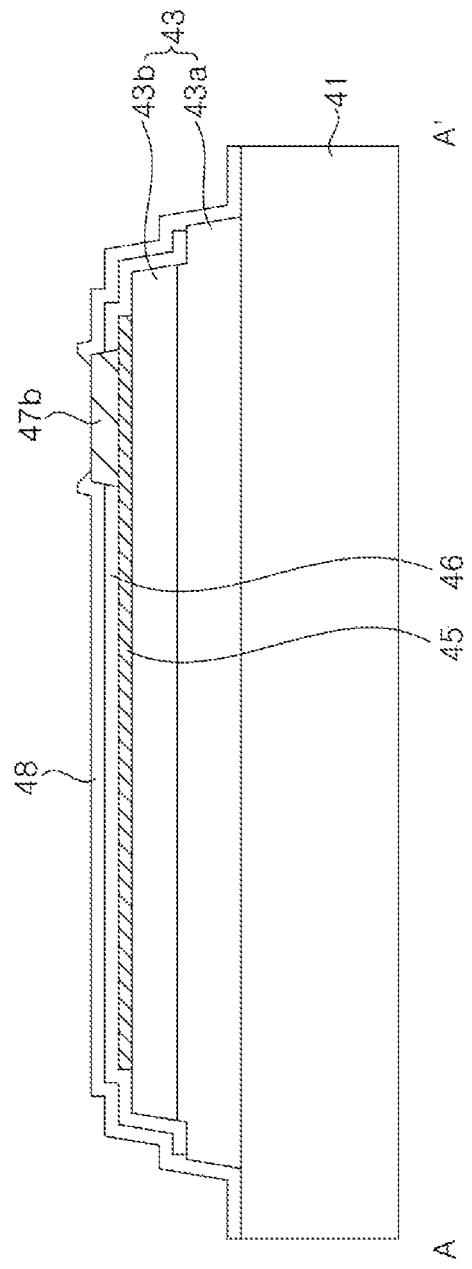
Figure 8C:
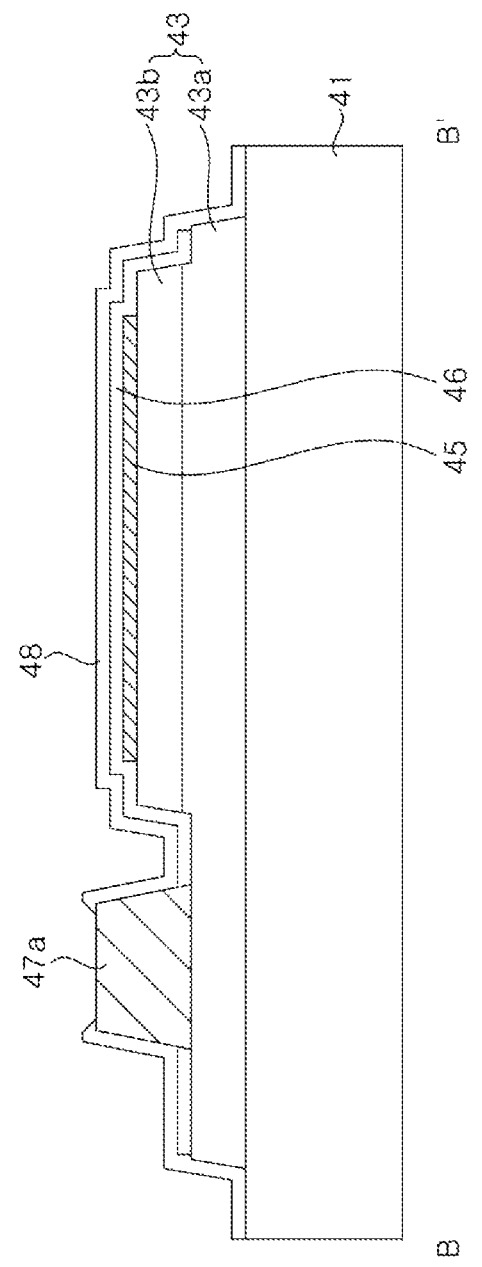

Referring to FIGS. 8A, 8B, and 8C, an isolation region for defining a light emitting device region may be formed. For example, the first conductivity type semiconductor layer 43a may be removed along the isolation region and an upper surface of the substrate 41 may be exposed.

Further, a lower insulation layer 48 may be formed on the third LED stack 43. The lower insulation layer 48 may cover the exposed upper surface of the substrate 41 and may cover upper and side surfaces of the first surface protection layer 46 and the third LED stack 43. Further, openings exposing the third n-electrode pad 47a and the lower p-electrode pad 47b may be formed in the lower insulation layer 48.

Figure 9A:
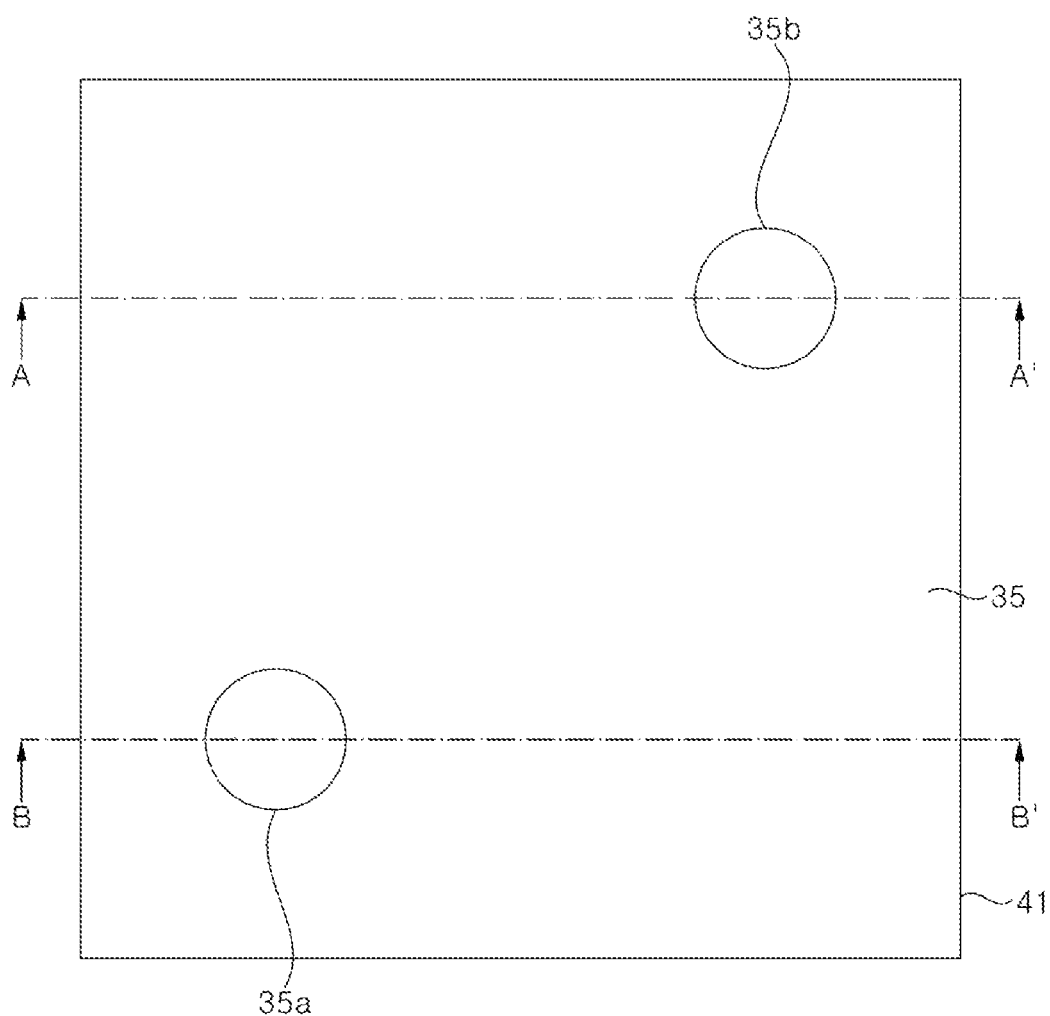
Figure 9B:
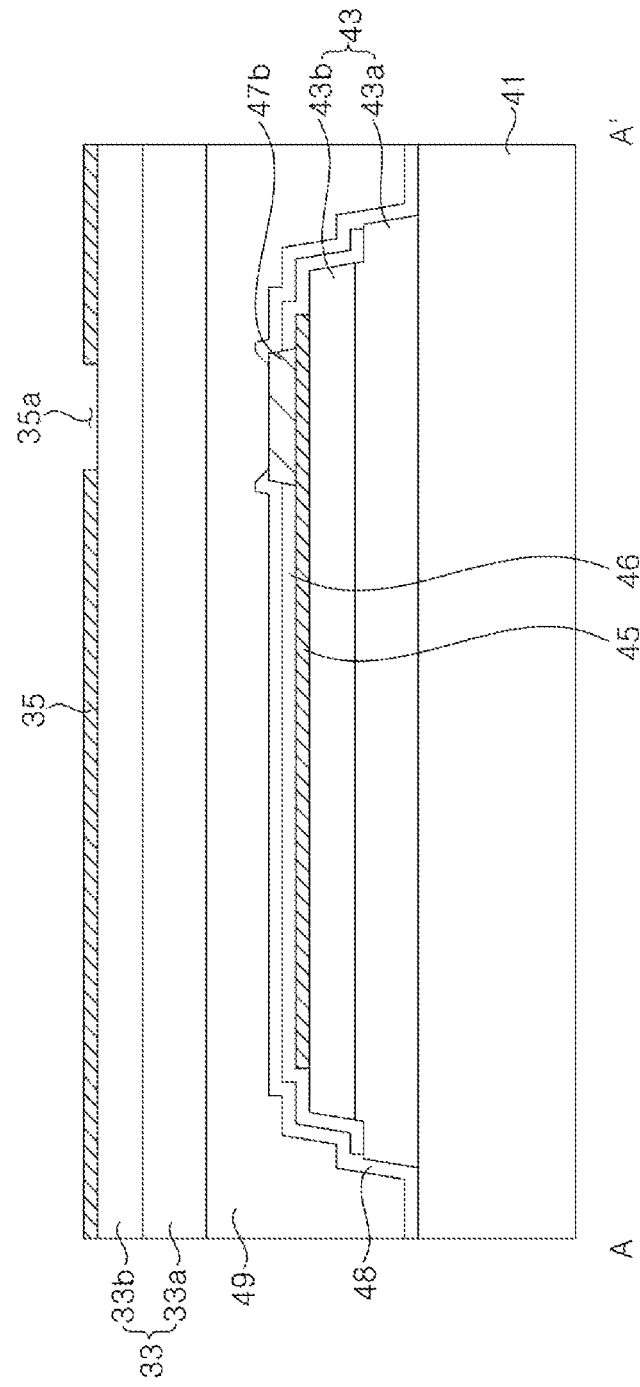
Figure 9C:
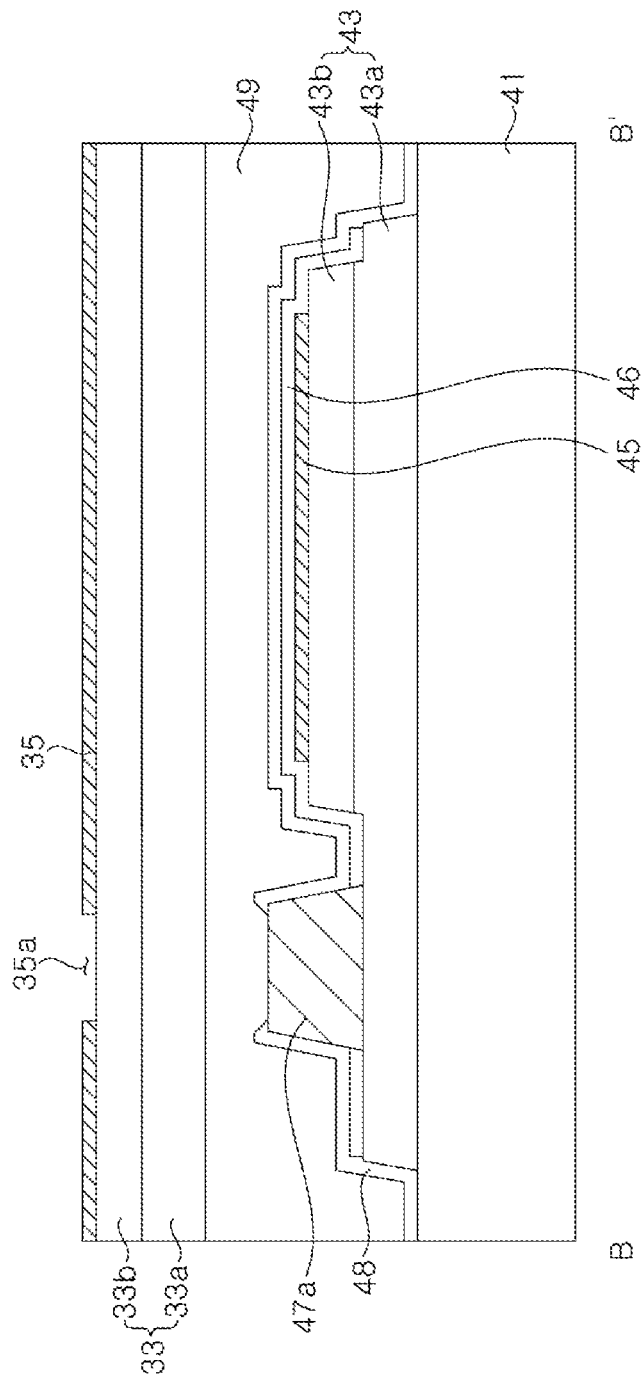

Referring to FIGS. 9A, 9B, and 9C, the second LED stack described with reference to FIG. 5B is bonded onto the third LED stack 43. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43 and bonded to the third LED stack 43. The second LED stack 33 and the third LED stack 43 are bonded to each other by a first bonding layer 49. After bonding the second LED stack 33 to the third LED stack 43, the temporary substrate may be removed using the laser lift off technique. Accordingly, the second LED stack 33 may be disposed on the third LED stack 43, in which the second transparent electrode 35 may form an upper surface.

Subsequently, openings 35a and 35b may be formed by patterning the second transparent electrode 35. The opening 35a is disposed over the third n-electrode pad 47a, and the opening 35b is disposed over the lower p-electrode pad 47b. By forming the openings 35a and 35b in advance, when the through holes 33h1 and 33h2 are formed in a subsequent process, the second transparent electrode 35 may be prevented from being exposed to the through holes.

Figure 10A:
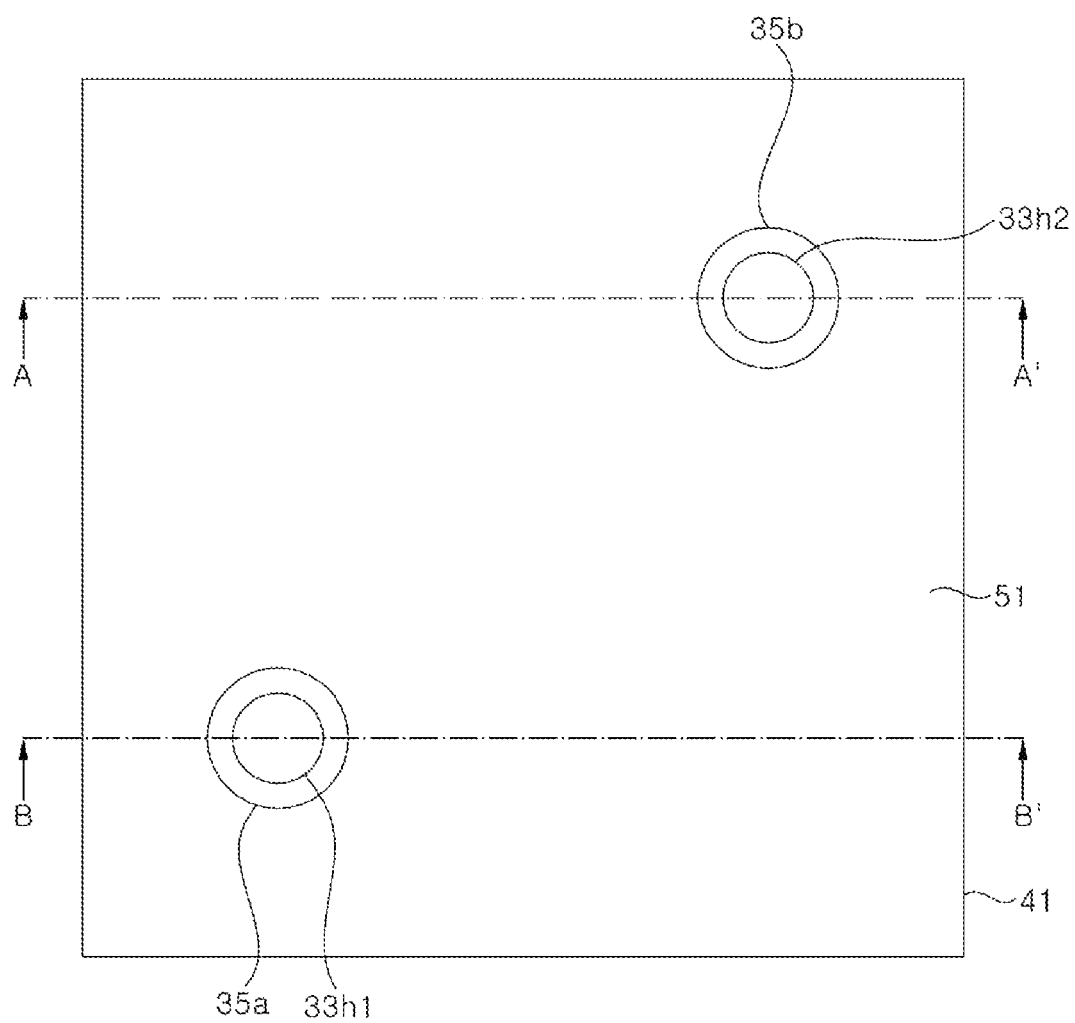
Figure 10B:
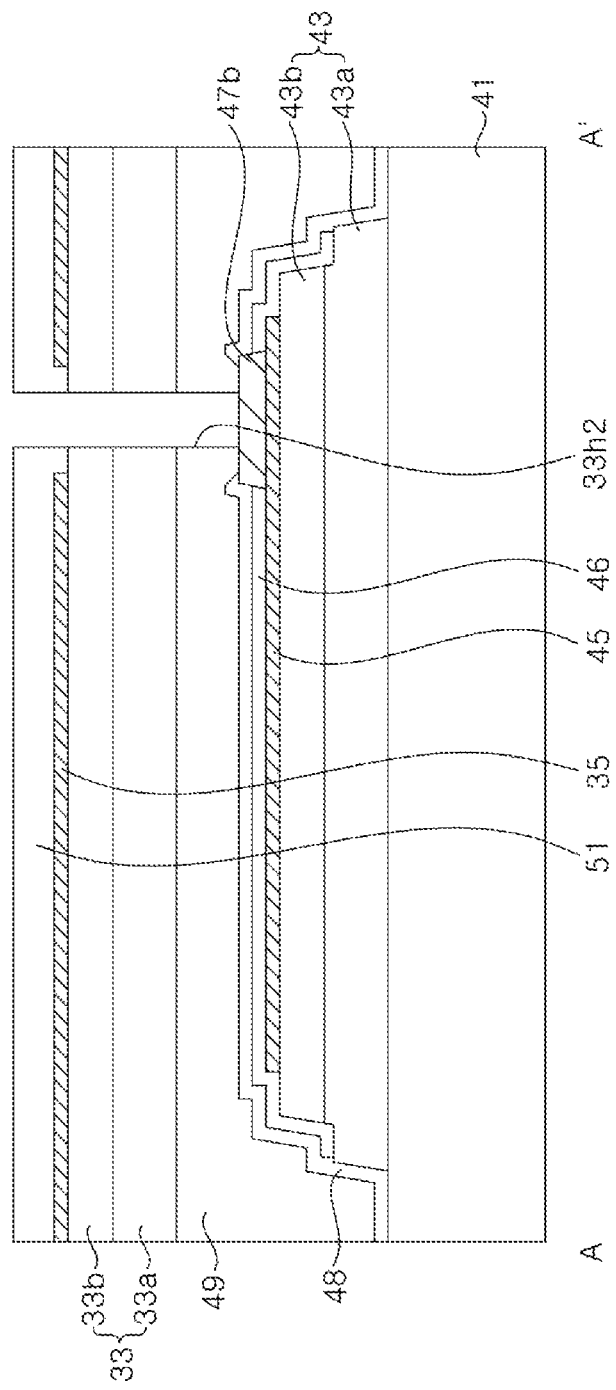
Figure 10C:
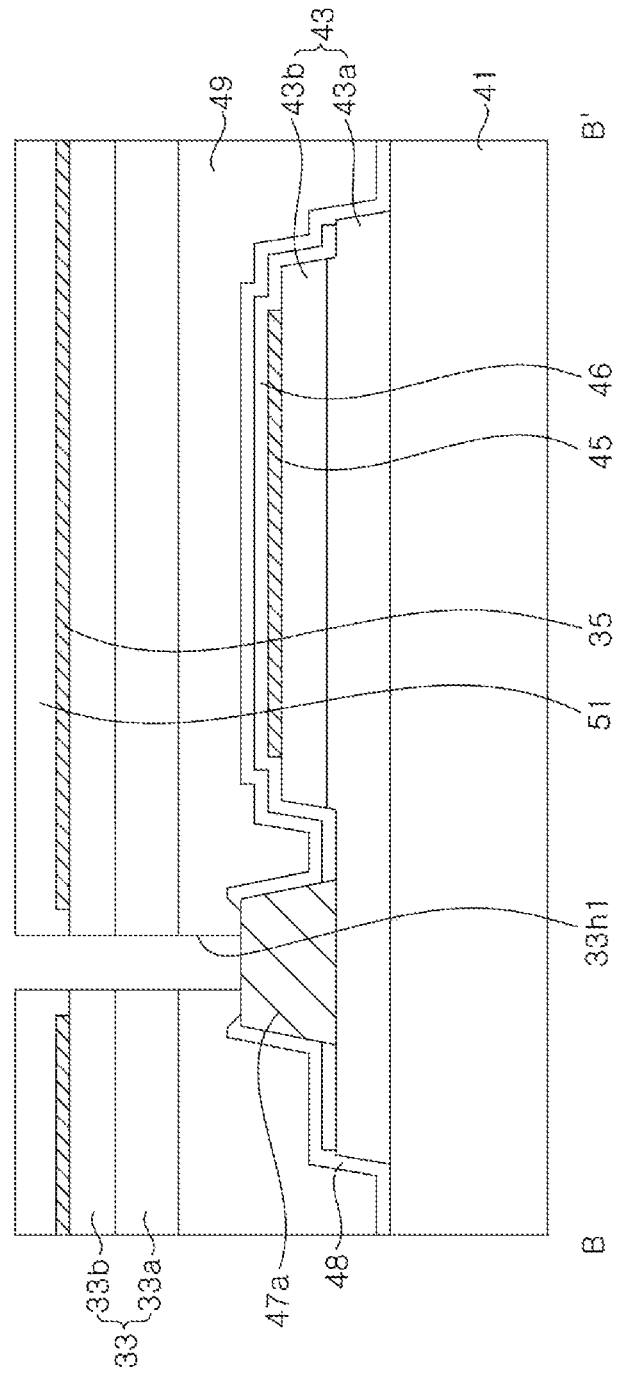

Referring to FIGS. 10A, 10B, and 10C, a first planarization layer 51 is formed on the second transparent electrode 35. The first planarization layer 51 may have a substantially flat upper surface, and may be formed as an insulation layer.

Subsequently, through holes 33h1 and 33h2 passing through the first planarization layer 51, the second LED stack 33, and the first bonding layer 49 are formed. The through holes 33h1 and 33h2 may be formed within the circumference of the openings 35a and 35b of the second transparent electrode 35, such that the second transparent electrode 35 is not exposed to sidewalls of the through holes 33h1 and 33h2. The through holes 33h1 and 33h2 expose the third n-electrode pad 47a and the lower p-electrode pad 47b, respectively.

Meanwhile, chemical treatment may be performed to remove surface defects formed on the inner walls of the through holes 33h1 and 33h2. For example, as described above, surface defects may be removed by chemical treatment using a chlorine-based solution or a basic solution, and thus, surface non-luminescent recombination may be reduced. In addition, the chemical treatment may include a surface etching process and a surface passivating process using a solution as described above.

Figure 11A:
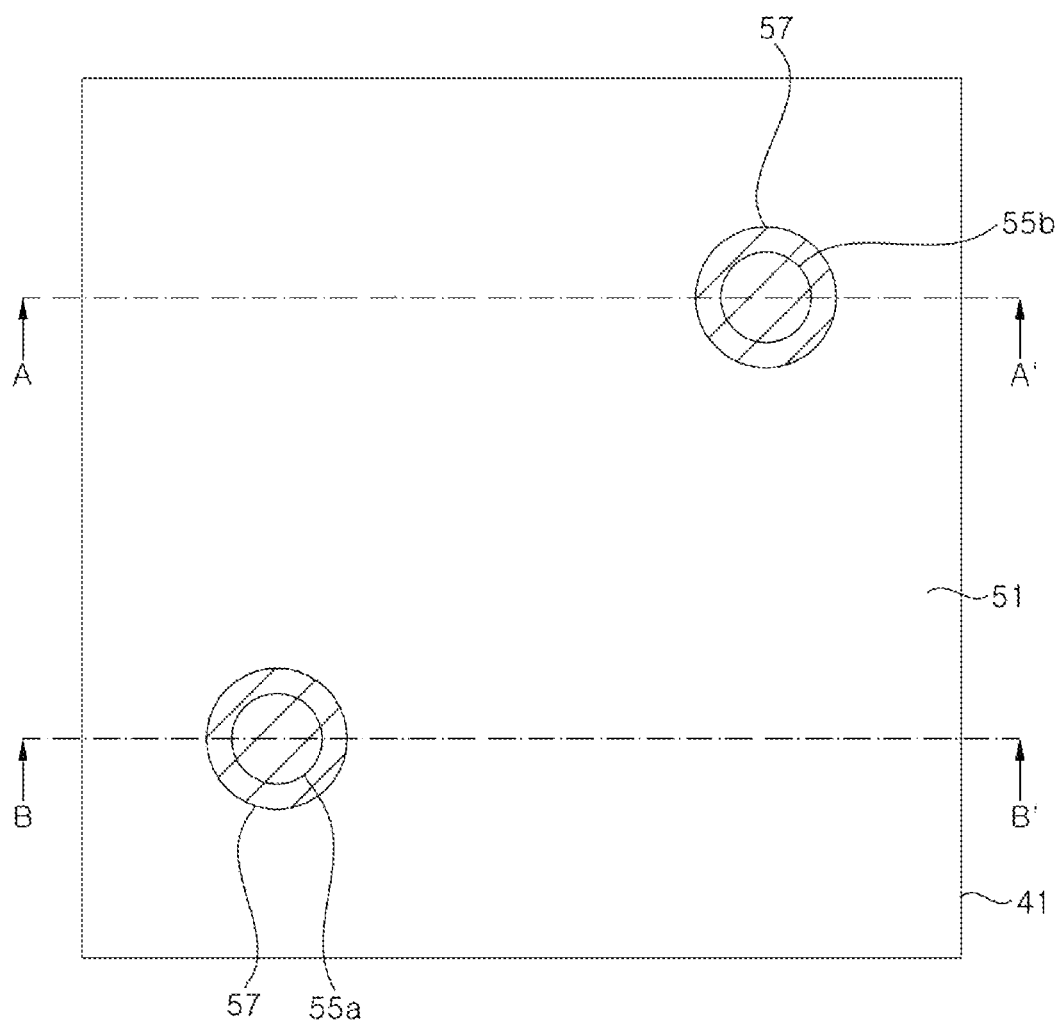
Figure 11B:
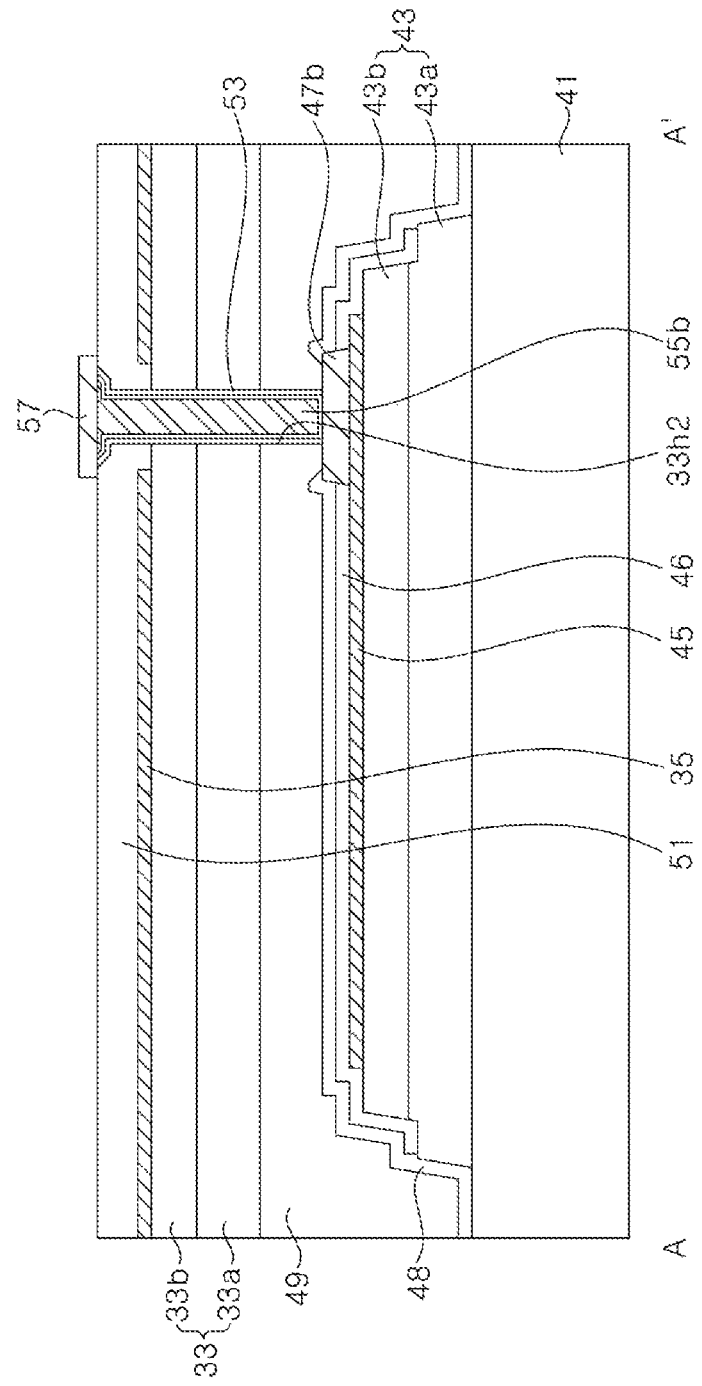
Figure 11C:
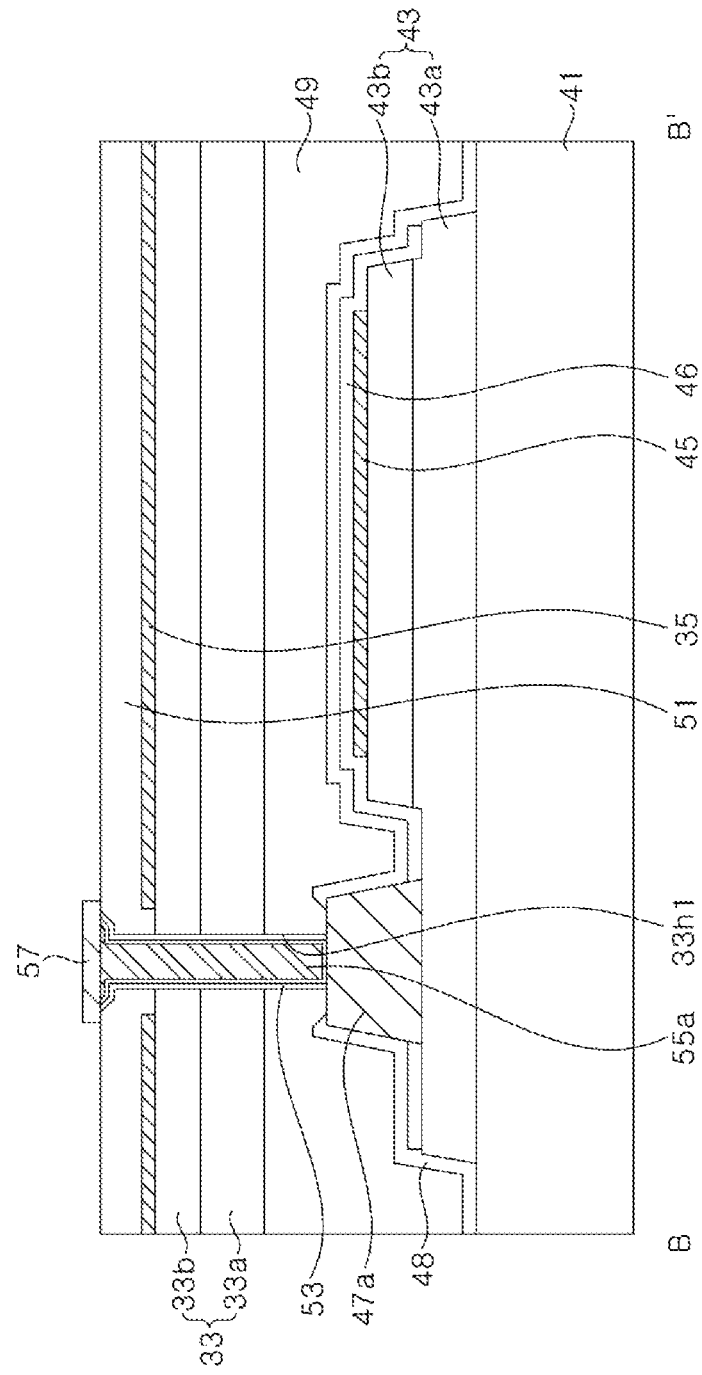

Referring to FIGS. 11A, 11B, and 11C, a first sidewall insulation layer 53 is formed. The first sidewall insulation layer 53 may be formed first to cover an upper portion of the first planarization layer 51 and sidewalls and bottom surfaces of the through holes 33h1 and 33h2. For example, the first sidewall insulation layer 53 may be formed of $Al_2O_3$, $HfO_2$, $SiN_x$, $SiO_2$, or the like using a chemical vapor deposition technique or an atomic layer deposition technique.

Subsequently, the first sidewall insulation layer 53 is blanket etched using a dry etching technique. As such, the first sidewall insulation layer 53 formed on the bottom of the through holes 33h1 and 33h2 is removed, and the third n-electrode pad 47a and the lower p-electrode pad 47b are exposed. The first sidewall insulation layer 53 formed on the first planarization layer 51 may be removed during blanket etching, and a portion of the first planarization layer 51 near inlets of the through holes 33h1 and 33h2 may also be removed. As such, the inlets of the through holes 33*h*1 and 33*h*2 may have a wider width than the bottom thereof.

Thereafter, lower buried vias 55*a* and 55*b* filling the through holes 33*h*1 and 33*h*2 may be formed using a seed layer and a plating layer. The seed layer and the plating layer formed on the first planarization layer 51 may be removed using a chemical mechanical polishing technique.

The capping layers 57 covering the lower buried vias 55*a* and 55*b* may be formed. After the capping layers 57 are formed, metal materials remaining on the first planarization layer 51 may be removed. The capping layers 57 may cover the lower buried vias 55*a* and 55*b* for protection. For example, the lower buried vias 55*a* and 55*b* may be formed using copper plating, and the capping layer 57 including a metallic material other than copper may remove copper remaining on the first planarization layer 51.

Figure 12A:
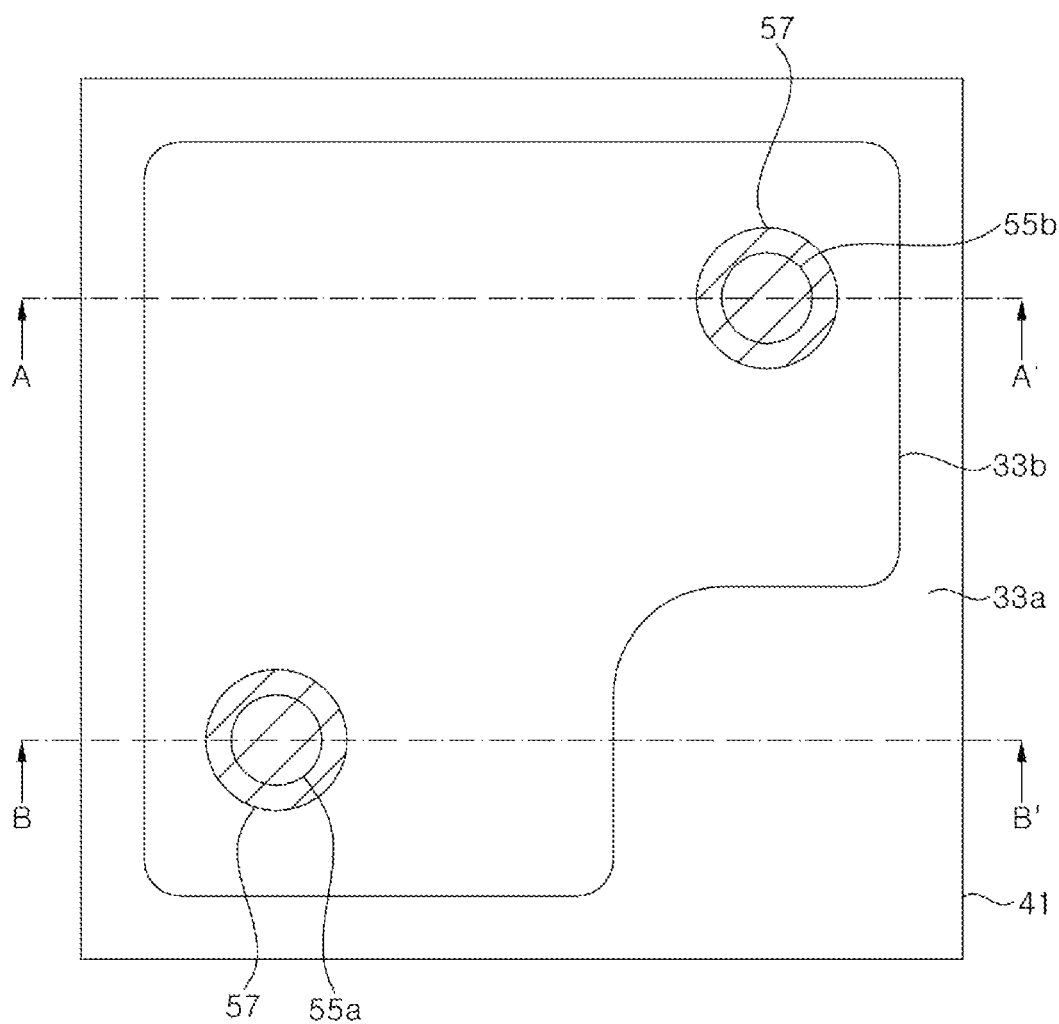
Figure 12B:
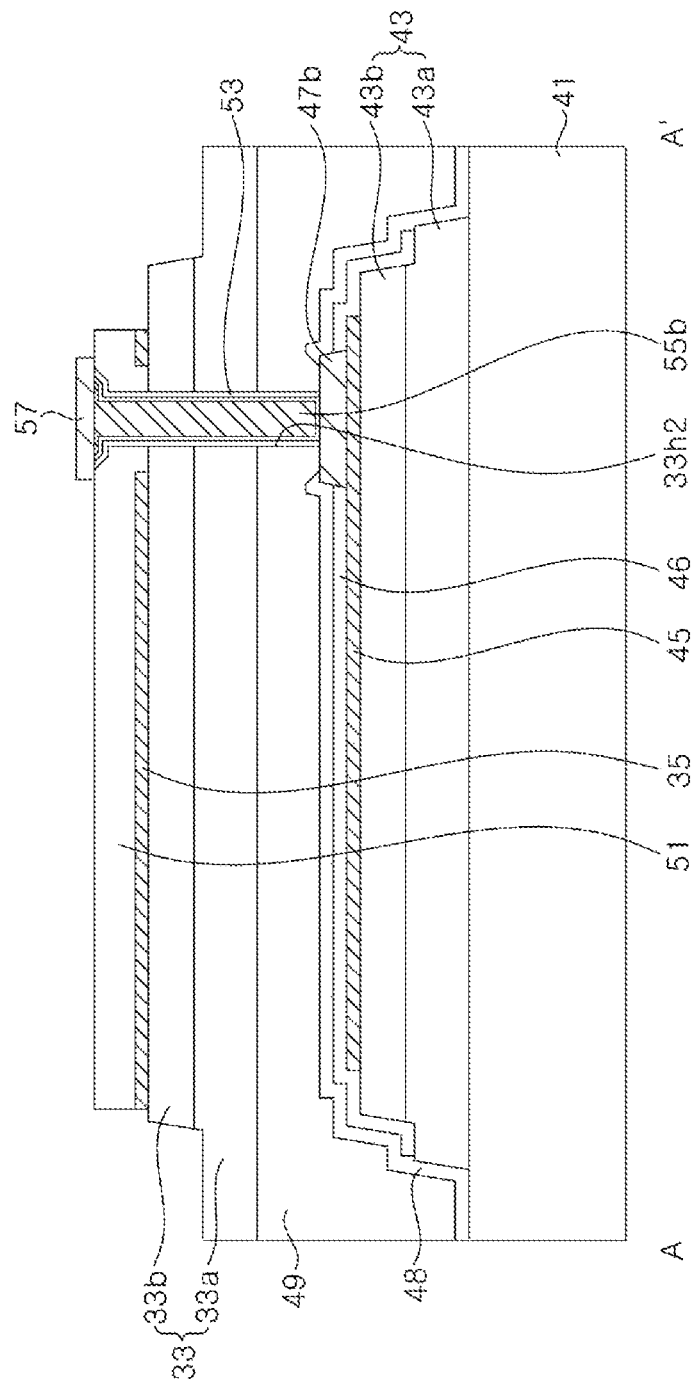
Figure 12C:
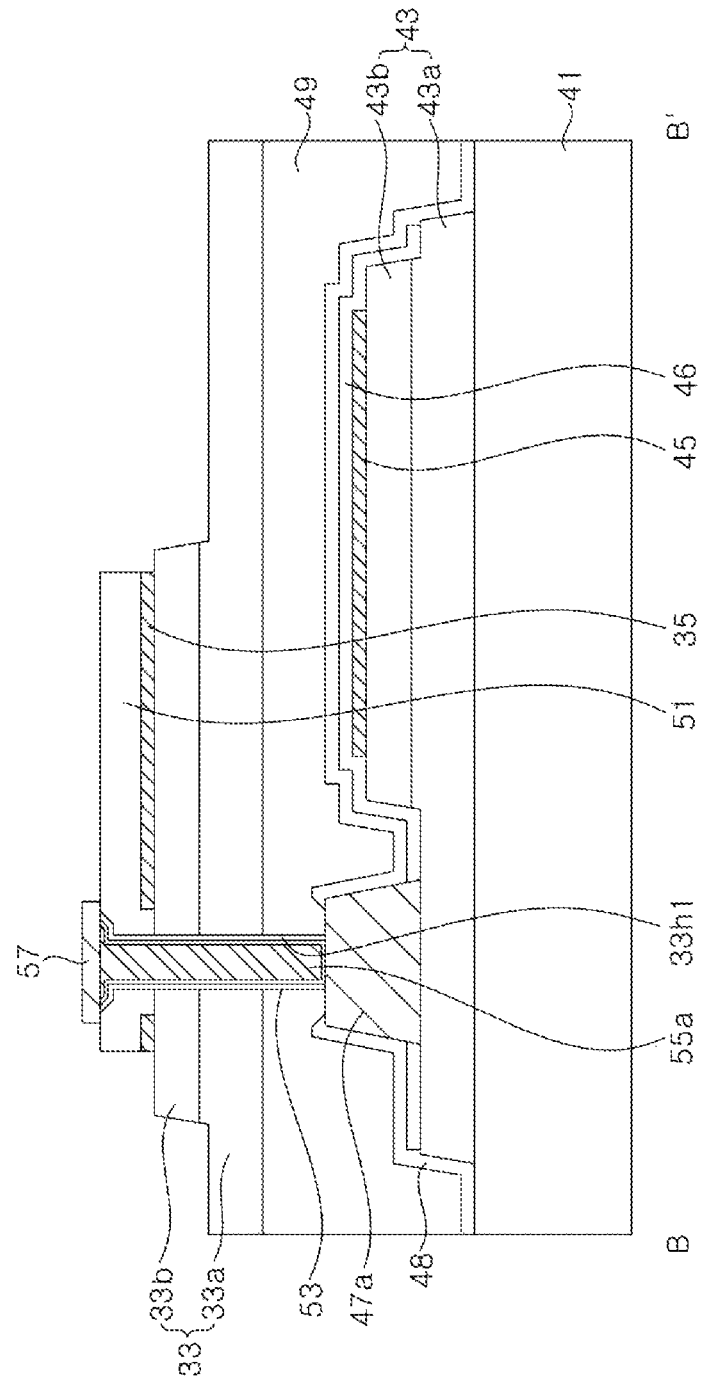

Referring to FIGS. 12A, 12B, and 12C, the first planarization layer 51 is patterned to expose the second conductivity type semiconductor layer 33*b*. Thereafter the second transparent electrode 35 and the second conductivity type semiconductor layer 33*b* are partially removed through mesa etching to expose the first conductivity type semiconductor layer 33*a*. The second transparent electrode 35 and the second conductivity type semiconductor layer 33*b* may be patterned by using photolithography and etching techniques. This process may be performed using the wet etching and the dry etching techniques in substantially the same manner as the mesa etching process, during which the third transparent electrode 45 and the second conductivity type semiconductor layer 43*b* are etched as described above. For example, after the etching mask is formed, the second transparent electrode 35 may be etched first by the wet etching technique, and then the second conductivity type semiconductor layer 33*b* may be etched by the dry etching technique using the same etching mask. Accordingly, the second transparent electrode 35 may be recessed from the mesa etching region. FIG. 12A exemplarily shows an edge of the mesa, and does not show an edge of the second transparent electrode 35 to simplify illustration. However, since the second transparent electrode 35 is wet etched using the same etching mask, the edge of the second transparent electrode 35 may also be recessed from the edge of the mesa toward an inner side of the mesa. In this manner, since the same etching mask is used, the number of photolithography processes may not be increased, thereby reducing the process costs. However, the inventive concepts are not limited thereto, and in some exemplary embodiments, the etching mask for etching the mesa etching process and the etching mask for etching the second transparent electrode 35 may be different from each other. Furthermore, the second transparent electrode 35 may be patterned together with the first planarization layer 51 in other exemplary embodiments.

The mesa etching region of the second LED stack 33 may be partially overlapped with that of the third LED stack 43, but the mesa etching regions of the second LED stack 33 and the third LED stack 43 are generally separated from each other. In particular, a portion of the mesa etching region of the second LED stack 33 may be spaced apart from the third n-electrode pad 47*a* and the lower p-electrode pad 47*b* in the lateral direction.

Thereafter, chemical treatment is performed to remove surface defects formed on the side surface of the mesa from the mesa etching process. Since the chemical treatment to the second LED stack 33 is similar to that performed on the third LED stack 43, repeated descriptions thereof will be omitted to avoid redundancy.

Figure 13A:
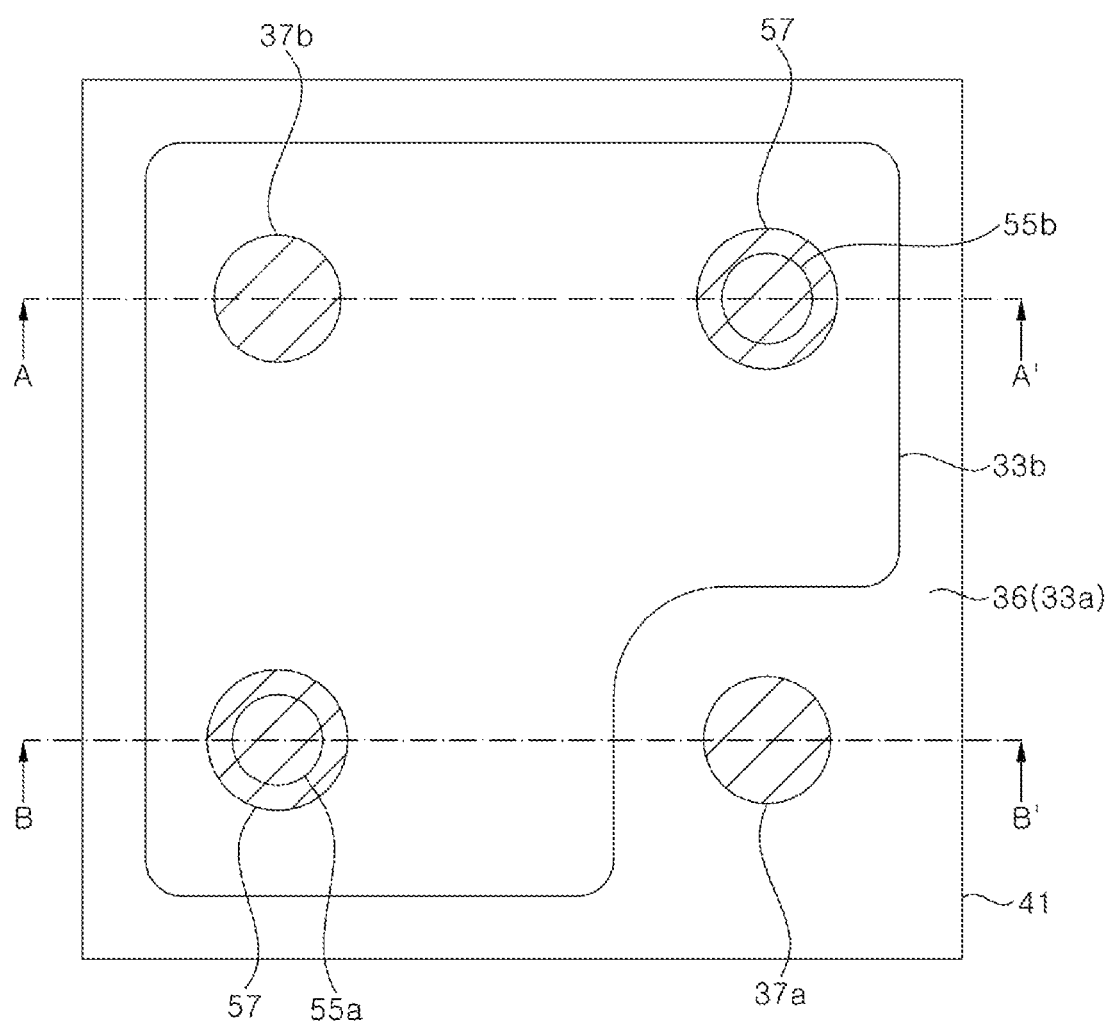
Figure 13B:
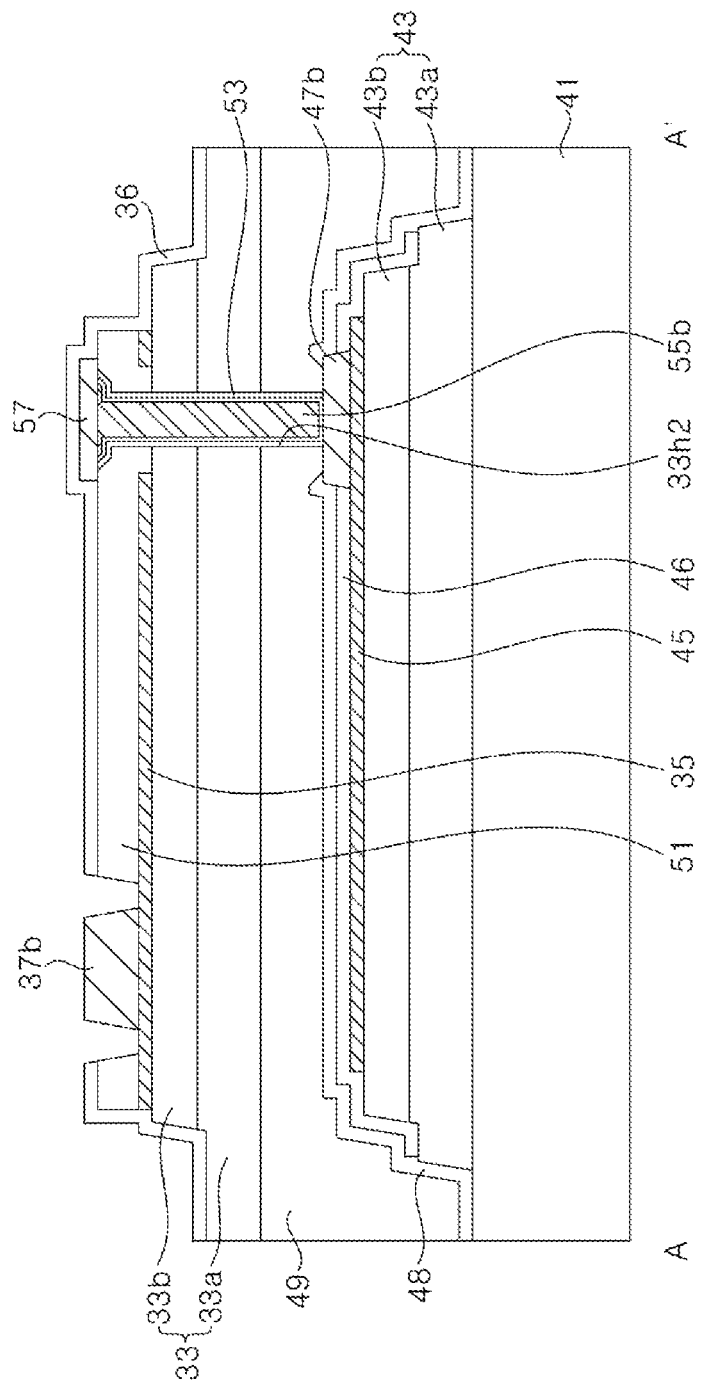
Figure 13C:
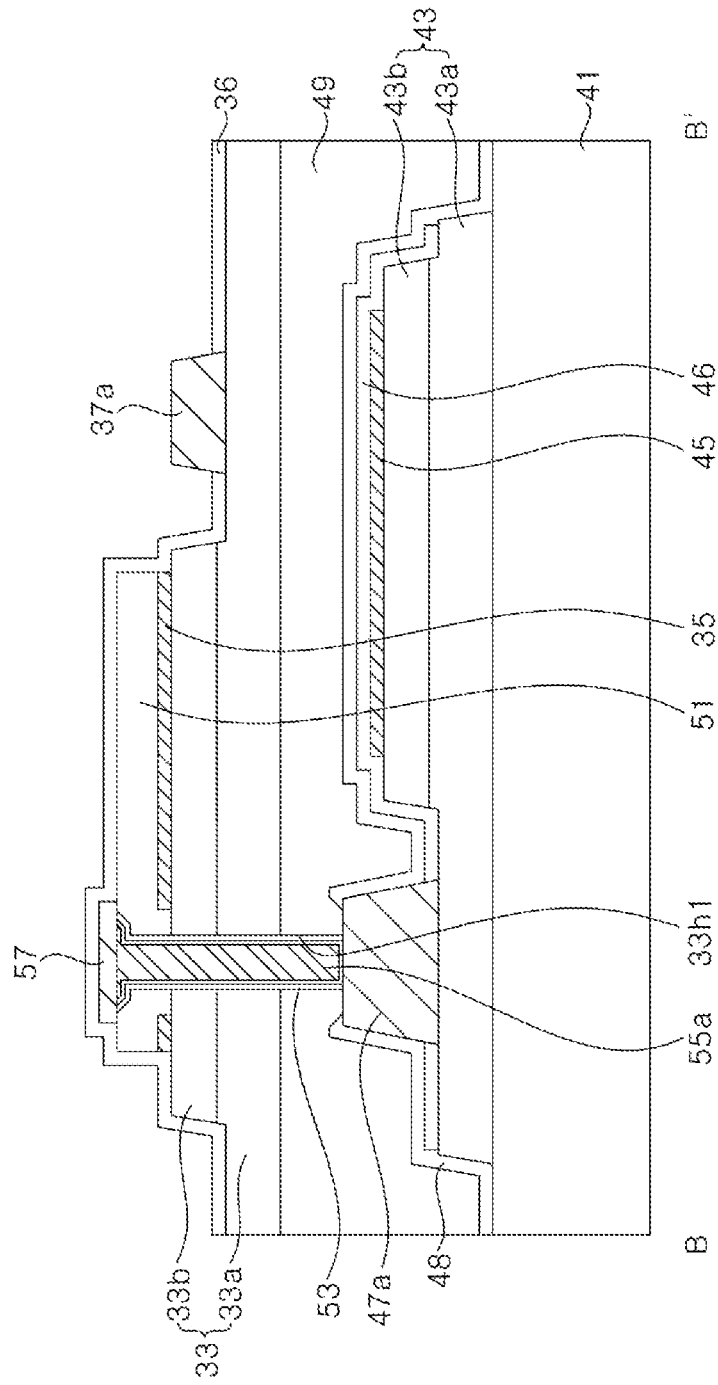

Referring to FIGS. 13A, 13B, and 13C, a second surface protection layer 36 covering a side surface of the mesa of the second LED stack 33 is formed. The second surface protection layer 36 covers the side surface of the mesa to prevent non-radiative recombination. Furthermore, the second surface protection layer 36 may cover the first conductivity type semiconductor layer 33*a* and the first planarization layer 51. The second surface protection layer 36 may be formed of, for example, $Al_2O_3$, $HfO_2$, $SiN_x$, $SiO_2$, or the like using an atomic layer deposition technique, a low pressure chemical vapor deposition technique, or a plasma enhanced chemical vapor deposition technique.

Thereafter, the second surface protection layer 36 and the first planarization layer 51 may be patterned to form an opening exposing the second transparent electrode 35 and an opening exposing the first conductivity type semiconductor layer 33*a*. The second n-electrode pad 37*a* and the upper p-electrode pad 37*b* may be formed on the first conductivity type semiconductor layer 33*a* and the second transparent electrode 35 exposed in the openings, respectively.

Figure 14A:
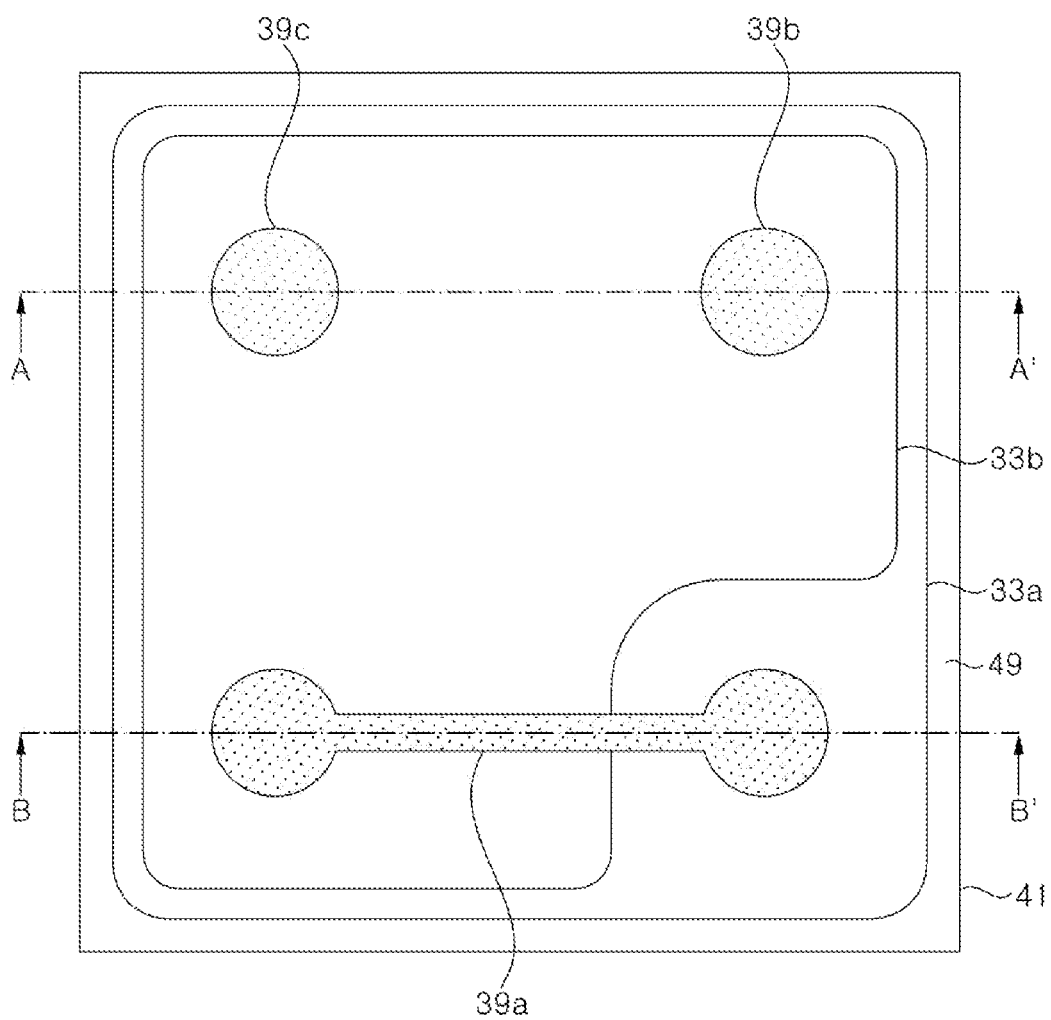
Figure 14B:
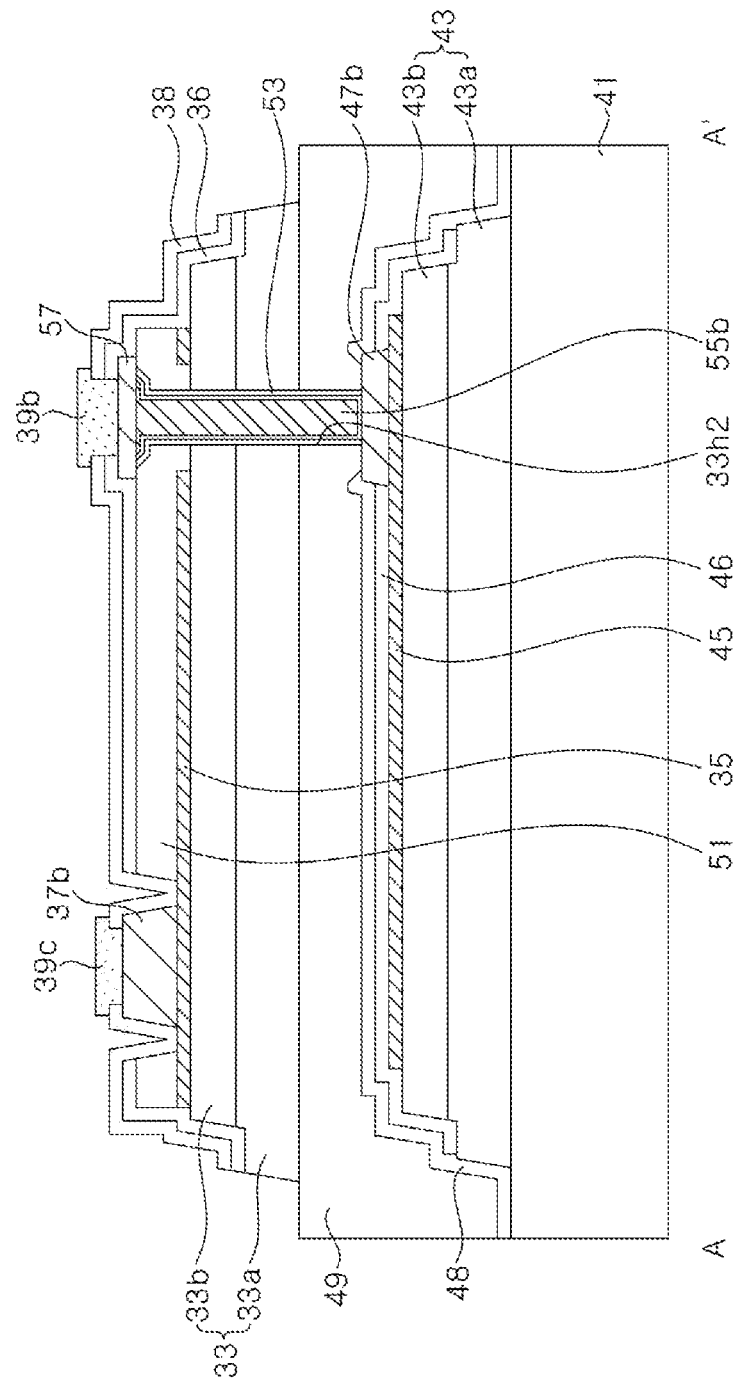
Figure 14C:
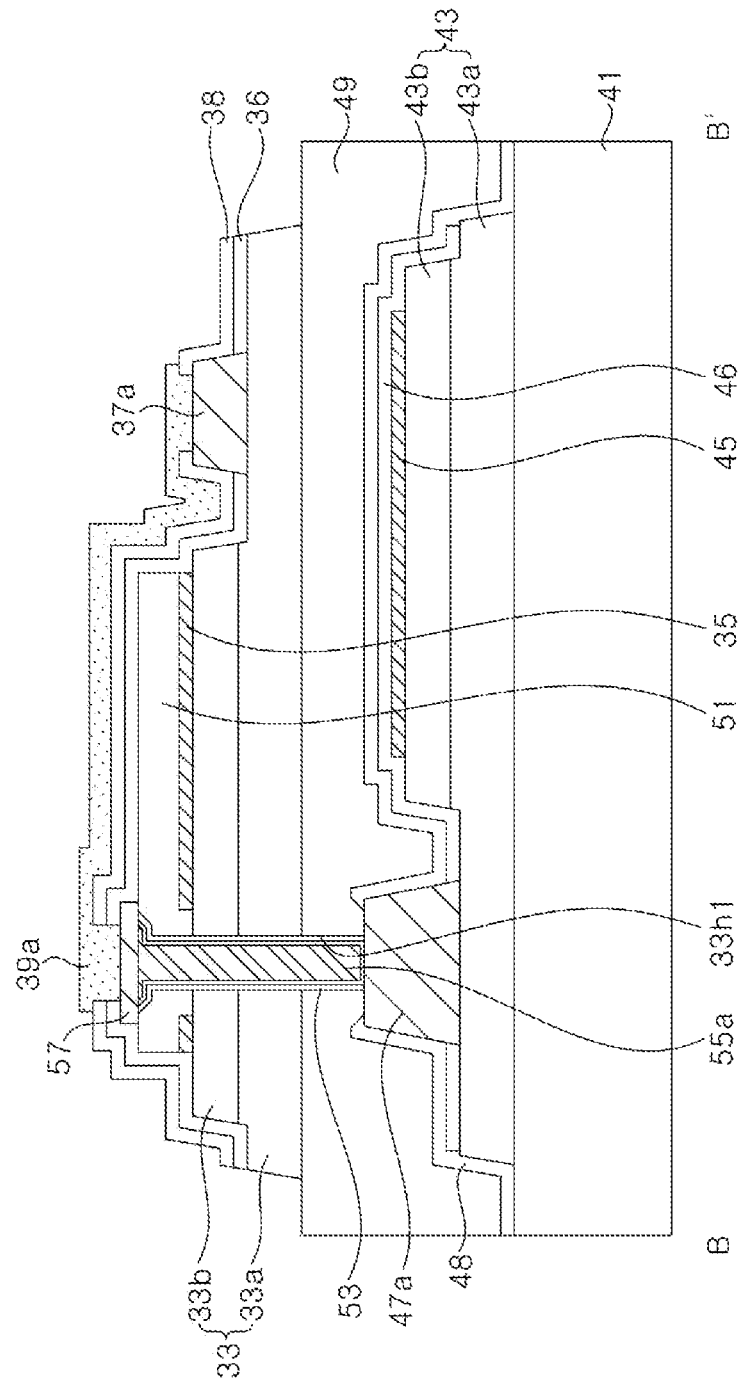

Referring to FIGS. 14A, 14B, and 14C, an intermediate insulation layer 38 may be formed on the second LED stack 33. The intermediate insulation layer 38 may cover the second surface protection layer 36 and also cover the second n-electrode pad 37*a* and the upper p-electrode pad 37*b*. The intermediate insulation layer 38 may be patterned to have openings exposing the second n-electrode pad 37*a* and the upper p-electrode pad 37*b*. Further, the intermediate insulation layer 38 and the second surface protection layer 36 may be patterned to have openings exposing the capping layers 57.

First, second, and third lower connectors 39*a*, 39*b*, and 39*c* are formed on the intermediate insulation layer 38. The first lower connector 39*a* may be electrically connected to the lower buried via 55*a* and also extend in the lateral direction to be electrically connected to the second n-electrode pad 37*a*. The first lower connector 39*a* may be insulated from the second transparent electrode 35 and the second conductivity type semiconductor layer 33*b* by the intermediate insulation layer 38 and the second surface protection layer 36.

The second lower connector 39*b* is electrically connected to the lower buried via 55*b*, and the third lower connector 39*c* is electrically connected to the upper p-electrode pad 37*b*.

Thereafter, an isolation region for defining a light emitting device region may be formed. For example, the intermediate insulation layer 38, the second surface protection layer 36, and the first conductivity type semiconductor layer 33*a* may be removed along the isolation region, and an upper surface of the first bonding layer 49 may be exposed. In some exemplary embodiments, an insulation layer covering a side surface of the first conductivity type semiconductor layer 33*a* and the intermediate insulation layer 38 may be added. This insulation layer may be formed to have openings exposing the lower connectors 39*a*, 39*b*, and 39*c*.

Figure 15A:
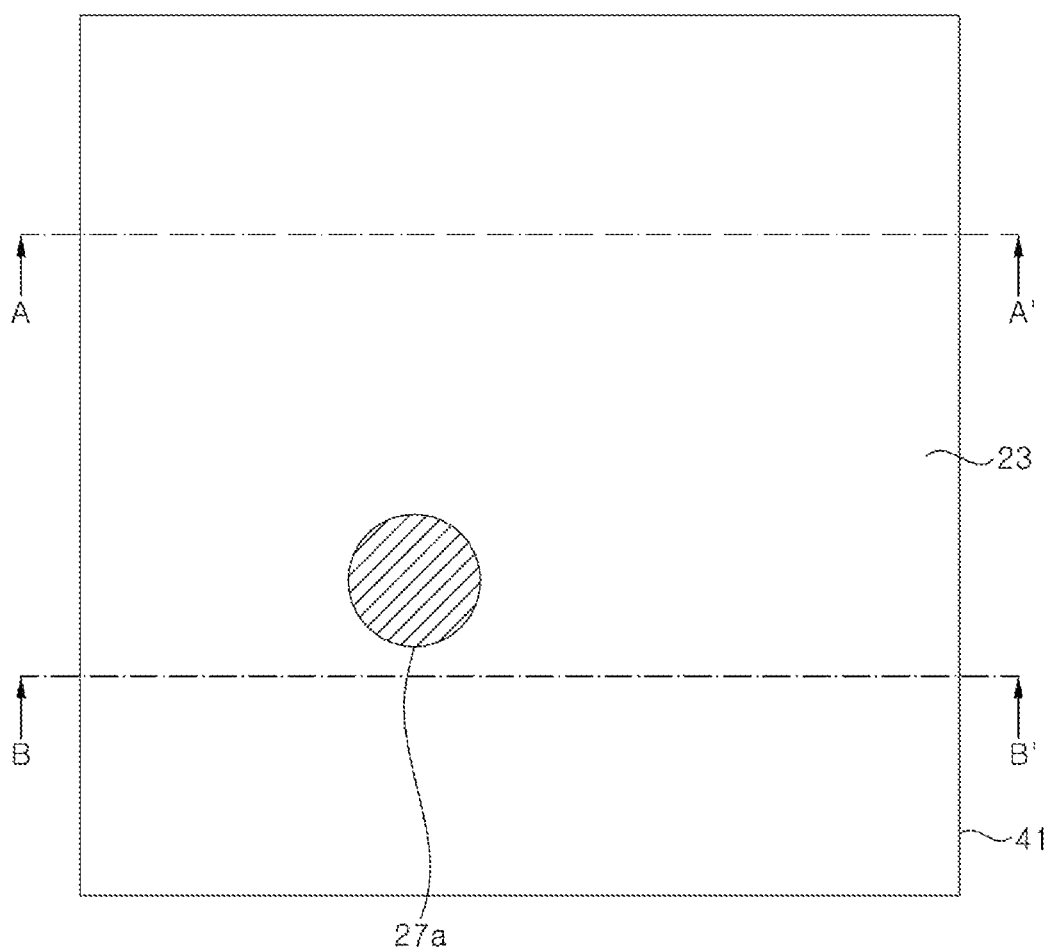
Figure 15B:
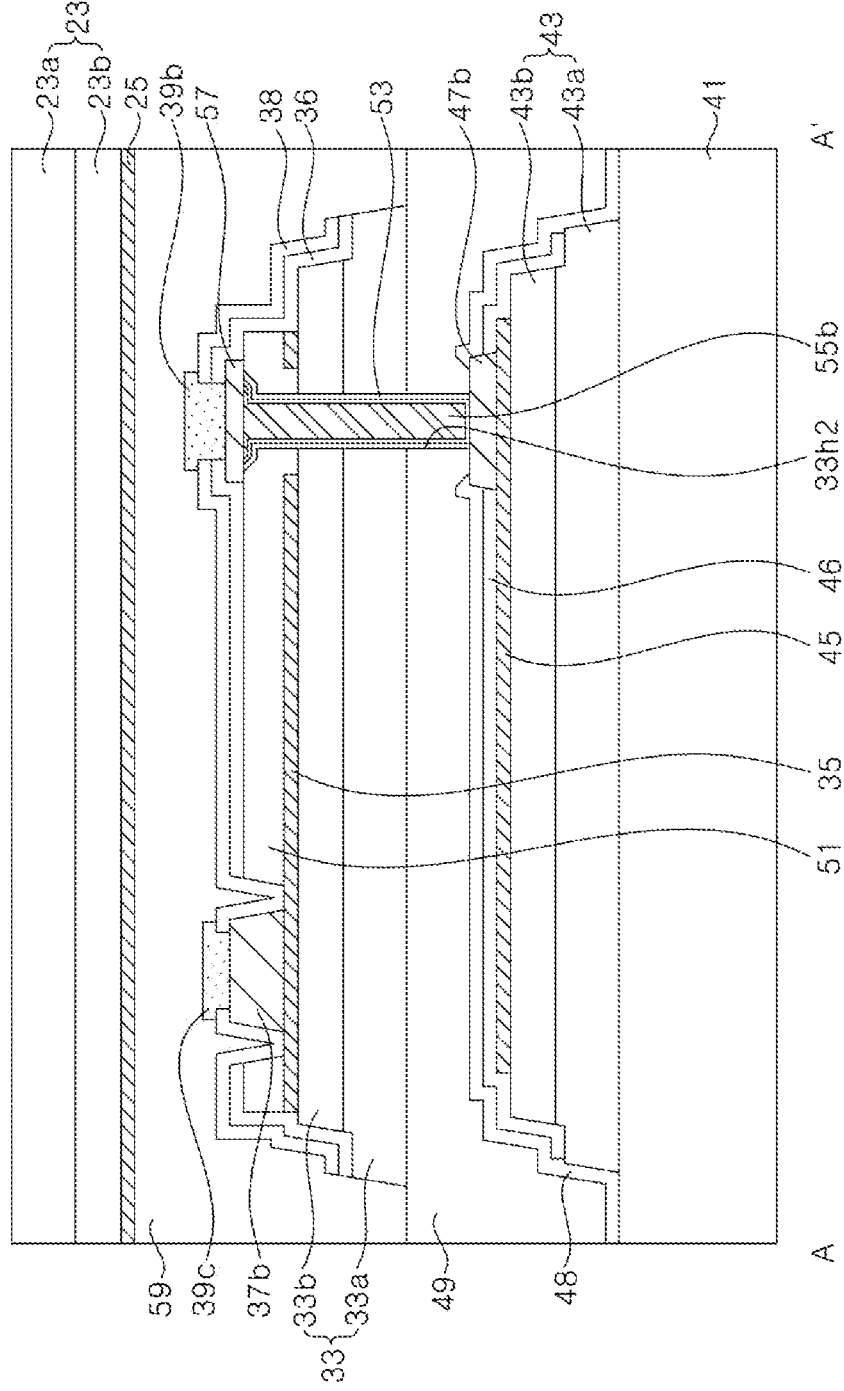
Figure 15C:
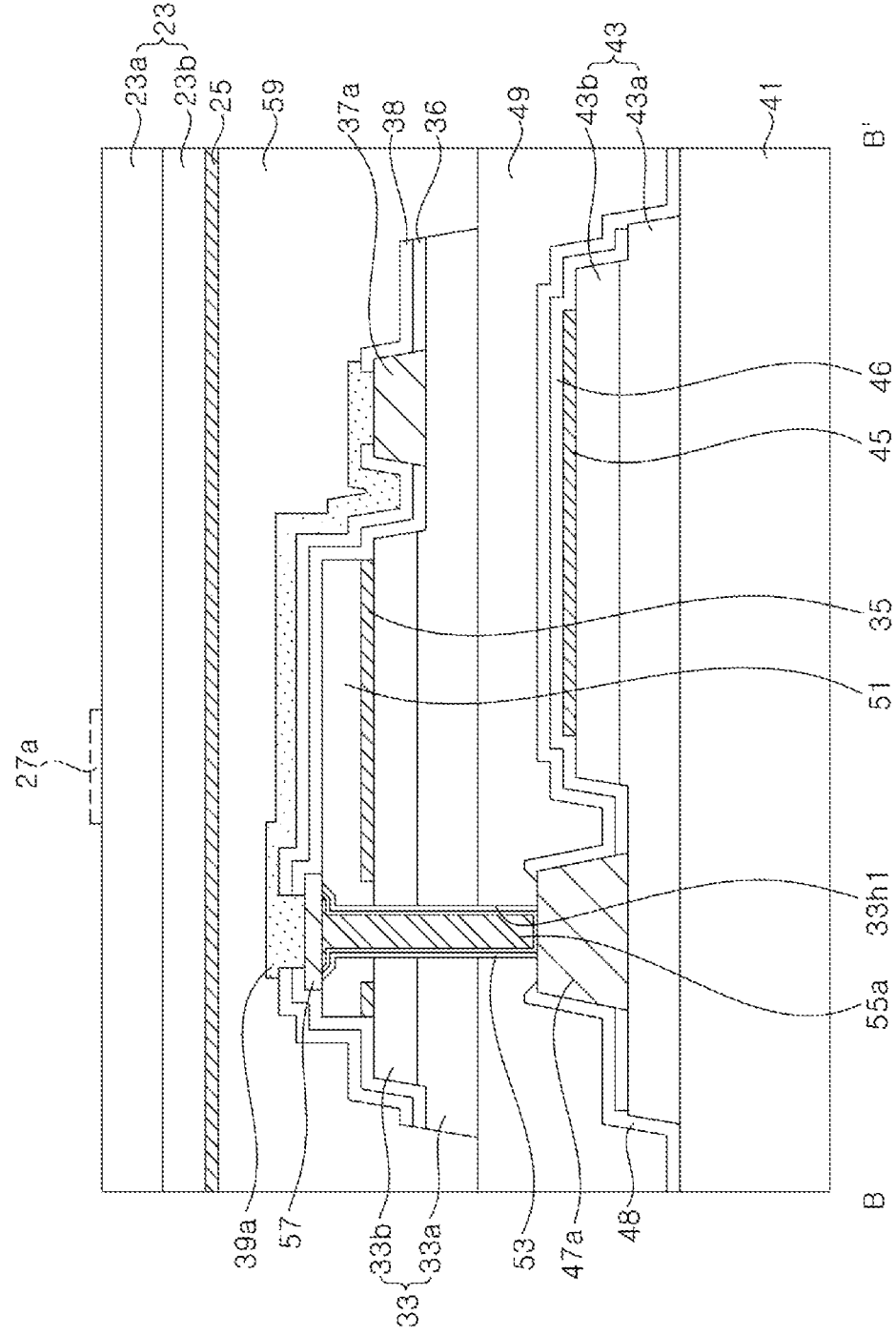

Referring to FIGS. 15A, 15B and 15C, the first LED stack 23 described with FIG. 5A is bonded to the second LED stack 33. The first LED stack 23 and the second LED stack 33 may be bonded using a second bonding layer 59, so that the first transparent electrode 25 faces the second LED stack 33. Accordingly, the second bonding layer 59 is in contact with the first transparent electrode 25, and also is in contact with the intermediate insulation layer 38 and the lower connectors 39*a*, 39*b*, and 39*c*.

The first substrate 21 shown in FIG. 5A is removed from the first LED stack 23. The first substrate 21 may be removed using, for example, an etching technique. After the first substrate 21 is removed, a first n-electrode pad 27a may be formed on a portion of the first conductivity type semiconductor layer 23a. The first n-electrode pad 27a may be formed to be in ohmic contact with the first conductivity type semiconductor layer 23a.

Figure 16A:
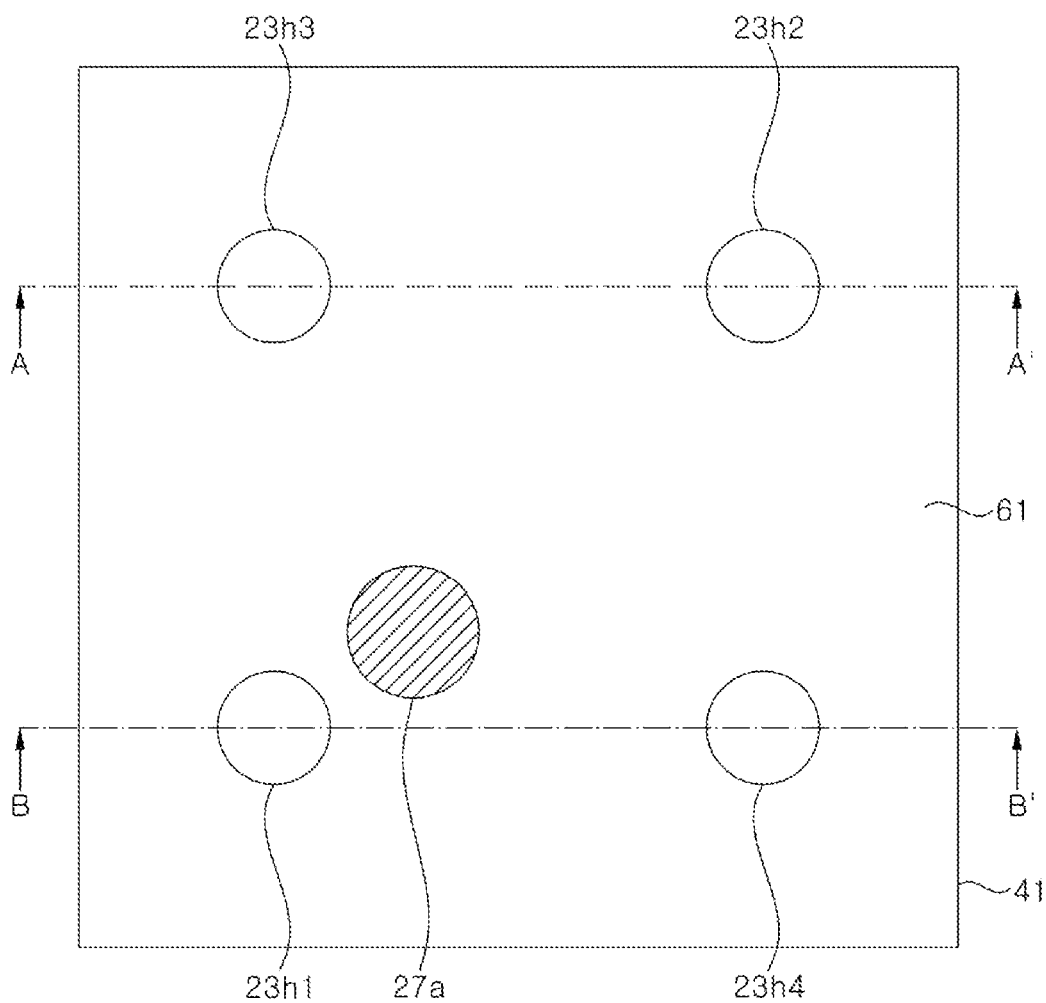
Figure 16B:
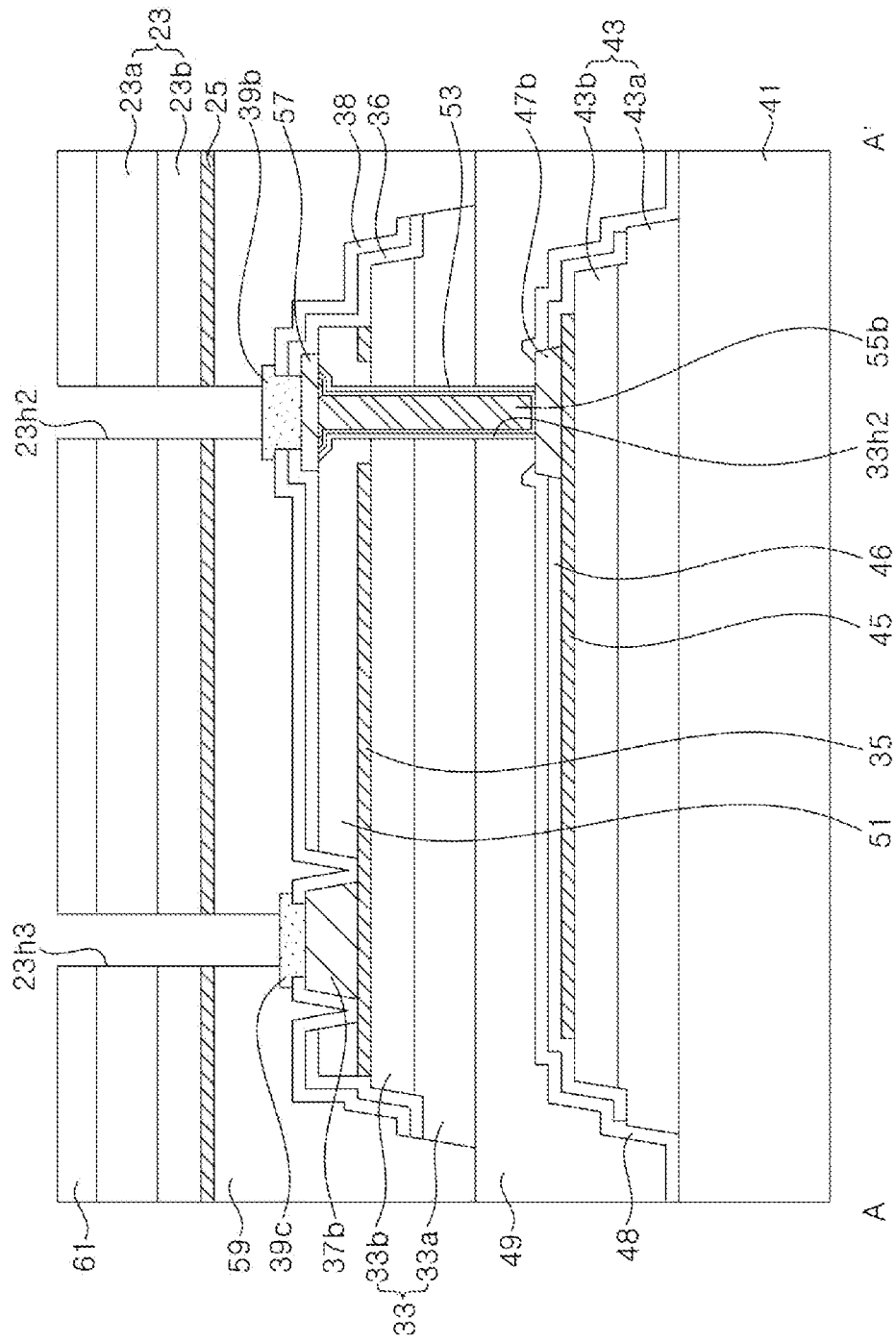
Figure 16C:
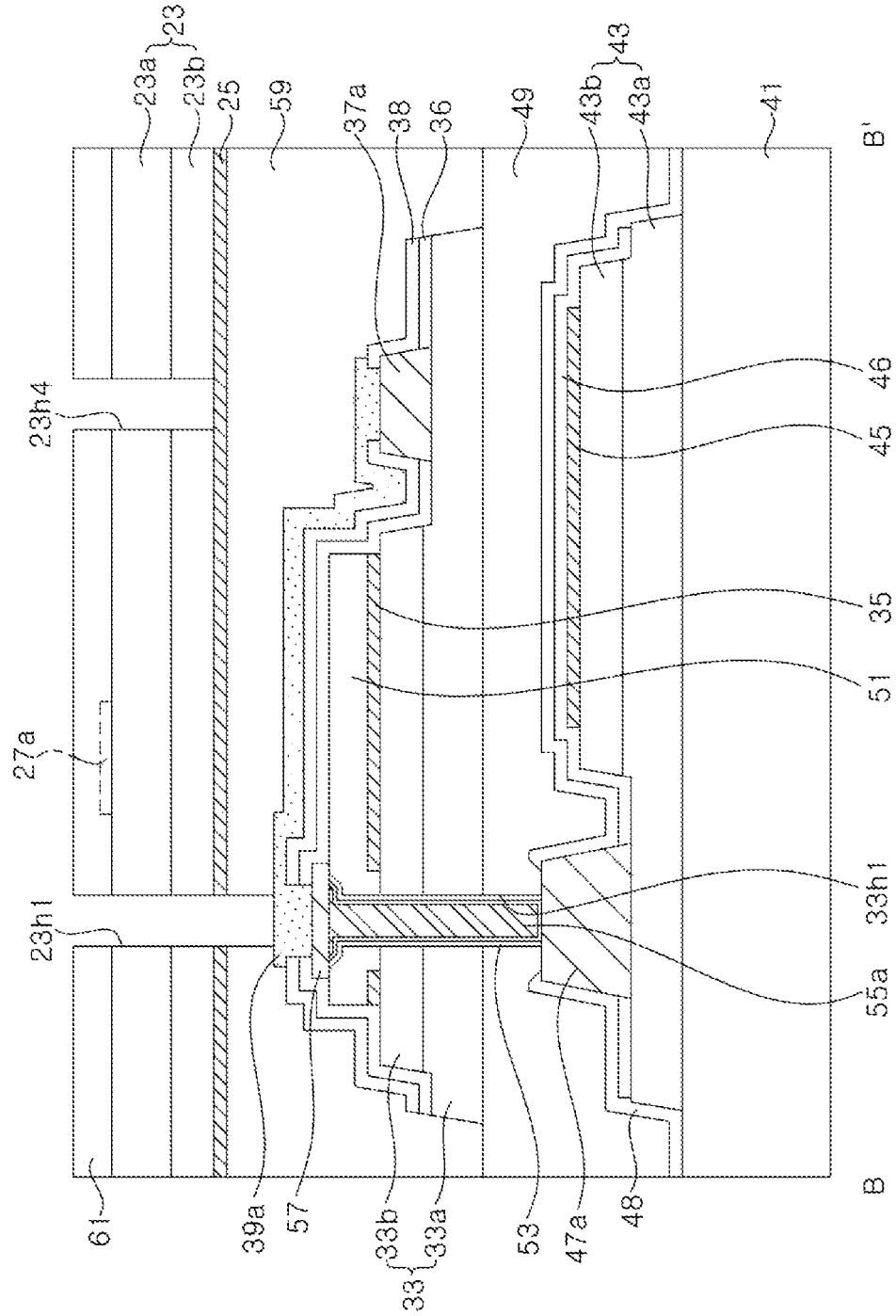

Referring to FIGS. 16A, 16B, and 16C, a second planarization layer 61 covering the first LED stack 23 and the first n-electrode pad 27a is formed. The second planarization layer 61 is formed to have a substantially flat upper surface.

Subsequently, through holes 23h1, 23h2, 23h3, and 23h4 passing through the second planarization layer 61 and the first LED stack 23 are formed. The through holes 23h1, 23h2, and 23h3 may pass through the first transparent electrode 25 and the second bonding layer 59 to expose the lower connectors 39a, 39b, and 39c, respectively. The through hole 23h4 may expose the first transparent electrode 25.

The through holes 23h1, 23h2, and 23h3 may be formed together through the same process, and the through hole 23h4 may be formed through a process different from that of forming the through holes 23h1, 23h2, and 23h3.

After the through holes 23h1, 23h2, 23h3, and 23h4 are formed, chemical treatment may be performed to remove surface defects formed on inner walls of the through holes. The surface of the first LED stack 23 may be treated using, for example, a diluted HF solution or a diluted HCl solution. The chemical treatment may include a surface etching process and a surface passivating process using a solution as described above.

Figure 17A:
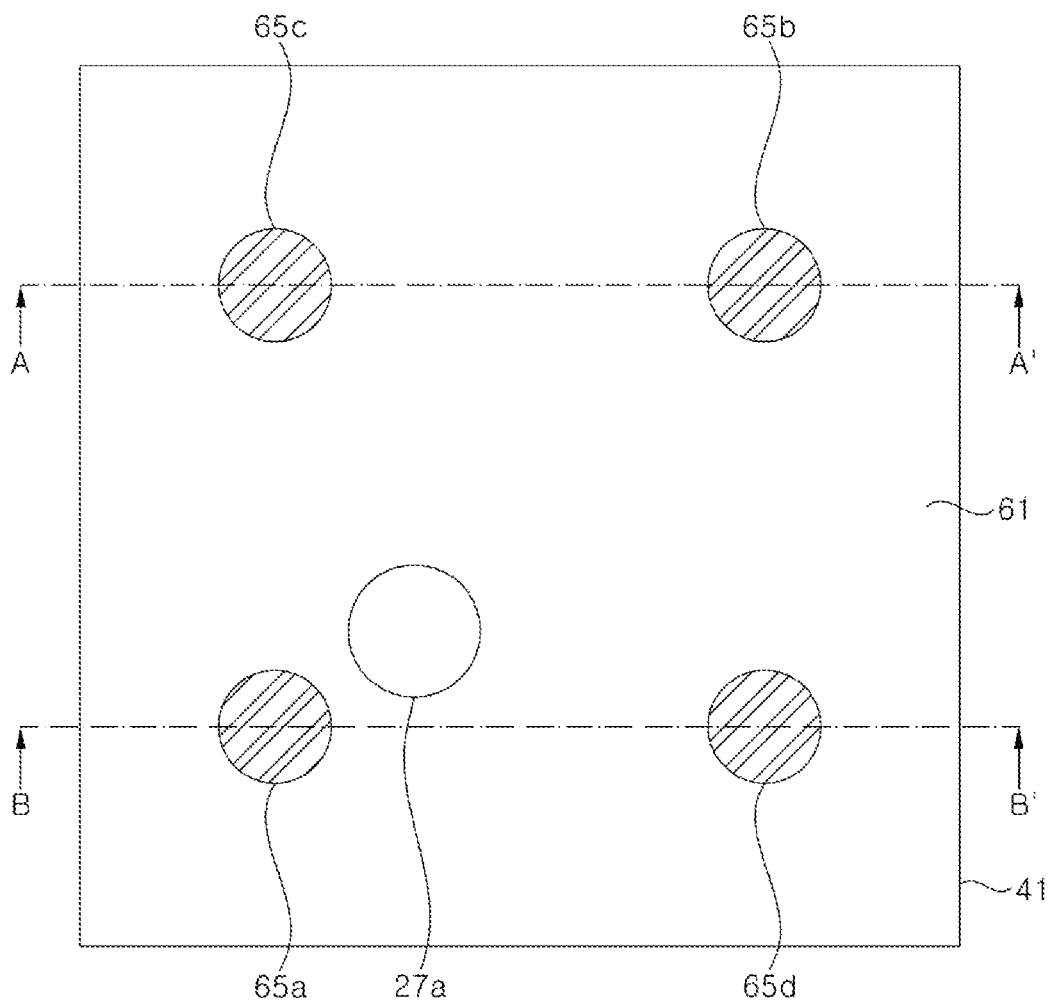
Figure 17B:
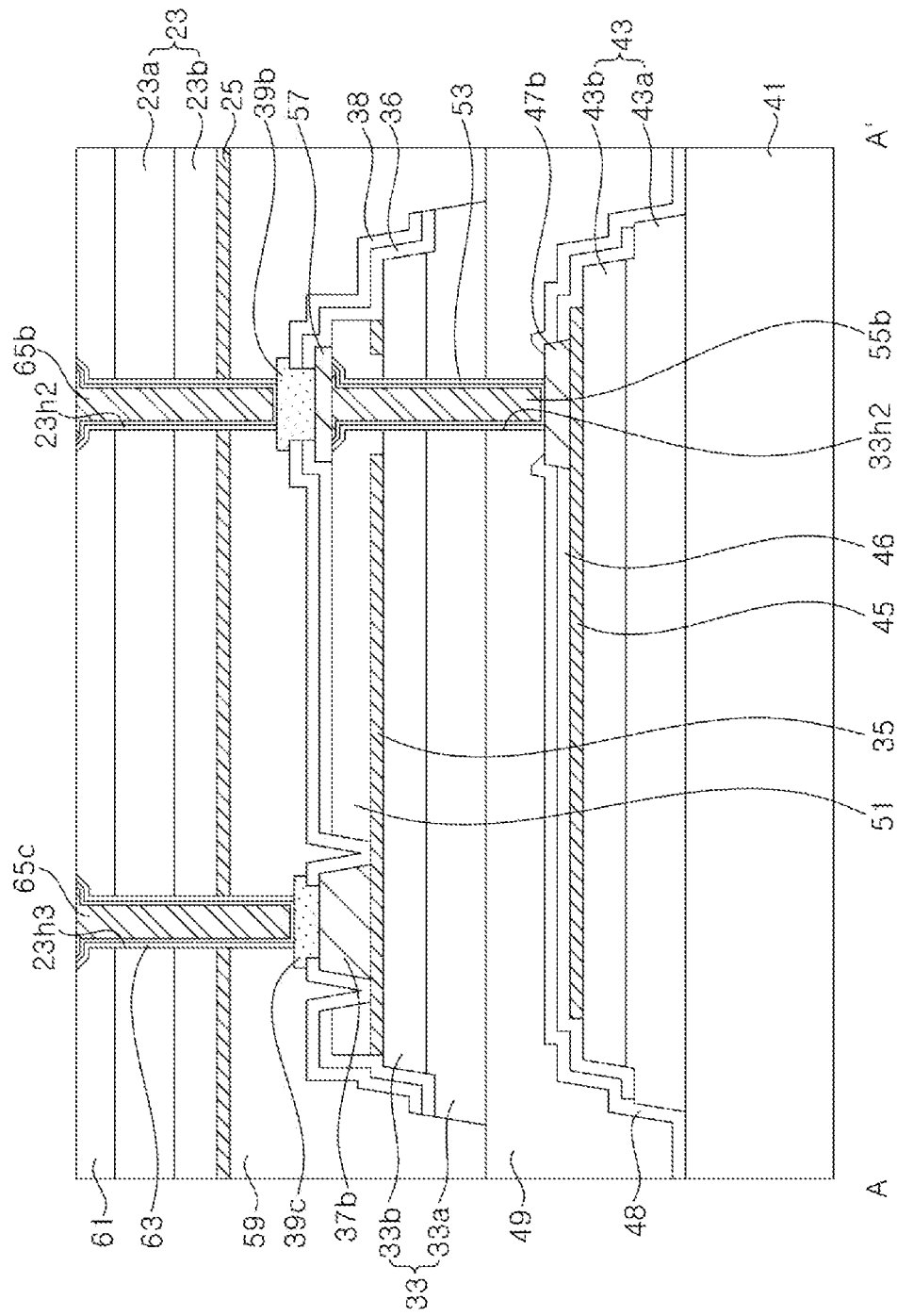
Figure 17C:
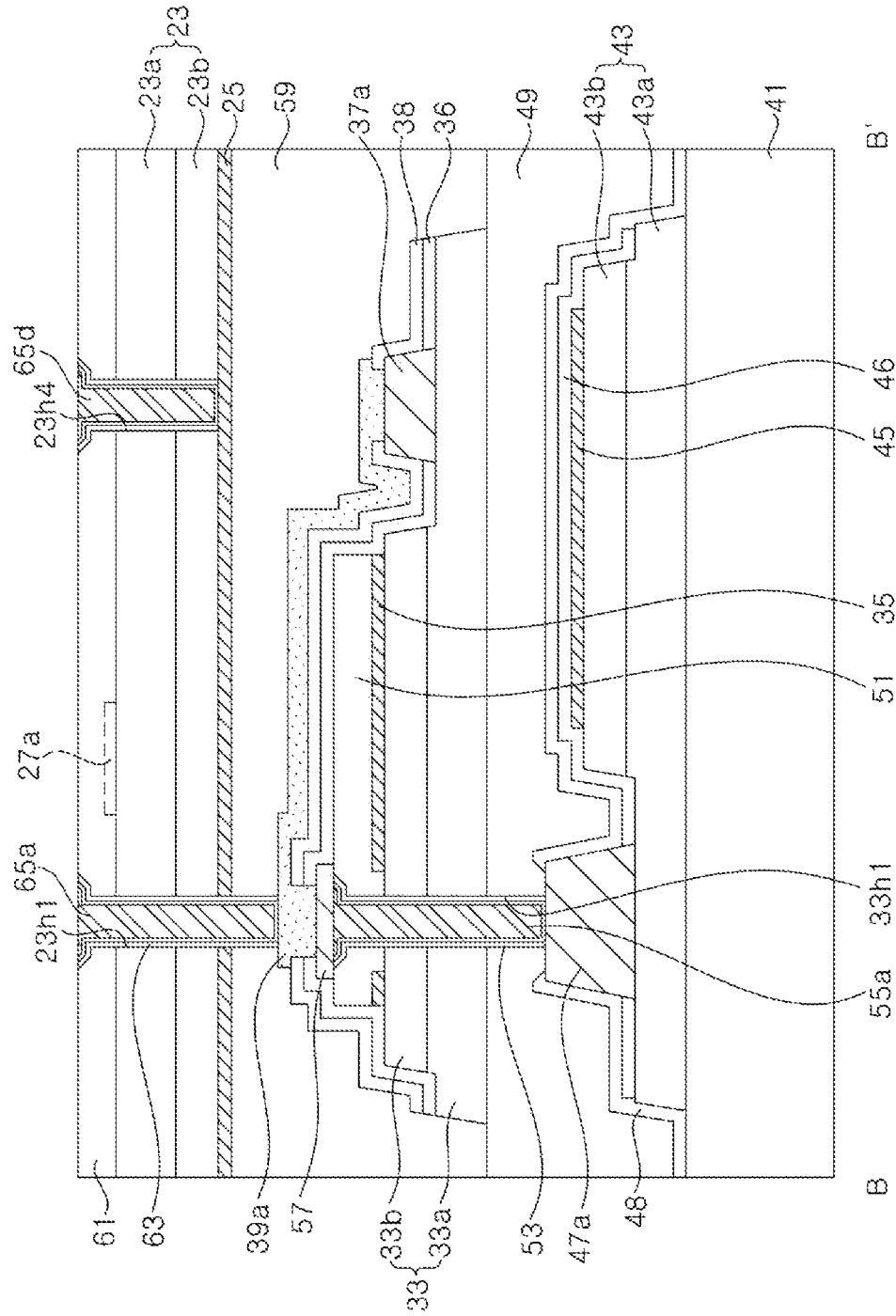

Referring to FIGS. 17A, 17B, and 17C, a second sidewall insulation layer 63 and upper buried vias 65a, 65b, 65c, and 65d are formed. Since a process of forming the second sidewall insulation layer 63 and the upper buried vias 65a, 65b, 65c, and 65d is substantially similar to that forming the first sidewall insulation layer 53 and the lower buried vias 55a and 55b, repeated descriptions thereof will be omitted.

Figure 18A:
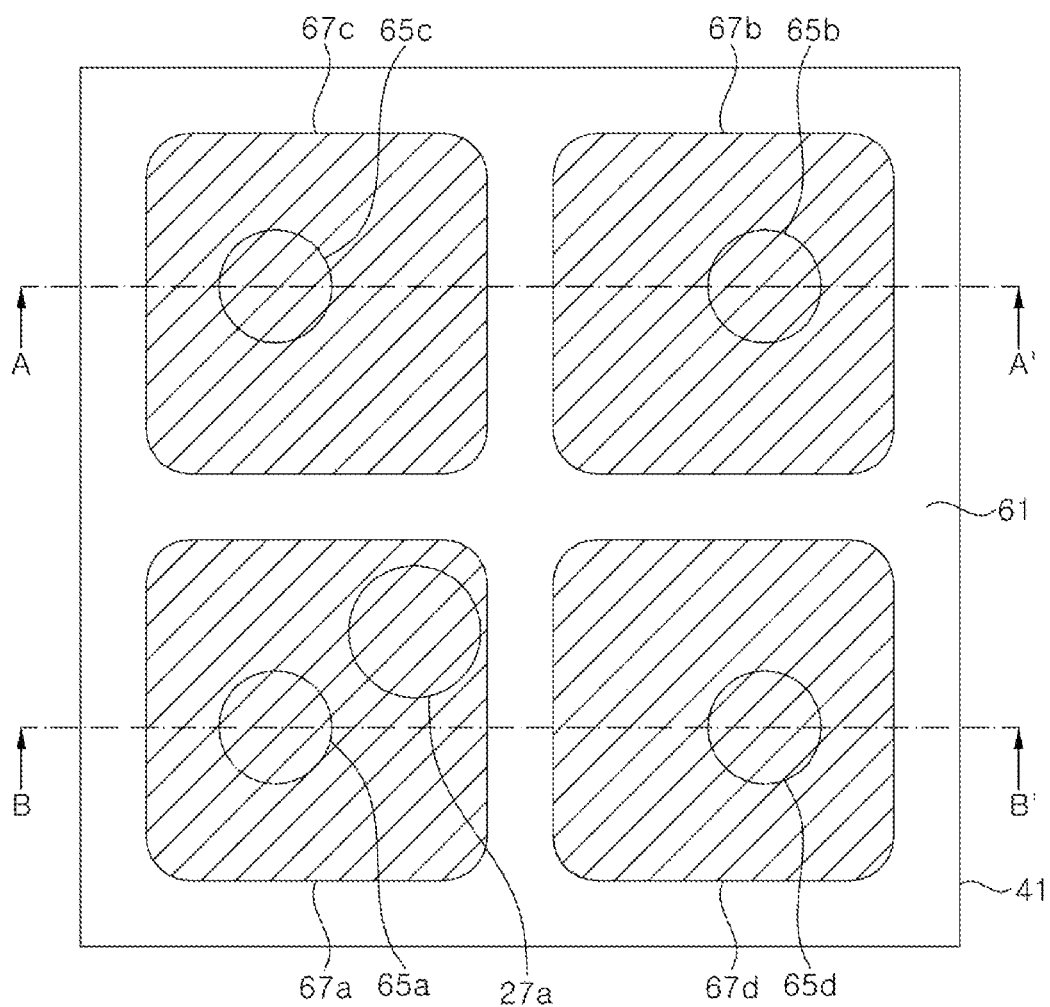
Figure 18B:
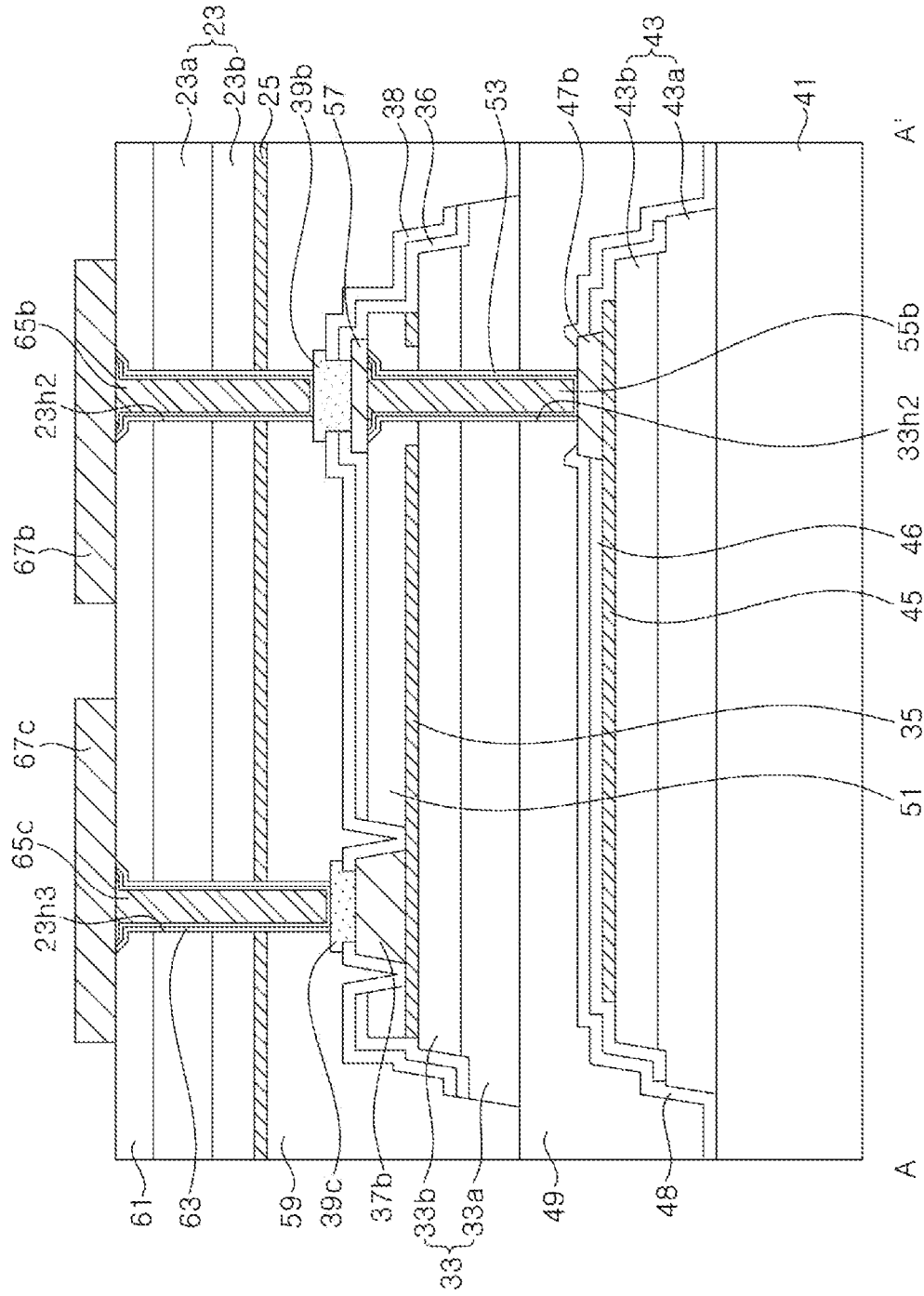
Figure 18C:
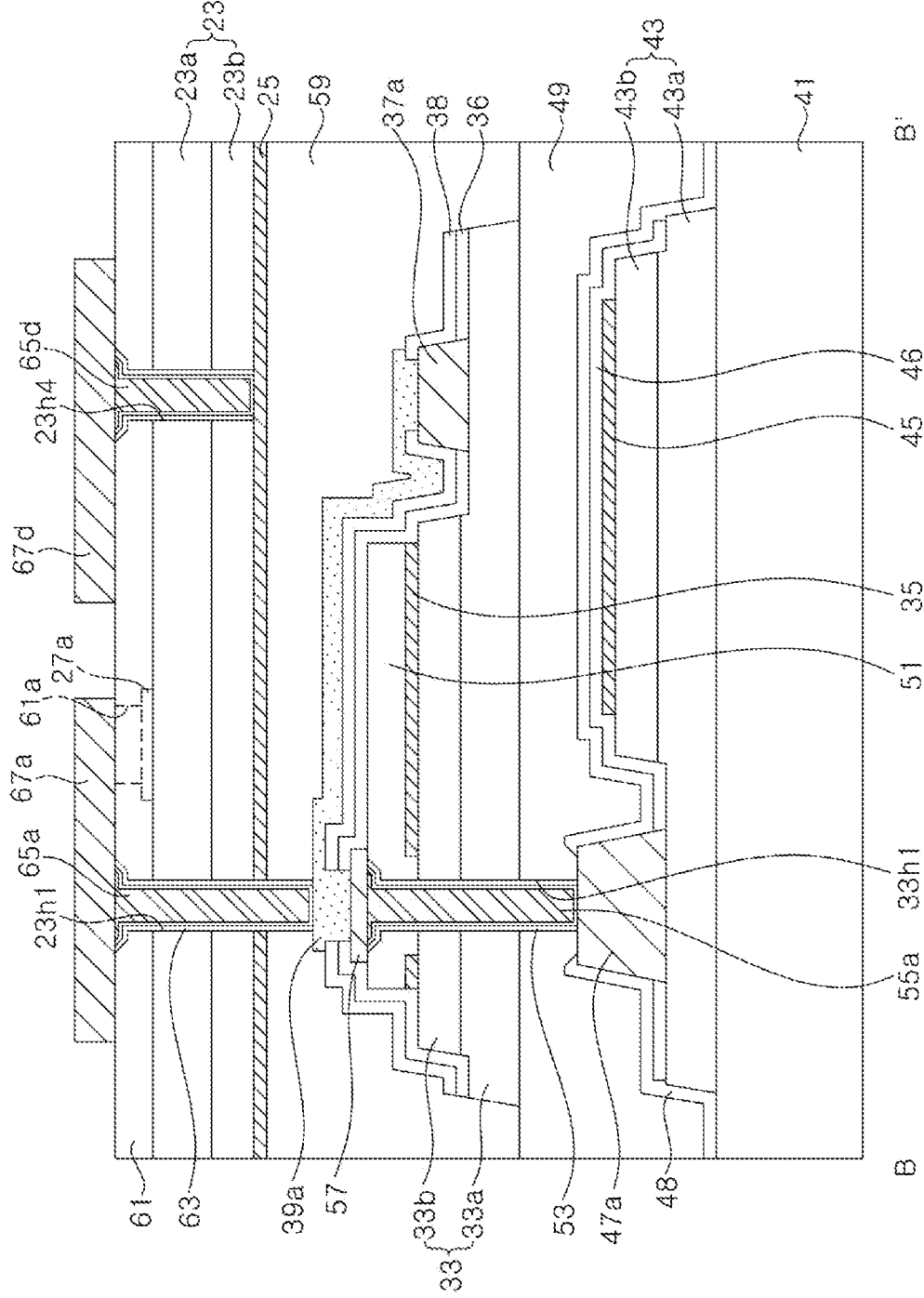

Referring to FIGS. 18A, 18B, and 18C, an opening 61a exposing the first n-electrode pad 27a is formed by patterning the second planarization layer 61. The second planarization layer 61 may be patterned using photolithography and etching techniques.

Subsequently, upper connectors 67a, 67b, 67c, and 67d are formed. The upper connectors 67a, 67b, 67c, and 67d may include a reflective metal layer, and thus, light generated in the first LED stack 23 may be reflected to improve light extraction efficiency. For example, the upper connectors 67a, 67b, 67c, and 67d may include Au or an Au alloy.

The upper connector 67a may electrically connect the upper buried via 65a to the first n-electrode pad 27a. The upper connectors 67b, 67c, and 67d may be connected to the upper buried vias 65b, 65c, and 65d, respectively.

Figure 19A:
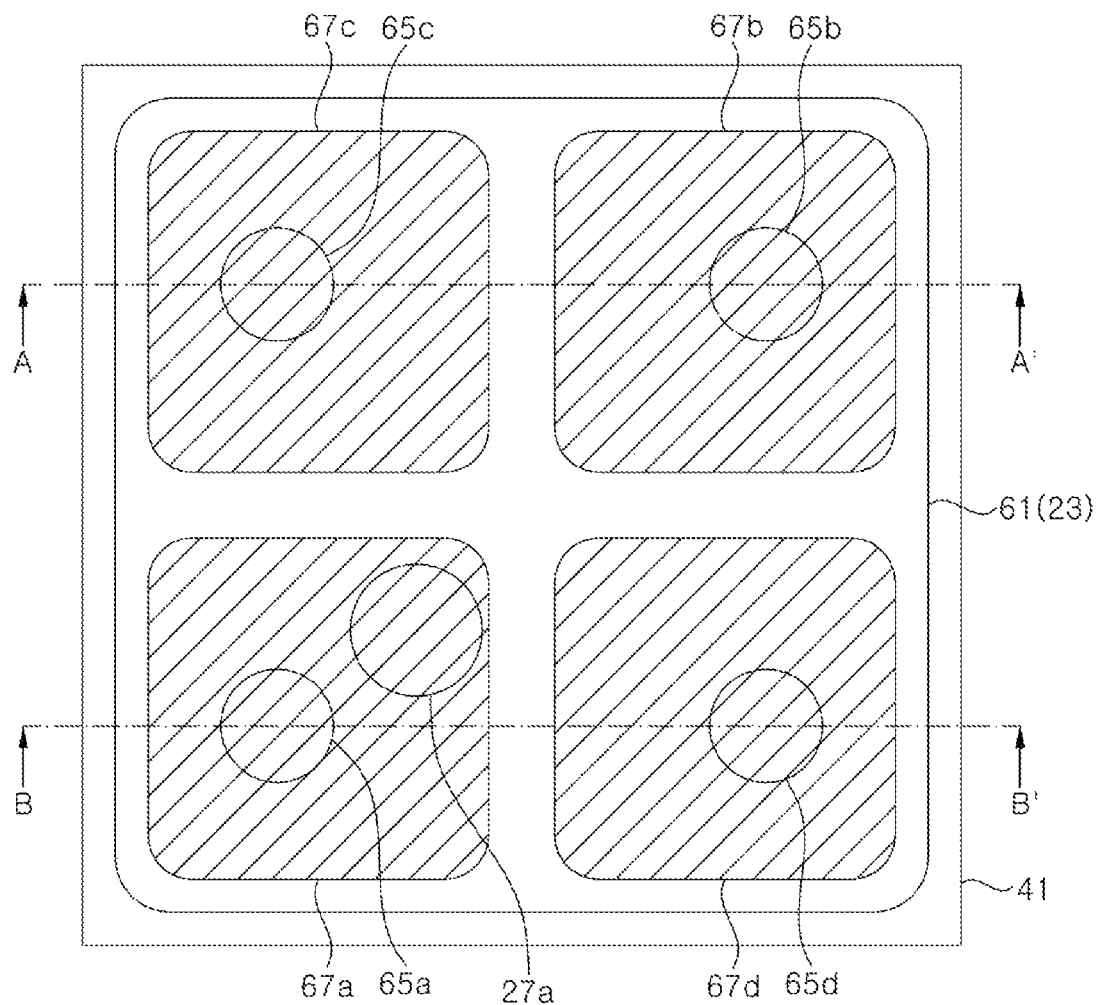
Figure 19B:
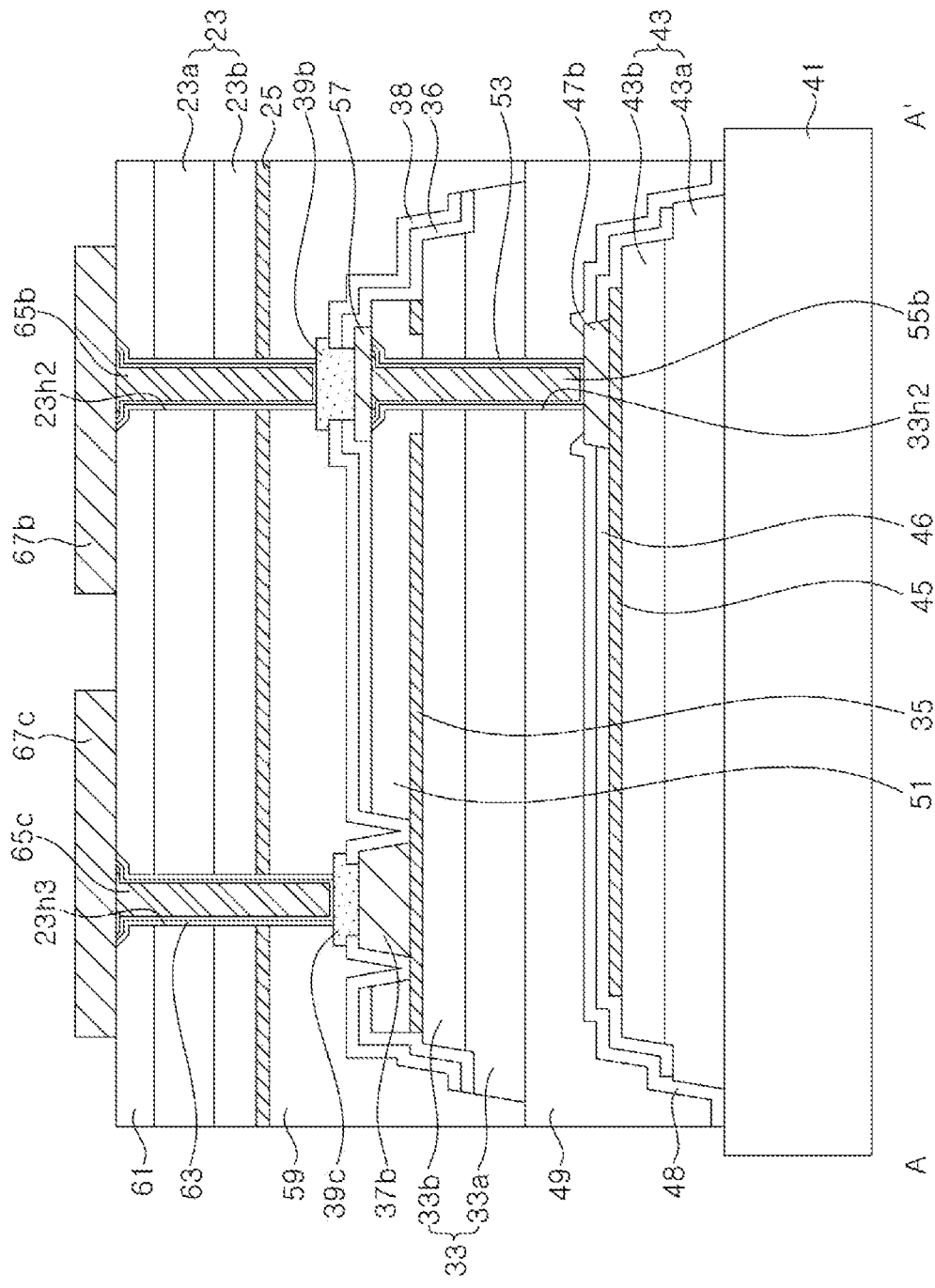
Figure 19C:
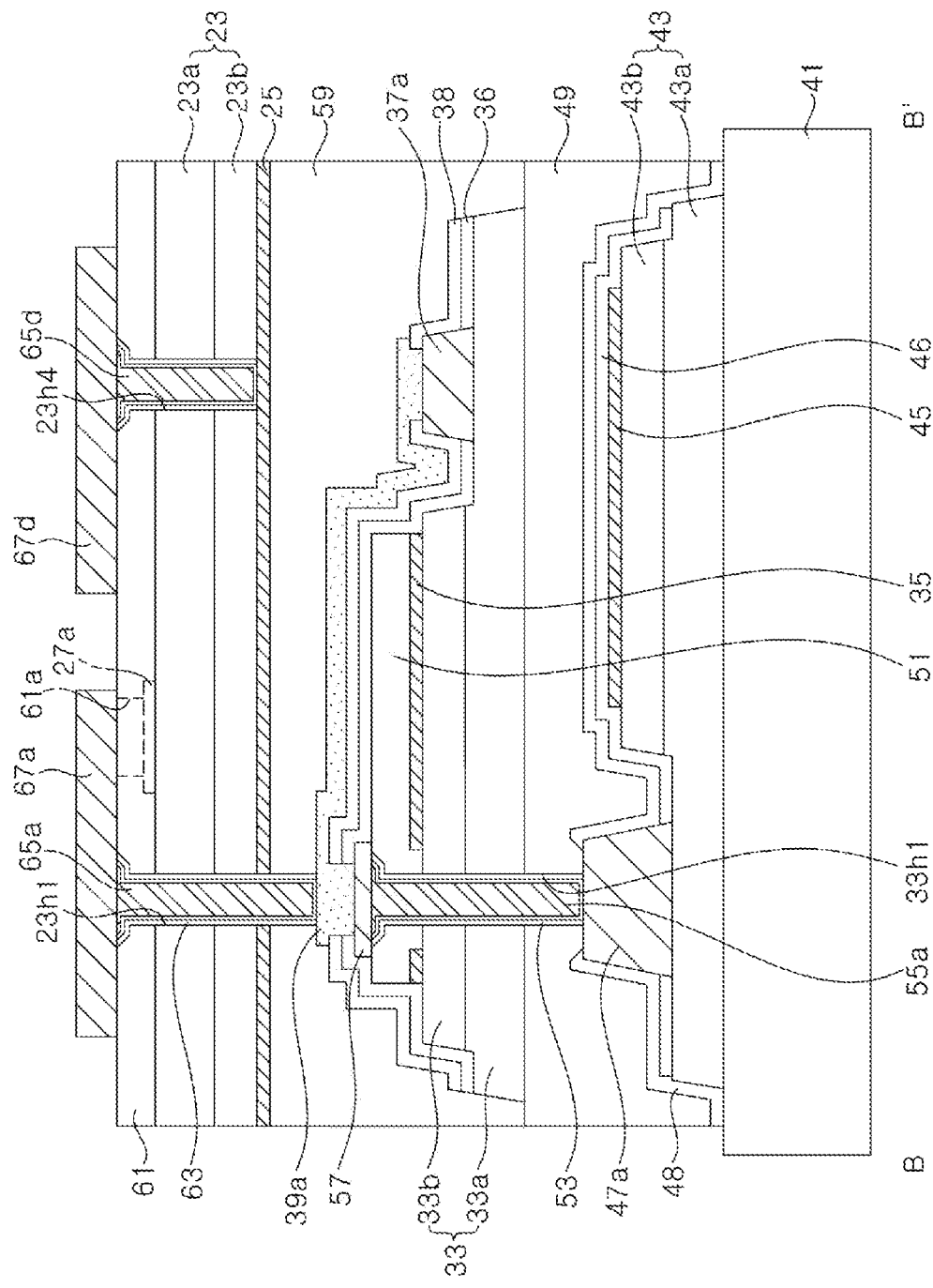

Referring to FIGS. 19A, 19B, and 19C, the second planarization layer 61, the first LED stack 23, and the first transparent electrode 25 may be etched along the isolation region. For example, the second planarization layer 61 may be patterned in advance, and then, the first LED stack 23 and the first transparent electrode 25 may be patterned to divide the light emitting device regions. The second planarization layer 61 may be patterned in advance along the isolation region when forming the opening 61a. Subsequently, the second bonding layer 59 and the first bonding layer 49 may be patterned to expose the upper surface of the substrate 41. Meanwhile, as shown in the drawing, side surfaces of the second LED stack 33 and the third LED stack 43 may be covered and protected by the second bonding layer 59 and the first bonding layer 49, respectively. However, in another exemplary embodiment, the side surfaces of the second and third LED stacks 33 and 43 may be exposed to the isolation region.

The surface of the first LED stack 23 exposed in the isolation region may be chemically treated. For example, the surface of the first LED stack 23 may be chemically treated using a diluted HCl solution or a diluted HF solution. Chemical treatment may be performed before or after patterning the second bonding layer 59. The chemical treatment for the third LED stack 43 may include a surface etching process and a surface passivating process using a solution as described above. As such, a sulfur passivated surface may be formed on the first LED stack 23.

Figure 20A:
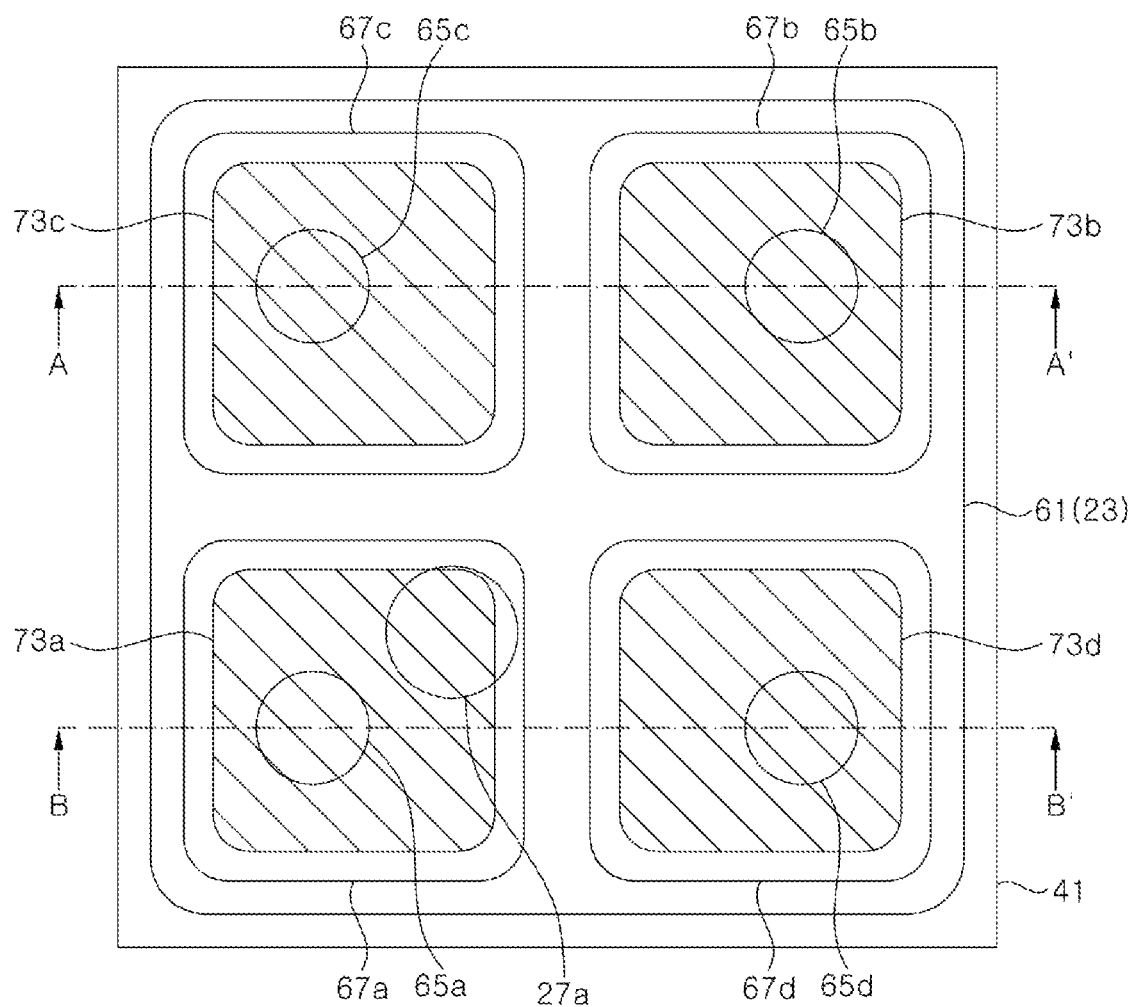
Figure 20B:
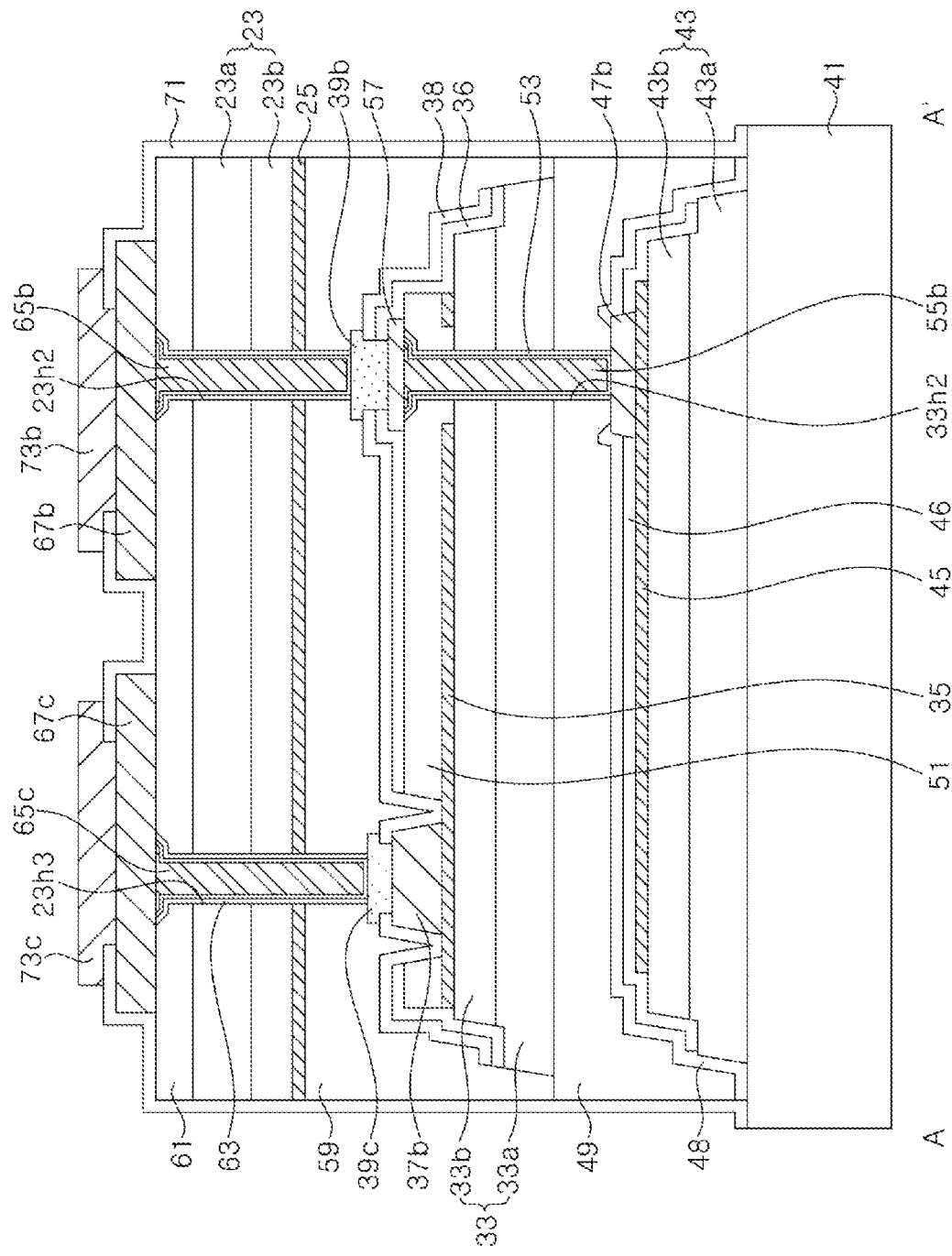
Figure 20C:
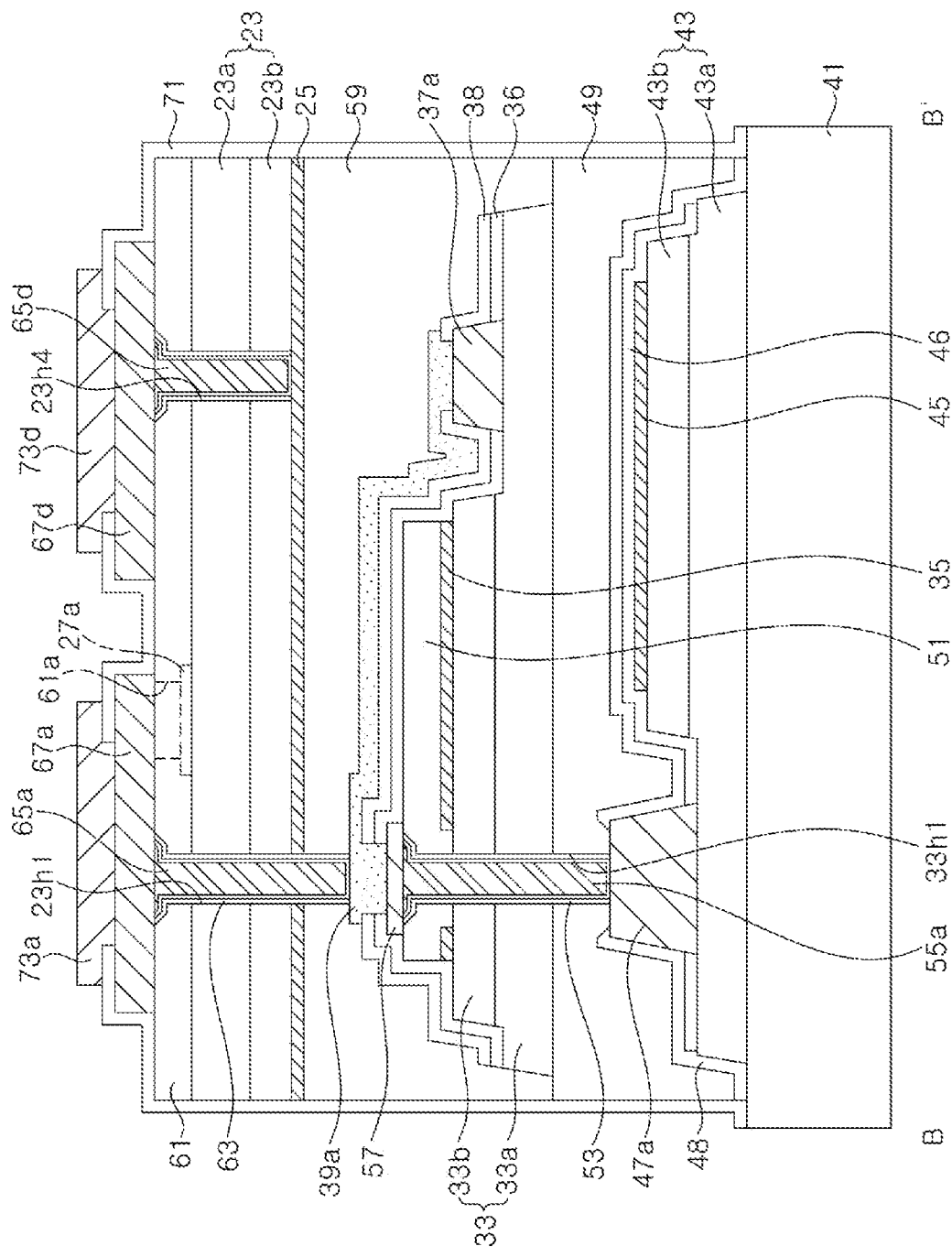

Referring to FIGS. 20A, 20B, and 20C, an upper insulation layer 71 covering the first LED stack 23 is formed. The upper insulation layer 71 may cover sidewalls of the isolation region, and may cover the second planarization layer 61 and the upper connectors 67a, 67b, 67c, and 67d. Furthermore, the upper insulation layer 71 may be patterned to have openings exposing the upper connectors 67a, 67b, 67c, and 67d. The upper insulation layer 71 covers the surface of the first LED stack 23 to reduce non-radiative recombination. The upper insulation layer 71 may be formed of, for example, a single layer of $Al_2O_3$, $SiN_x$, or $SiO_2$, or a multilayer including at least one of $Al_2O_3$, $SiN_x$, and $SiO_2$. The upper insulation layer 71 may be formed of, for example, a double layer of an $Al_2O_3$ layer and a $SiO_2$ layer, or a double layer of an $HfO_2$ layer and a $SiO_2$ layer.

Subsequently, bump pads 73a, 73b, 73c, and 73d covering the openings may be formed. The first bump pad 73a is disposed on the first upper connector 67a, the second bump pad 73b is disposed on the second upper connector 67b, and the third bump pad 73c is disposed on the third upper connector 67c. The fourth bump pad 73d is disposed on the fourth upper connector 67d.

A plurality of light emitting devices 100 separated from one another by the isolation region may be formed on the substrate 41, and the light emitting device 100 may be coupled to a circuit board 101. The substrate 41 may be separated from the light emitting device 100 before or after being bonded to the circuit board 101. A schematic cross-sectional view of the light emitting device 100 bonded to the circuit board 101 is exemplarily shown in FIG. 22, which will be described in detail later.

The light emitting device 100 according to exemplary embodiments achieve electrical connection using buried vias 55a, 55b, 65a, 65b, 65c, and 65d. Hereinafter, a process of forming the buried vias will be described in detail.

FIGS. 21A, 21B, 21C, and 21D are schematic cross-sectional views illustrating a process of forming a buried via according to exemplary embodiments.

Figure 21A:
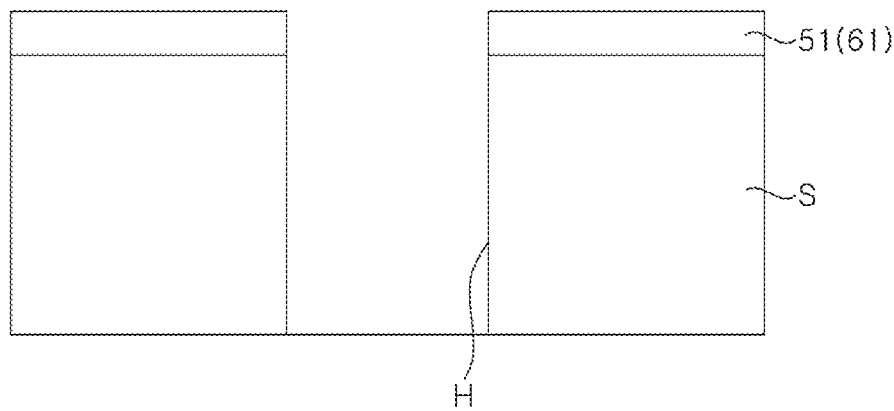
FIGS. 21A, 21B, 21C, and 21D are schematic cross-sectional views illustrating a process of forming a buried via according to exemplary embodiments.

First, referring to FIG. 21A, a planarization layer 51 or 61 is formed on an underlying layer S. The underlying layer S may include a first LED stack 23 or a second LED stack 33. A hard mask defining an etching region is formed by patterning the planarization layer 51 or 61, and a through hole H may be formed using the hard mask as an etching mask. The through hole H may expose an element for electrical connection, for example, the third n-electrode pad 47a, the lower p-electrode pad 47b, or the lower connectors 39a, 39b, and 39c.

Figure 21B:
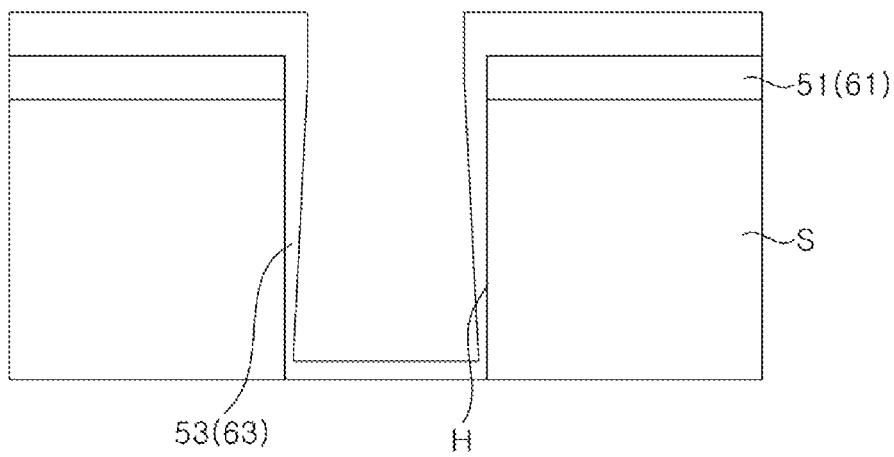

Referring to FIG. 21B, subsequently, a sidewall insulation layer 53 or 63 is formed. The sidewall insulation layer 53 or 63 may be formed on an upper surface of the planarization layer 51 or 61, and may further be formed on a sidewall and a bottom of the through hole H. The sidewall insulation layer 53 or 63 may be formed thicker at an inlet than at the bottom of the through hole H due to a characteristic of layer coverage.

Figure 21C:
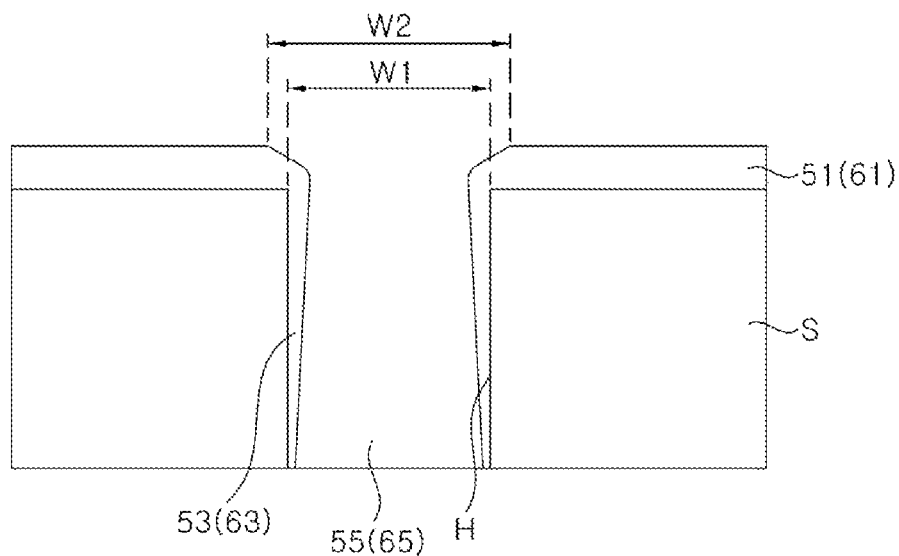

Referring to FIG. 21C, the sidewall insulation layer 53 or 63 is blanket etched using a dry etching technique. The sidewall insulation layer 53 or 63 disposed on the bottom of the through hole H is removed by blanket etching, and the sidewall insulation layer 53 or 63 disposed on the upper surface of the planarization layer 51 or 61 is also removed. Further, a portion of the planarization layer 51 or 61 near the inlet of the through hole H may also be removed. As such, a width W2 of the inlet may be greater than a width W1 of the through hole H. In this manner, since the width W2 of the inlet is increased, a process of forming a buried via using a plating technology in a subsequent process may be facilitated.

Figure 21D:
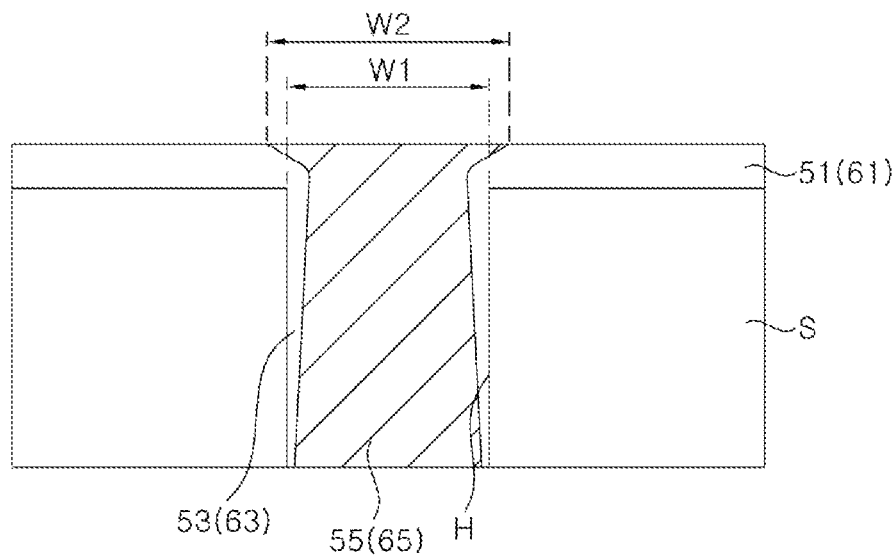

Referring to FIG. 21D, a seed layer may be formed in the planarization layer 51 or 61 and the through hole H, and a plating layer filling the through hole H may be formed using a plating technique. Subsequently, by removing the plating layer and the seed layer on the planarization layer 51 or 61 using a chemical etching technique, a buried via 55 or 65 as shown in FIG. 21D may be formed.

Figure 22:
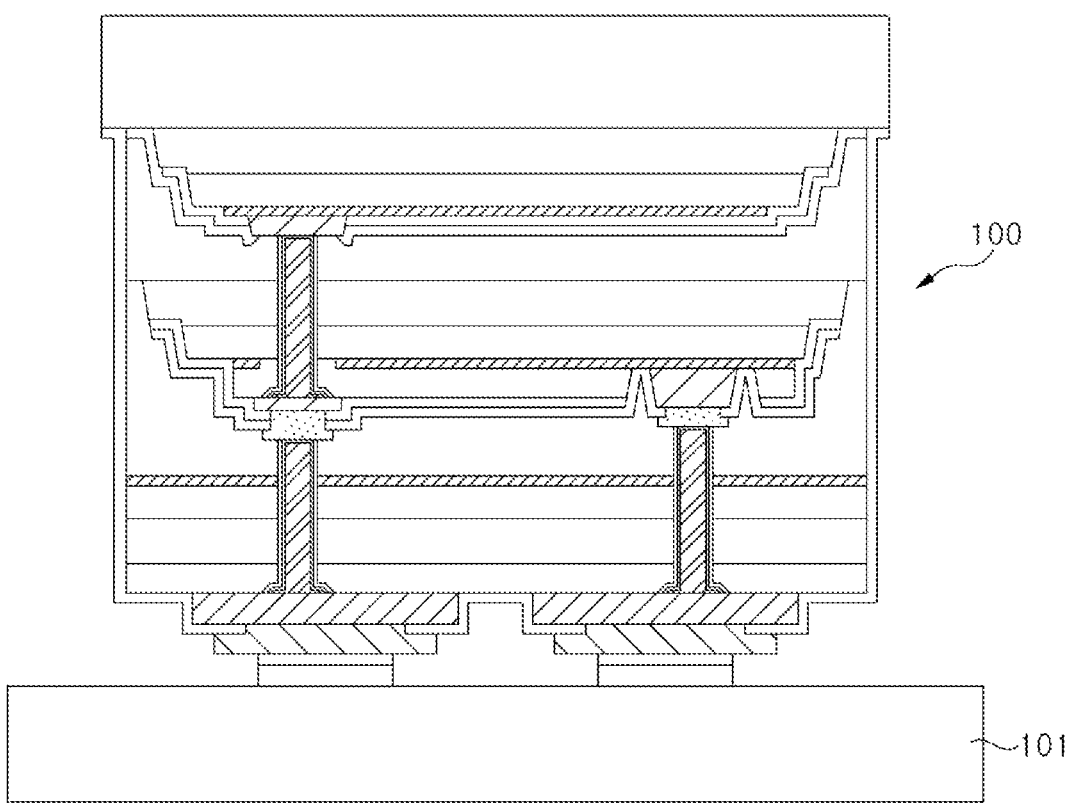
FIG. 22 is a schematic cross-sectional view illustrating a light emitting device mounted on a circuit board.

FIG. 22 is a schematic cross-sectional view illustrating a light emitting device mounted on a circuit board according to an exemplary embodiment.

FIG. 22 exemplarily illustrates a single light emitting device 100 disposed on the circuit board 101, however, a plurality of light emitting devices 100 may be mounted on the circuit board 101. Each of the light emitting devices 100 may form one pixel capable of emitting any one of blue light, green light, and red light, and a plurality of pixels is arranged on the circuit board 101 to provide a display panel.

Figure 23A:
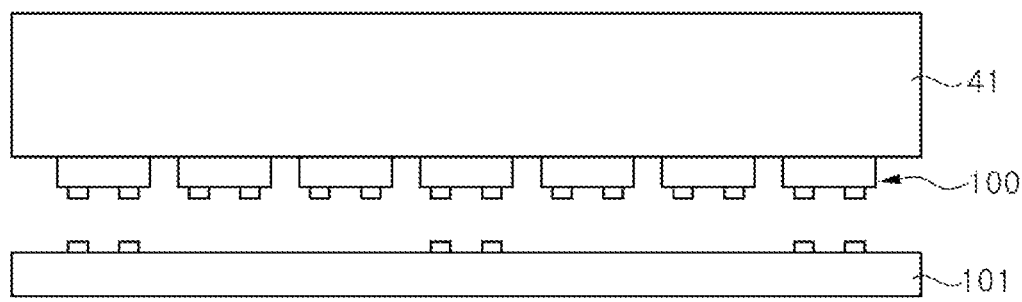
FIGS. 23A, 23B, and 23C are schematic cross-sectional views illustrating a method of transferring a light emitting device to a circuit board according to an exemplary embodiment.
Figure 23B:
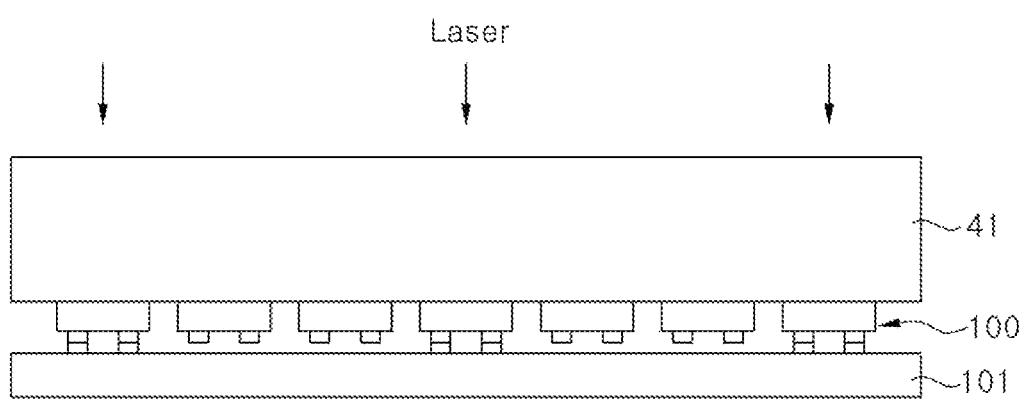
Figure 23C:
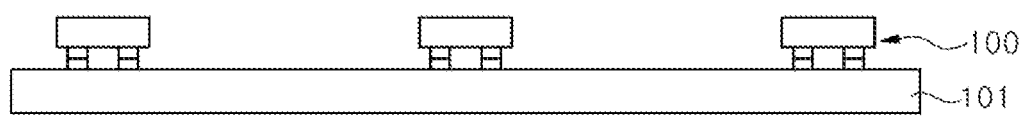

The plurality of light emitting devices 100 may be formed on the substrate 41, and the light emitting devices 100 may be transferred onto the circuit board 101 in a group rather than individually. FIGS. 23A, 23B, and 23C are schematic cross-sectional views illustrating a method of transferring the light emitting device to the circuit board according to an exemplary embodiment. Hereinafter, a method of transferring the light emitting devices 100 formed on the substrate 41 to the circuit board 101 in a group will be described.

Referring to FIG. 23A, as described in FIGS. 20A, 20B, and 20C, when the manufacturing process of the light emitting device 100 on the substrate 41 is completed, the plurality of light emitting devices 100 is isolated from each other, and arranged on the substrate 41 by an isolation trench.

The circuit board 101 may have pads on an upper surface thereof. The pads are arranged on the circuit board 101 to correspond to locations where the pixels for a display are to be arranged. In general, an interval between the light emitting devices 100 arranged on the substrate 41 may be denser than that of the pixels on the circuit board 101.

Referring to FIG. 23B, bump pads of the light emitting devices 100 are selectively bonded to the pads on the circuit board 101. The bump pads and the pads may be bonded using solder bonding or In bonding, for example. In this case, the light emitting devices 100 located between pixel regions may be spaced apart from the circuit board 101, since these light emitting devices 100 do not have pads of the circuit board 101 to be bonded to.

Subsequently, the substrate 41 is irradiated with a laser. The laser is selectively irradiated onto the light emitting devices 100 bonded to the pads. To this end, a mask having openings for selectively exposing the light emitting devices 100 may be formed on the substrate 41.

Thereafter, the light emitting devices 100 are transferred to the circuit board 101 by separating the light emitting devices 100 irradiated with the laser from the substrate 41. Accordingly, as shown in FIG. 23C, the display panel in which the light emitting devices 100 are arranged on the circuit board 101 is provided. The display panel may be mounted on various display apparatuses as described with reference to FIG. 1.

Figure 24:
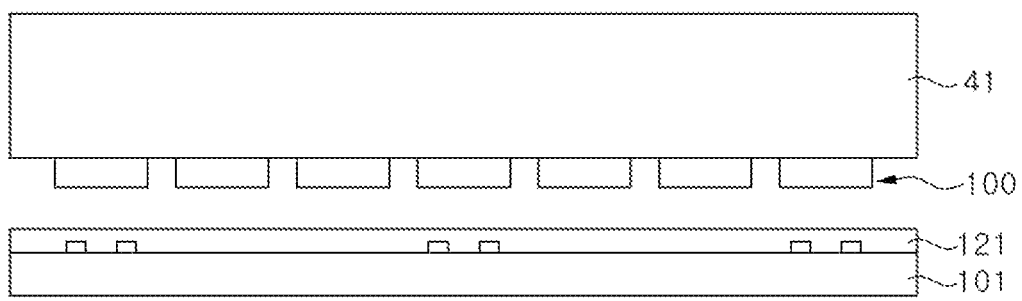
FIG. 24 is a schematic cross-sectional view illustrating a method of transferring a light emitting device to a circuit board according to another exemplary embodiment.

FIG. 24 is a schematic cross-sectional view illustrating a method of transferring a light emitting device according to another exemplary embodiment.

Referring to FIG. 24, the light emitting device according to the illustrated exemplary embodiment are bonded to pads using an anisotropic conductive adhesive film or an anisotropic conductive adhesive paste. In particular, an anisotropic conductive adhesive film or adhesive paste 121 may be provided on the pads, and the light emitting devices 100 may be adhered to the pads through the anisotropic conductive adhesive film or adhesive paste 121. The light emitting devices 100 are electrically connected to the pads by the anisotropic conductive adhesive film or a conductive material in the adhesive paste 121.

In the illustrated exemplary embodiment, bump pads 73a, 73b, 73c, and 73d may be omitted, and upper connectors 67a, 67b, 67c, and 67d may be electrically connected to the pads through a conductive material.

According to exemplary embodiments, the first, second, and third LED stacks are stacked one above another, and thus, the light emitting device may have an increased luminous area of each sub-pixel without increasing a pixel area. Further, since the surface protection layer covers the side surfaces of the first, second, or third LED stacks, non-radiative recombination generated on a surface thereof may be reduced, thereby improving light extraction efficiency and reliability.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device for a display, comprising:
a substrate;
a first LED stack disposed on the substrate;
a second LED stack disposed under the first LED stack;
a third LED stack disposed under the second LED stack, each of the first, second, and third LED stacks including a first conductivity type semiconductor layer and a second conductivity type semiconductor layer;
a first protection layer at least partially covering peripheral side surfaces of the third LED stack;
an insulation layer covering the first, second, and third LED stacks and the first protection layer;
a first bonding layer interposed between the second LED stack and the third LED stack, and laterally between the first protection layer and the insulation layer such that it covers peripheral side surfaces of the first protection layer;
a second bonding layer interposed between the first LED stack and the second LED stack;
lower buried vias overlapping the first bonding layer, and electrically connected to the first conductivity type semiconductor layer and the second conductivity type semiconductor layer of the third LED stack, respectively; and wherein the first bonding layer comprises at least one material different from the first protection layer, wherein the insulation layer covers a surface of the substrate exposed from the third LED stack, and wherein the substrate is disposed under the third LED stack.

2. The light emitting device for a display of claim 1, wherein each of the first LED stack, the second LED stack, and the third LED stack has a sulfur passivated side surface.

3. The light emitting device for a display of claim 1, further comprising:
a second protection layer at least partially covering the side surface of the second LED stack.

4. The light emitting device of claim 3, wherein the first and second, protection layers comprise at least one of $Al_2O_3$, $SiN_x$, $HfO_2$, and $SiO_2$.

5. The light emitting device for a display of claim 3, further comprising:
upper buried vias passing through the first LED stack;
a first planarization layer interposed between the second bonding layer and the second LED stack; and
a second planarization layer disposed on the first LED stack,
wherein:
the lower buried vias pass through the first planarization layer; and
the upper buried vias pass through the second planarization layer.

6. The light emitting device for a display of claim 5, wherein:
the second LED stack includes a first mesa disposed on the first conductivity type semiconductor layer thereof;
the third LED stack includes a second mesa disposed on the first conductivity type semiconductor layer thereof;
the first mesa and the second mesa are disposed in a region surrounded by an edge of the corresponding first conductivity type semiconductor layer, respectively;
the first protection layer covers a side surface of the second mesa, and
the second protection layer covers a side surface of the first mesa.

7. The light emitting device for a display of claim 6, wherein:
each of the second LED stack and the third LED stack includes an active layer;
each of first mesa and the second mesa includes at least a portion of the corresponding first conductivity type semiconductor layer, the active layer, and the second conductivity type semiconductor layer; and
the first and second protection layers entirely cover side surfaces of the corresponding mesa, respectively.

8. The light emitting device for a display of claim 6, further comprising:
a first transparent electrode disposed on the first mesa; and
a second transparent electrode disposed on the second mesa,
wherein:
the first protection layer covers the second transparent electrode;

the first planarization layer covers the first transparent electrode; and
the second protection layer covers the first planarization layer.

9. The light emitting device for a display of claim 8, further comprising:
a lower insulation layer covering the first protection layer; and
an intermediate insulation layer covering the second protection layer.

10. The light emitting device for a display of claim 8, wherein the first transparent electrode has openings exposing the second conductivity type semiconductor layer of the second LED stack, and the lower buried vias are formed within a circumference of the openings of the first transparent electrode in a plan view.

11. The light emitting device for a display of claim 1, wherein the first, second, and third LED stacks are configured to emit red light, blue light, and green light, respectively.

12. The light emitting device for a display of claim 1, further comprising:
upper buried vias passing through the first LED stack; and
lower connectors covering the lower buried vias,
wherein portions of the upper buried vias are connected to the lower connectors.

13. The light emitting device for a display of claim 12, wherein:
one of the lower connectors is spaced apart from the lower buried vias, and is electrically connected to the second conductivity type semiconductor layer of the second LED stack; and
one of the upper buried vias is electrically connected to the one of the lower connectors.

14. The light emitting device for a display of claim 1, further comprising upper buried vias passing through the first LED stack;
wherein the lower buried vias and the upper buried vias are surrounded by sidewall insulation layers inside corresponding through holes, respectively.

15. The light emitting device for a display of claim 14, wherein a width of the sidewall insulation layers decreases as being disposed closer to a bottom of the respective through holes.

16. The light emitting device for a display of claim 1, further comprising:
upper buried vias passing through the first LED stack; and
a plurality of upper connectors disposed on the first LED stack,
wherein the upper connectors cover the upper buried vias to be electrically connected to the upper buried vias, respectively.

17. The light emitting device for a display of claim 16, further comprising bump pads disposed on the upper connectors, respectively.

18. The light emitting device for a display of claim 17, wherein the bump pads include a first bump pad commonly electrically connected to the first, second, and third LED stacks, and second, third, and fourth bump pads electrically connected to the second conductivity type semiconductor layers of the first, second, and third LED stacks, respectively.

* * * * *